(12) United States Patent
Lee et al.

(10) Patent No.: US 7,579,855 B2
(45) Date of Patent: Aug. 25, 2009

(54) METHOD FOR MANUFACTURING ELECTRICAL CONTACT ELEMENT FOR TESTING ELECTRONIC DEVICE AND ELECTRICAL CONTACT ELEMENT MANUFACTURED THEREBY

(75) Inventors: Oug-Ki Lee, Seoul (KR); Jung Hoon Lee, Kyeonggi-do (KR); Seong Hoon Jeong, Seoul (KR)

(73) Assignee: PHICOM Corporation, Gasan-dong, Kumcheon-ku, Seoul (KR)

( * ) Notice: Subject to any disclaimer, the term of this patent is extended or adjusted under 35 U.S.C. 154(b) by 110 days.

(21) Appl. No.: 11/352,658

(22) Filed: Feb. 13, 2006

(65) Prior Publication Data

US 2006/0192581 A1 Aug. 31, 2006

Related U.S. Application Data

(63) Continuation of application No. 10/350,737, filed on Jan. 23, 2003, now abandoned.

(30) Foreign Application Priority Data

Feb. 5, 2002 (KR) ................... 2002-6367
Nov. 6, 2002 (KR) ................... 2002-68402

(51) Int. Cl.
*G01R 31/02* (2006.01)
(52) U.S. Cl. .................. 324/762; 324/754; 324/761
(58) Field of Classification Search ........ None
See application file for complete search history.

(56) References Cited

U.S. PATENT DOCUMENTS

| 4,916,002 A | 4/1990 | Carver |
| 5,116,462 A | 5/1992 | Bartha et al. |
| 5,177,438 A * | 1/1993 | Littlebury et al. ........... 324/754 |
| 5,513,430 A | 5/1996 | Yanof et al. |
| 6,184,053 B1 | 2/2001 | Eldridge et al. |
| 6,307,392 B1 | 10/2001 | Soejima et al. |
| 6,482,013 B2 | 11/2002 | Eldridge et al. |
| 6,771,084 B2 * | 8/2004 | Di Stefano ................. 324/754 |
| 6,811,406 B2 | 11/2004 | Grube |
| 6,970,005 B2 * | 11/2005 | Rincon et al. ............... 324/754 |
| 2002/0008530 A1 | 1/2002 | Kim et al. |

FOREIGN PATENT DOCUMENTS

| JP | 07-333232 A | 12/1995 |
| JP | 08-050146 A | 2/1996 |
| JP | 2002-071719 | 3/2002 |
| KR | 0151134 | 6/1998 |
| KR | 2001-0077628 | 8/2001 |
| WO | WO 97/43653 | 11/1997 |

* cited by examiner

*Primary Examiner*—Minh N Tang
(74) *Attorney, Agent, or Firm*—Lexyoume IP Group, LLC.

(57) ABSTRACT

Disclosed is an electrical contact element used to test an electronic device. The electrical contact element has a beam portion and a tip portion attached to an end of the beam portion. In representative embodiments, a part of the beam portion is bent, e.g., such that the beam portion is zigzagged one or more times. A projection may be formed around a proximal end of the tip portion.

22 Claims, 52 Drawing Sheets

300   112 110 108 106

METHOD FOR MANUFACTURING ELECTRICAL CONTACT ELEMENT FOR TESTING ELECTRONIC DEVICE AND ELECTRICAL CONTACT ELEMENT MANUFACTURED THEREBY

This application is a continuation of application Ser. No. 10/350,737 filed Jan. 23, 2003, now abandoned, which claims foreign priority to Korean Application 2002-6367 filed Feb. 5, 2002, and Korean Application 2002-68402 filed Nov. 6, 2002. Application Ser. No. 10/350,737 is incorporated by reference herein as though set forth herein in full.

BACKGROUND OF THE INVENTION

1. Field of the Invention

The present invention pertains to a method for manufacturing an electrical contact element used to test an electronic device, and an electrical contact element manufactured thereby, and more particularly, the present invention relates to a method for manufacturing an electrical contact element capable of electrically testing an electronic device by being brought into contact with the electronic device to see whether the electronic device is in a normal state or not, and an electrical contact element manufactured thereby.

Further, the present invention relates to a method for manufacturing an electrical contact element capable of electrically testing an electronic device by being increased in its physical force due to the presence of an armrest, to see whether the electronic device is in a normal state or not, and an electrical contact element manufactured thereby.

2. Description of the Related Art

Generally, a semiconductor chip is realized on a semiconductor substrate by implementing a series of semiconductor manufacturing processes including an oxidization process, a diffusion process, an ion-implantation process, an etching process, a metalization process, and so on. Chips fabricated on semiconductor substrates are sorted into normal ones and defective ones through an electrical die sorting (EDS) test. Then, only the normal chips are placed under slicing and packaging processes.

At this time, in the EDS test, an electrical contact element such as a probe card is brought into contact with a pad of a semiconductor chip to apply thereto an electric signal, and then, by detecting an electric signal responsive to the applied electric signal, it is possible to see whether the chip is in a normal state or not.

Also, in the case of a flat panel display device such as a liquid crystal display (LCD) which is manufactured by implementing a series of flat panel display device manufacturing processes, an electrical contact element is brought into contact with a preselected portion of the flat panel display device to apply thereto an electric signal, and then, by detecting an electric signal responsive to the applied electric signal, it is confirmed whether the LCD panel is in a normal state or not.

These days, researches and developments have been made in an effort to ensure that the conventional electrical contact element used for testing normality of a semiconductor chip or a flat panel display such as an LCD and the like conforms to the recent trend toward a fine pitch in a highly integrated semiconductor device such as an 1G DRAM, has a rapid responding velocity to be used in a high frequency band, possesses a sufficient strength not to become worn by repeated contact, maintains a predetermined contact resistance to have an excellent electric conductivity, and has a sufficient over-drive (OD) characteristic.

Specifically, researches and developments have been made in an effort to ensure that production of particles on the electrical contact element is minimized while the electrical contact element is repeatedly brought into contact with the highly integrated semiconductor device, the electrical contact element has an excellent electric conductivity, and tip portions of a plurality of electrical contact elements can be simultaneously brought into contact with a semiconductor chip pad to sufficiently satisfy an over-drive scheme.

As shown in FIG. 1, in the conventional electrical contact element, a terminal of an electronic component 10 such as a printed circuit board (PCB) having formed thereon a predetermined circuit pattern, and the like, is connected with a post portion 12. The post portion 12 is connected with a beam portion 14, and, in turn, the beam portion 14 is connected with a tip portion 16.

At this time, the post portion 12, beam portion 14 and tip portion 16 are individually provided and connected with one with another by adhesive means. The beam portion 14 has a bar-shaped configuration of a constant width.

In particular, the tip portion 16 has a pyramid-shaped configuration which is four-cornered and has a pointed end.

Thus, the tip portion 16 of the electrical contact element is repeatedly brought into contact with a semiconductor chip pad by constant physical force F while having a desired OD characteristic, to apply a constant electric signal to the semiconductor chip and thereby confirm whether the semiconductor chip is in a normal state or not.

However, the conventional electrical contact element has a problem in that, since the tip portion has the pointed distal end, while the tip portion of the electrical contact element is repeatedly brought into contact with the pad of the semiconductor chip by constant physical force F, the tip portion is likely to pierce an oxide film formed on the pad and damage the pad, by which a defective proportion cannot but be increased when implementing subsequent semiconductor manufacturing processes such as a wire bonding process, and the like.

Further, due to the fact that the tip portion of the conventional electrical contact element is cornered several times at its side, while the tip portion is brought into contact with the pad of the semiconductor chip, the tip portion is apt to become worn and produce particles by itself, which contaminate the highly integrated semiconductor chip.

Also, because the tip portion of the electrical contact element has the pointed distal end, a contact area between the tip portion and the semiconductor chip pad cannot but be decreased, and thereby electric conductivity is reduced.

Moreover, while the electrical contact element must be brought into contact with the semiconductor chip pad by constant physical force F to secure the desired OD characteristic, since the tip portion has a short length, it is difficult to properly adjust the OD characteristic.

That is to say, while the plurality of electrical contact elements are provided on a probe card and arranged to define a predetermined contour, because the tip portion of the electrical contact element has a short length, it is difficult to properly adjust heights of the plural electrical contact elements in such a way as to accomplish the desired OD characteristic.

The above-described problems can also be caused by the development in structure or configuration of the tip portion.

Namely, tip portions which initially have a tungsten needle-shaped configuration have been developed to have a V-shaped or a pyramid-shaped configuration. The pyramid-shaped tip portion has been developed to have a truncated pyramid-shaped configuration.

The tungsten needle-shaped tip portion has a drawback in that, when pointing the distal end of the tip portion, since distal end pointing work is manually carried out, reproducibility and productivity of the tip portion are impaired. Also, due to the fact that the pyramid-shaped and truncated pyramid-shaped tip portions have angled corners, while the tip portions are repeatedly brought into contact with pads of semiconductor devices, the tip portions are likely to become worn on the corners. Therefore, it is necessary to relieve or remove sharpness of the corners.

As a consequence, as already aforementioned above, when repeatedly implementing the test for the plurality of electronic devices, due to the presence of particles produced on the pointed distal end and corners of the tip portions, it is necessary to frequently wash the tip portions, as a result of which the test cannot be implemented in a quick and continuous manner.

Furthermore, while the recently developed high-frequency type electronic devices are significantly affected by noise, as the tip portion becomes worn, a contact point cannot be uniformly formed, and thereby, reliability of the test cannot but be degraded.

For this reason, it is required to implement the test within a short period of time to increase productivity.

In addition, because the beam portion has the bar-shaped configuration, it cannot properly conform to the recent trend toward a fine pitch in a highly integrated semiconductor device. Also, when the electrical contact element is brought into contact with the pad of the semiconductor chip by the constant physical force F, stress is concentrated to a certain point on the beam portion and the beam portion is likely to be broken.

Besides, due to a small connection area between the beam portion and the tip portion, when the electrical contact element is brought into contact with the semiconductor chip pad by the constant physical force F, stress is concentrated to the connection area and the tip portion is likely to be broken.

Further, while it is necessary to increase the constant physical force F applied to the tip portion in conventional electronic device testing equipment to the extent that the desired OD characteristic is secured and the oxide film formed on the semiconductor chip pad may be pierced, there is caused a problem due to various negative factors owned by the conventional electrical contact element.

Concretely speaking, while, in order to increase the constant physical force F, a length of the beam portion should be shortened, if the length of the beam portion is shortened, it is difficult to accomplish the desired OD characteristic, and excessive stress may be locally applied to the beam portion and thereby the beam portion is likely to be broken.

Also, while it is required that the beam portion has predetermined elasticity, as the length of the beam portion is shortened, elasticity of the beam portion is decreased.

SUMMARY OF THE INVENTION

Accordingly, the present invention has been made in an effort to solve the problems occurring in the related art, and an object of the present invention is to provide a method for manufacturing an electrical contact element used to test an electronic device, which can overcome the problem of the conventional art that, since a tip portion of the conventional electrical contact element is cornered several times at its side, while the tip portion is brought into contact with a pad of a semiconductor chip, the tip portion becomes worn and produces particles by itself, and an electrical contact element manufactured thereby.

Another object of the present invention is to provide a method for manufacturing an electrical contact element used to test an electronic device, which can overcome the problem of the conventional art that, since a tip portion of the conventional electrical contact element has a pointed distal end, electric conductivity is deteriorated, and an electrical contact element manufactured thereby.

Another object of the present invention is to provide a method for manufacturing an electrical contact element used to test an electronic device, which can overcome the problem of the conventional art that, since a tip portion of the conventional electrical contact element has a pointed distal end, while the tip portion is repeatedly brought into contact with a pad of a semiconductor chip by constant physical force, the tip portion pierces an oxide film formed on the pad and damages the pad and a defective proportion is increased when implementing subsequent semiconductor manufacturing processes such as a wire bonding process, and the like, and an electrical contact element manufactured thereby.

Another object of the present invention is to provide a method for manufacturing an electrical contact element used to test an electronic device, in which a length of a tip portion is increased to allow a desired OD characteristic to be easily accomplished, and an electrical contact element manufactured thereby.

Another object of the present invention is to provide a method for manufacturing an electrical contact element used to test an electronic device, which can properly conform to the recent trend toward a fine pitch required in an electronic device such as a highly integrated semiconductor chip, and an electrical contact element manufactured thereby.

Another object of the present invention is to provide a method for manufacturing an electrical contact element used to test an electronic device, which can overcome the problem of the conventional art that, while a tip portion of the conventional electrical contact element is repeatedly brought into contact with a pad of a semiconductor chip by constant physical force, stress is concentrated to a certain point on the beam portion and the beam portion is broken, and an electrical contact element manufactured thereby.

Another object of the present invention is to provide a method for manufacturing an electrical contact element used to test an electronic device, which can overcome the problem of the conventional art that, due to a small connection area between a beam portion and a tip portion of the conventional electrical contact element, when the electrical contact element is brought into contact with a pad of a semiconductor chip by constant physical force, stress is concentrated to the small connection area and the tip portion is broken, and an electrical contact element manufactured thereby.

Another object of the present invention is to provide a method for manufacturing an electrical contact element used to test an electronic device, which has improved reproducibility with respect to a beam portion and a tip portion thereof, and an electrical contact element manufactured thereby.

Still another object of the present invention is to provide a method for manufacturing an electrical contact element used to test an electronic device, which can minimize damage by particles and scratches formed on a pad of a device and has a tip portion of an increased contact area, thereby improving productivity, and an electrical contact element manufactured thereby.

Yet still another object of the present invention is to provide a method for manufacturing an electrical contact element used to test an electronic device, which can electrically test an electronic device by being increased in its physical force due to the presence of an armrest, to see whether the electronic device is in a normal state or not, and an electrical contact element manufactured thereby.

In order to achieve the above objects, according to one aspect of the present invention, there is provided a method for manufacturing an electrical contact element used to test an electronic device, by defining, on a sacrificial substrate, a trench in which a tip portion is to be formed, forming a protective film pattern in a manner such that the protective film pattern delimits an opened region in which a beam portion is to be formed and which is communicated with the trench, filling a conductive material into the opened region, and removing the sacrificial substrate and the protective film pattern to form the electrical contact element having the tip portion and the beam portion, the method comprising the step of: conducting one or more times, after defining the trench, anisotropic etching in the trench in such a way as to increase a depth of the trench and round an inner surface of the trench.

According to another aspect of the present invention, the step of conducting one or more times anisotropic etching in the trench in such a way as to increase a depth of the trench and round an inner surface of the trench is implemented by a reactive ion etching (RIE) process.

According to another aspect of the present invention, the beam portion has a multi-stepped configuration which comprises a first bar-shaped part connected with the tip portion, a second bar-shaped part connected with the first part and having a width greater than the first part, and a third bar-shaped part connected with the second part and having a width greater than the second part. Alternatively, the beam portion has a zigzagged configuration which comprises a first bar-shaped part connected with the tip portion, a second zigzagged part connected with the first part and zigzagged one or more times, and a third bar-shaped part connected with the second part.

According to another aspect of the present invention, a distal end of the tip portion has a truncated polygonal pyramid-shaped or a truncated cone-shaped configuration with a rounded distal end surface. Alternatively, a distal end of the tip portion has a column-shaped configuration with a rounded distal end surface, and a projection is formed around a proximal end of the tip portion.

According to another aspect of the present invention, there is provided a method for manufacturing an electrical contact element used to test an electronic device, by defining, on a sacrificial substrate, a trench in which a tip portion is to be formed, forming a first protective film pattern in a manner such that the first protective film pattern delimits a first opened region in which a beam portion is to be formed and which is communicated with the trench, filling a conductive material into the first opened region, and removing the sacrificial substrate and the first protective film pattern to form the electrical contact element having the tip portion and the beam portion, the method comprising the steps of: conducting one or more times, after defining the trench, anisotropic etching in the trench in such a way as to increase a depth of the trench and round an inner surface of the trench; filling the conductive material into the first opened region of a predetermined thickness delimited on the sacrificial substrate by the first protective layer, to form the tip portion and the beam portion, and then flattening an upper surface of a first resultant product; forming a second protective film pattern on the first resultant product having undergone the flattening step, in a manner such that the second protective film pattern delimits a second opened region in which an armrest is to be formed, adjacent to the trench in which the tip portion is to be formed; filling the conductive material into the second opened region of a predetermined thickness delimited on the first resultant product by the second protective layer, to form the armrest, and then flattening an upper surface of a second resultant product; and removing the second protective film pattern, first protective film pattern and sacrificial substrate to complete the electrical contact element having the tip portion, beam portion and armrest.

According to another aspect of the present invention, a distal end of the tip portion has a truncated polygonal pyramid-shaped, a truncated cone-shaped or a column-shaped configuration with a rounded distal end surface, and a projection is formed around a proximal end of the tip portion.

According to another aspect of the present invention, there is provided an electrical contact element used to test an electronic device, comprising: a beam portion having a multi-stepped configuration which comprises a first bar-shaped part, a second bar-shaped part connected with the first part and having a width greater than the first part, and a third bar-shaped part connected at one thereof with the second part and having a width greater than the second part, the third part being connected at the other end thereof with an electronic component, through a bump; a trench defined on a sacrificial substrate at a position corresponding to a free end of the first part of the beam portion, by conducting one or more times a first isotropic etching process using a first protective film pattern as an etching mask, in a manner such that a bottom surface of the trench is rounded; and a tip portion formed by applying, after removing the first protective film pattern, a second protective film pattern on the sacrificial substrate, filling a conductive material into the trench, flattening an upper surface of a resultant product, removing the sacrificial substrate and the second protective film pattern by wet etching.

According to another aspect of the present invention, there is provided an electrical contact element used to test an electronic device, comprising: a beam portion having a zigzagged configuration which comprises a first bar-shaped part connected with an electronic component through a bump, a second zigzagged part connected with the first part and zigzagged one or more times, and a third bar-shaped part connected with the second part; a trench defined on a sacrificial substrate at a position corresponding to a free end of the third part of the beam portion, by conducting one or more times a first isotropic etching process using a first protective film pattern as an etching mask, in a manner such that a bottom surface of the trench is rounded; and a tip portion formed by applying, after removing the first protective film pattern, a second protective film pattern on the sacrificial substrate, filling a conductive material into the trench, flattening an upper surface of a resultant product, removing the sacrificial substrate and the second protective film pattern by wet etching.

According to another aspect of the present invention, by conducting anisotropic etching one or more times, the trench has a truncated polygonal pyramid-shaped, a truncated cone-shaped or a column-shaped section, with a side surface of the trench sloped.

According to another aspect of the present invention, a distal end of the tip portion has a column-shaped configuration with a rounded distal end surface, and first and second projections are formed around a proximal end of the tip portion.

According to another aspect of the present invention, there is provided an electrical contact element used to test an electronic device, comprising: a sacrificial substrate formed, on a surface thereof, with a first photoresist of a predetermined thickness; a first opened region defined by patterning the first photoresist, for allowing a tip portion to be formed therein; a trench for allowing the tip portion to be formed therein by using a first photoresist pattern as an etching mask, the trench undergoing an anisotropic etching process to round the tip portion, the first photoresist pattern formed on the sacrificial substrate being removed by ashing; a zigzagged beam portion zigzagged one or more times and an armrest formed by filling, to a predetermined thickness and through implementing a chemical vapor deposition (CVD), physical vapor deposition (PVD) or plating process, a conductive material for the formation of the tip and beam portions into a second opened region delimited by a second photoresist pattern on the sacrificial substrate, flattening an upper surface of a resultant product, and removing the second photoresist pattern and a third photoresist pattern; a post portion formed on a terminal of an electronic component to have a bump of a predetermined size; and connection means for connecting the post portion with one end of the beam portion opposite to the other end of the beam portion on which the armrest is formed; wherein the armrest is formed on an upper surface of a zigzagged part of the beam portion when the sacrificial substrate is removed by wet etching.

According to another aspect of the present invention, there is provided an electrical contact element used to test an electronic device, comprising: a sacrificial substrate formed, on a surface thereof, with a first photoresist of a predetermined thickness; a first opened region defined by patterning the first photoresist, for allowing a tip portion to be formed therein; a trench for allowing the tip portion to be formed therein by using a first photoresist pattern as an etching mask, the trench undergoing an anisotropic etching process to round the tip portion, the first photoresist pattern formed on the sacrificial substrate being removed by ashing; a zigzagged beam portion zigzagged one or more times and an armrest formed by filling, to a predetermined thickness and through implementing a chemical vapor deposition, physical vapor deposition or plating process, a conductive material for the formation of the tip and beam portions into a second opened region delimited by a second photoresist pattern on the sacrificial substrate, flattening an upper surface of a resultant product, and removing the second photoresist pattern and a third photoresist pattern; a post portion formed on a terminal of an electronic component to have a bump of a predetermined size; and connection means for connecting the post portion with one end of the beam portion opposite to the other end of the beam portion on which the armrest is formed; wherein, when the sacrificial substrate is removed by wet etching, armrests are respectively formed on a zigzagged part of the zigzagged beam portion and a surface of the electronic component in a manner such that the armrests are spaced apart from each other by a predetermined distance.

According to another aspect of the present invention, in the case that the beam portion is formed with a zigzagged part zigzagged one or more times, the armrest is formed between a desired position on the zigzagged part and a corresponding position on a surface of the electronic component.

According to still another aspect of the present invention, the armrest is formed on the beam portion in opposition to the tip portion.

According to yet still another aspect of the present invention, the armrest is formed between a point on the zigzagged part of the beam portion which point is most adjacent to the tip portion and the a corresponding position on the surface of the electronic component.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF PREFERRED EMBODIMENTS

Figure 1A:
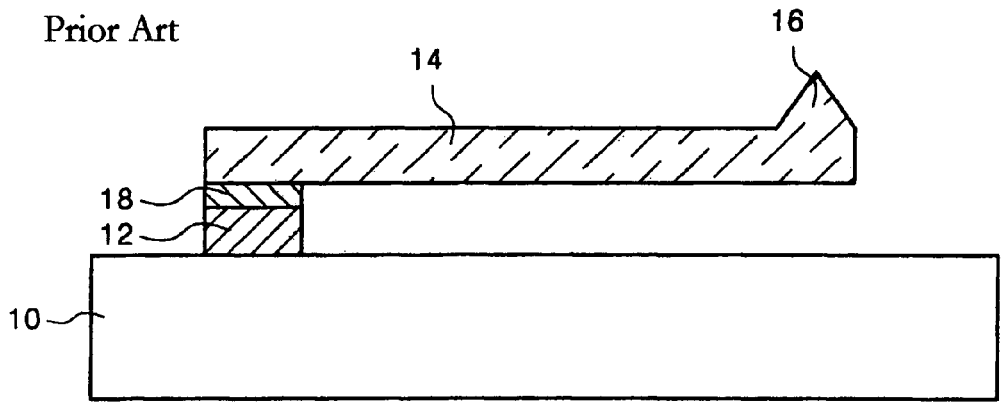
FIGS. 1a and 1b are a cross-sectional view and a perspective view illustrating the conventional electrical contact element used to test an electronic device.
Figure 1B:
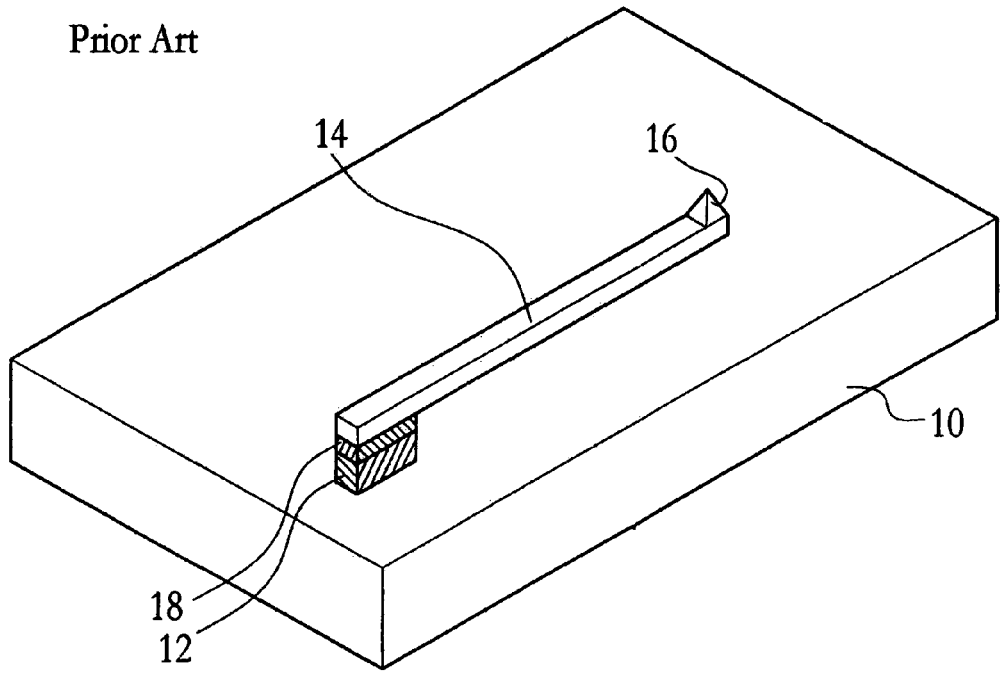

Reference will now be made in greater detail to a preferred embodiment of the invention, an example of which is illustrated in the accompanying drawings. Wherever possible, the same reference numerals will be used throughout the drawings and the description to refer to the same or like parts.

FIGS. 2 through 10b are cross-sectional views explaining a method for manufacturing an electrical contact element used to test an electronic device, in accordance with a first embodiment of the present invention.

Figure 2:
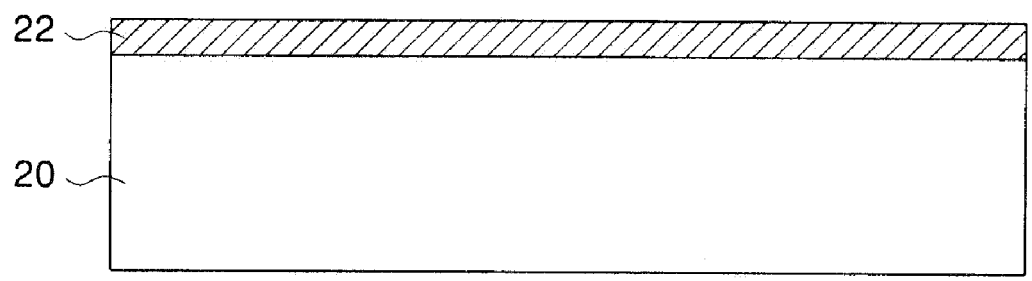
FIGS. 2 through 10b are cross-sectional views explaining a method for manufacturing an electrical contact element used to test an electronic device, in accordance with a first embodiment of the present invention.

In the method according to this embodiment of the present invention, first, as shown in FIG. 2, a first protective film 22 of a predetermined thickness is formed on an entire surface of a sacrificial substrate 20 made of silicon having a fixed orientation such as (1 0 0). The first protective film 22 comprises a thin film such as a photoresist and an oxide film. At this time, the photoresist is formed by a spin coating process in which the photoresist is poured onto the sacrificial substrate 20 while the sacrificial substrate 20 is rotated, and the oxide film is formed by the conventional thermal oxidation process.

Figure 3:
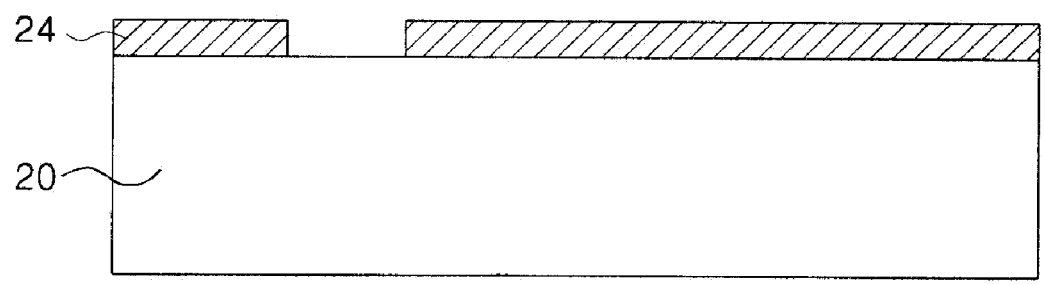

Then, as shown in FIG. 3, by implementing a photolithography process which is well known in the art, a first protective film pattern 24 having a first opened region (not numbered) is formed.

At this time, the first protective film pattern 24 comprising the photoresist is formed by positioning, exposing and developing a reticle having realized thereon a circuit pattern, on the first protective film 22. Further, the first protective film pattern 24 comprising the oxide film is formed by coating the photoresist on the first protective film 22, preparing a photoresist pattern through exposing and developing the resultant product, and implementing a wet or dry etching process using the photoresist pattern as an etching mask.

Figure 4A:
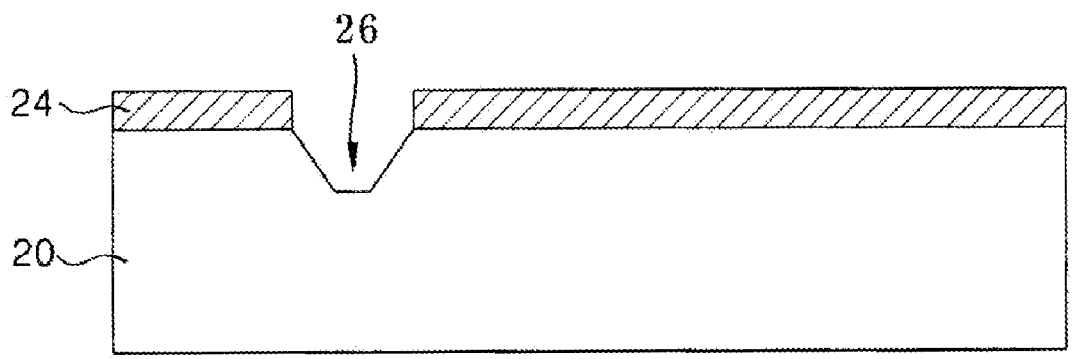

Then, as shown in FIG. 4a, by implementing a first etching process using the first protective film pattern 24 as an etching mask, a trench in which a tip portion is to be formed is defined on the sacrificial substrate 20.

At this time, the first etching process comprises a wet etching process employing a chemical in which potassium hydroxide (KOH) and deionized water are mixed at a predetermined ratio. When implementing the wet etching process employing the chemical, the sacrificial substrate 20 having the fixed orientation is anisotropically etched to define a trench 26 having a truncated polygonal pyramid-shaped or a truncated cone-shaped configuration.

Figure 4B:
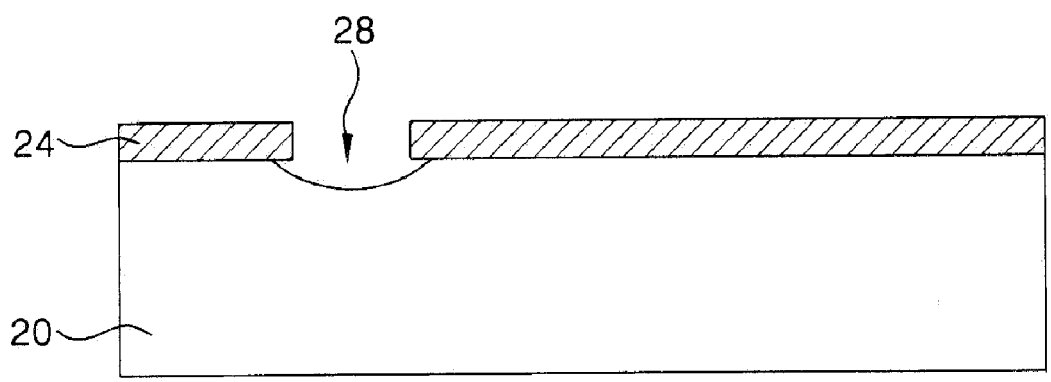

Further, as shown in FIG. 4b, the first etching process may comprise a wet etching process employing a chemical in which hydrogen fluoride (HF), nitric acid ($HNO_3$) and acetic acid ($CH_3COOH$) are mixed at a predetermined ratio. By the wet etching process employing the chemical, the sacrificial substrate 20 having the fixed orientation such as (1 0 0) is isotropically etched to define a trench 28 having a configuration of a column, for example, a square column, with a bottom surface rounded.

At this time, due to an isotropic etching characteristic of the chemical, the sacrificial substrate 20 is also etched around an upper end of the first opened region and below the first protective film pattern 24.

Figure 5A:
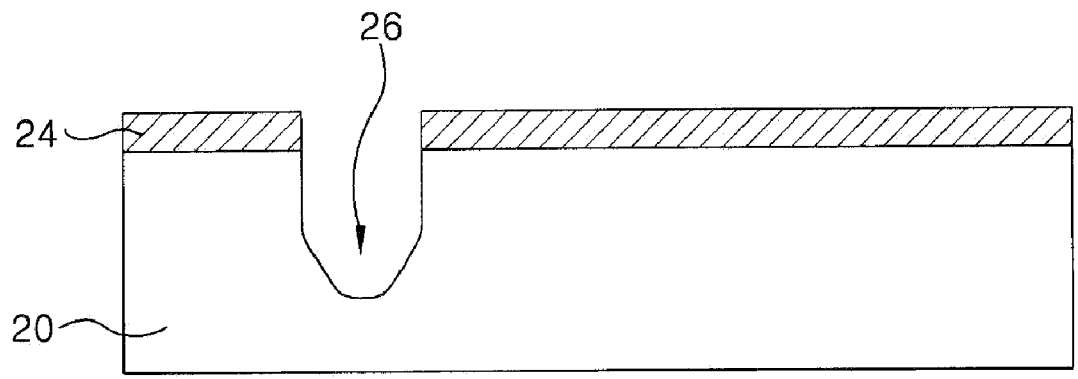

Next, as shown in FIG. 5a, the first protective film pattern 24 applied on the sacrificial substrate 20, which is defined with the trench 26 of the truncated polygonal pyramid-shaped or the truncated cone-shaped configuration with a side surface sloped, by the first anisotropic etching process, is used as an etching mask. In this state, a second etching process is implemented employing a gas mixture in which $SF_6$, $C_4F_8$ and $O_2$ gases are mixed at a preselected ratio.

At this time, the second etching process which is a kind of deep trench etching is implemented by reactive ion etching (RIE) which is called a Bosh process. By implementing the second etching process, a depth of the trench 26 which is defined by the first etching process and has the truncated polygonal pyramid-shaped or the truncated cone-shaped configuration is increased to 30 μm~500 μm, and at the same time, a bottom surface of the trench 26 is rounded.

Describing in further detail, after the trench 26 is further etched to have the depth of 30 μm~500 μm, by an isotropic etching characteristic of $SF_6$, an angle of the inner surface of the trench 26 having the truncated polygonal pyramid-shaped or the truncated cone-shaped configuration is decreased by a predetermined extent and the bottom surface of the trench 26 is rounded.

Here, it is to be noted that the second etching process may be implemented one or more times.

Figure 5B:
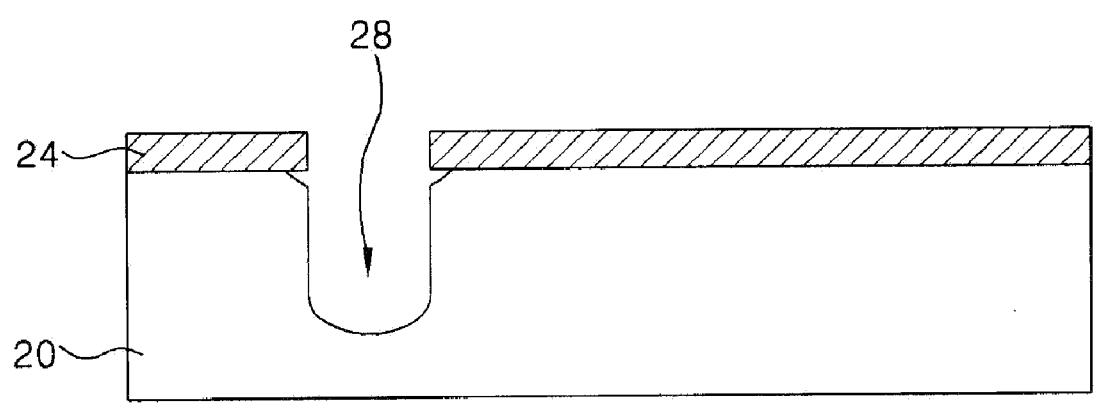

Also, as shown in FIG. 5b, the first protective film pattern 24 applied on the sacrificial substrate 20, which is defined with the trench 28 of the column-shaped configuration with the inner surface rounded, by the first etching process, is used as an etching mask. In this state, a second etching process is implemented employing a gas mixture in which $SF_6$, $C_4F_8$ and $O_2$ gases are mixed at a preselected ratio.

At this time, the second etching process which is a kind of deep trench etching is implemented by RIE which is called a Bosh process. By implementing the second etching process, a depth of the trench 28 which is defined by the first etching process is increased to 30 μm~500 μm. Therefore, the trench 28 is further deepened and a bottom surface thereof is rounded.

Here, it is to be noted that the second etching process may be implemented one or more times.

Figure 6A:
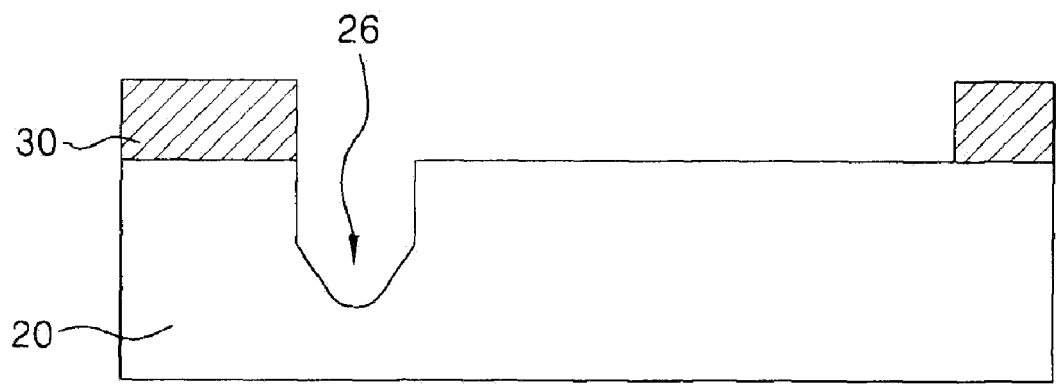
Figure 6B:
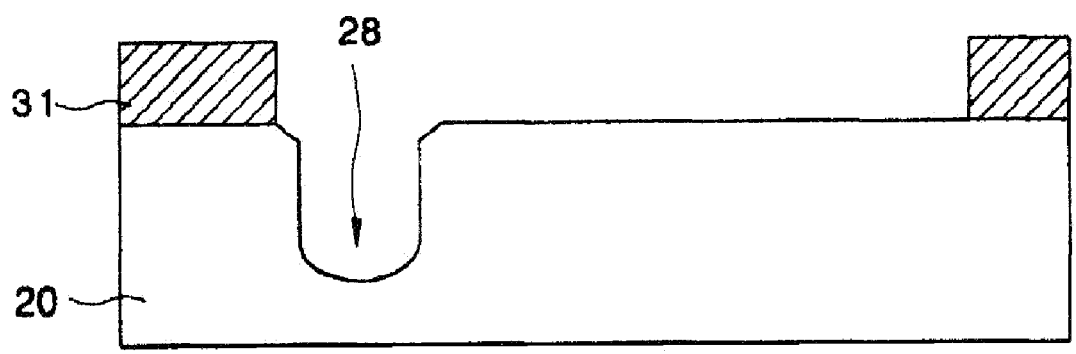

In succession, as shown in FIG. 6a, after the first protective film pattern 24 is removed, a second protective film pattern 30 which comprises a photoresist of a preset thickness and delimits a second opened region (not numbered) is formed on the entire surface of the sacrificial substrate 20 which is defined with the trench 26 of the truncated polygonal pyramid-shaped or the truncated cone-shaped configuration with the bottom surface rounded, by the second etching process. Alternatively, as shown in FIG. 6b, after the first protective film pattern 24 is removed, a second protective film pattern 31 which comprises a photoresist of a preset thickness and delimits a second opened region (not numbered) is formed on the entire surface of the sacrificial substrate 20 which is defined with the trench 28 of the column-shaped configuration with the bottom surface rounded, by the second etching process.

At this time, the second protective film pattern 30 is formed by coating, exposing and developing a photoresist. The second protective film patterns 30 and 31 are formed to delimit the second opened regions on the sacrificial substrate 20, in a manner such that the beam portions are formed in the second opened regions and the second opened regions are communicated with the trenches 26 and 28, respectively.

Figure 7A:
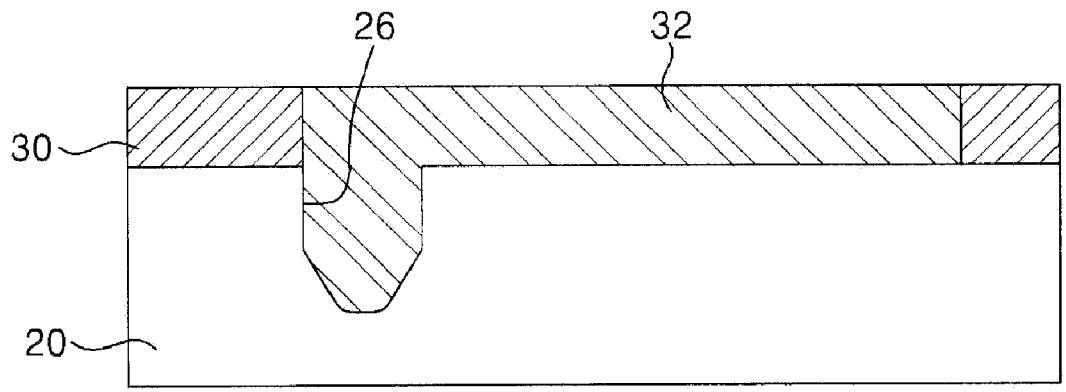
Figure 7B:
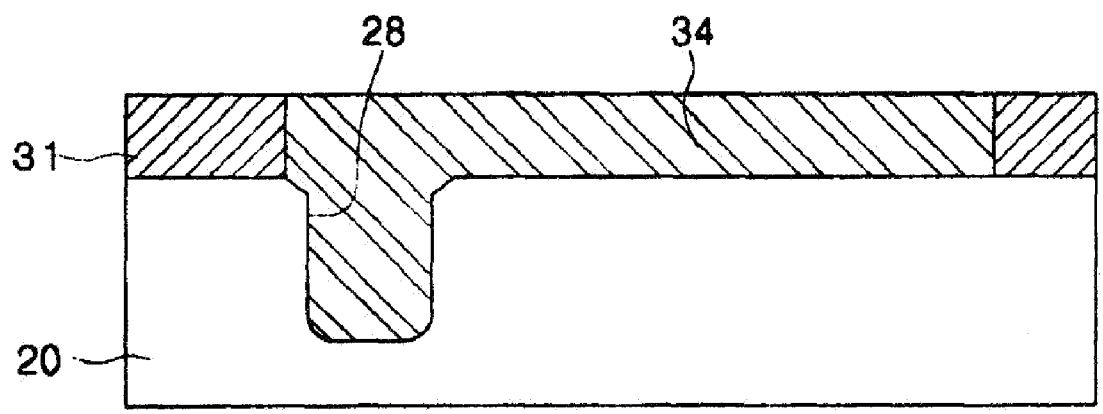

Thereafter, as shown in FIG. 7a, after the second protective film pattern 30 is formed on the sacrificial substrate 20 and a conductive material 32 is filled into the second opened region by implementing a CVD, PVD or plating process, to have the preset thickness, an upper surface of a resultant product is flattened. Alternatively, as shown in FIG. 7b, after a conductive material 34 is formed on the sacrificial substrate 20 which is formed with the second protective film pattern 31, to have the preset thickness, by implementing the CVD, PVD or plating process, an upper surface of a resultant product is flattened.

At this time, the conductive material is made of nickel alloy, etc., and the upper surface of the sacrificial substrate 20 which is formed with the conductive material can be flattened by chemical mechanical polishing, etchback, grinding, etc.

Figure 8A:
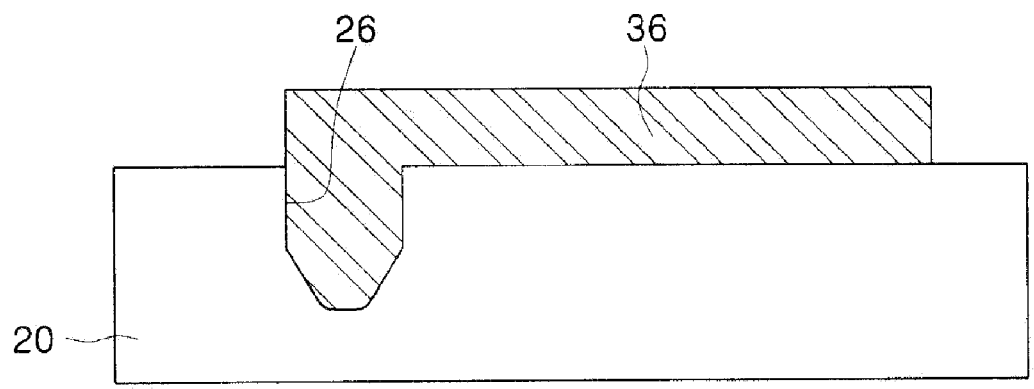
Figure 8B:
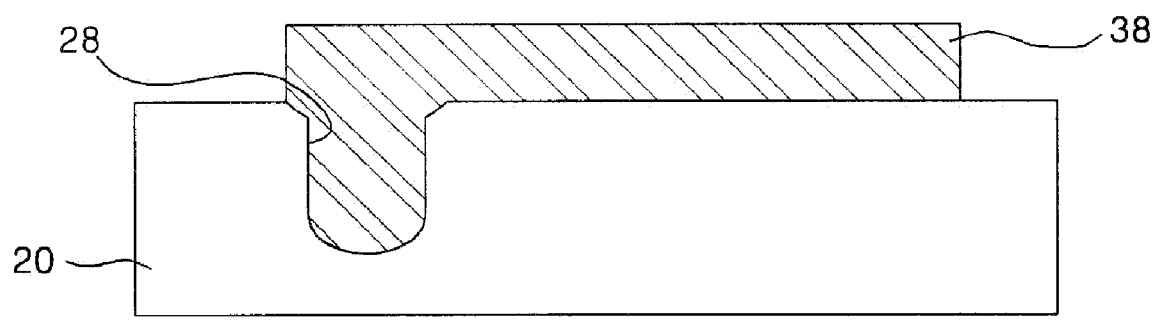

In succession, as shown in FIG. 8a, as the second protective film pattern 30 (see FIG. 7a) is removed from the upper surface of the sacrificial substrate 20 having undergone the flattening process, the tip portion is formed in the trench 26 and the beam portion 36 is formed in the second opened region. Alternatively, as shown in FIG. 8b, as the second protective film pattern 31 (see FIG. 7b) is removed from the upper surface of the sacrificial substrate 20 having undergone the flattening process, the tip portion is formed in the trench 28 and the beam portion 38 is formed in the second opened region.

At this time, the second protective film pattern 31 (see FIG. 7b) is removed by implementing a wet etching process employing a chemical or a dry etching process such as ashing, and the like.

Figure 11A:
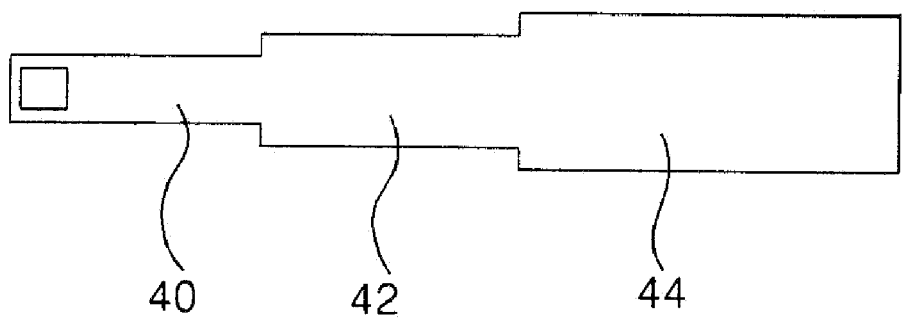
FIG. 11a is a plan view illustrating a beam portion of the electrical contact element used to test an electronic device, according to the present invention.

In order to properly conform to the recent trend toward a fine pitch, each of the beam portions 36 and 38 has, as shown in FIG. 11a, a multi-stepped configuration which comprises a first bar-shaped part 40 connected with each of the tip portions formed in the trenches 26 and 28, a second bar-shaped part 42 connected with the first part 40 and having a width greater than the first part 40, and a third bar-shaped part 44 connected with the second part 42 and having a width greater than the second part 42.

Figure 11B:
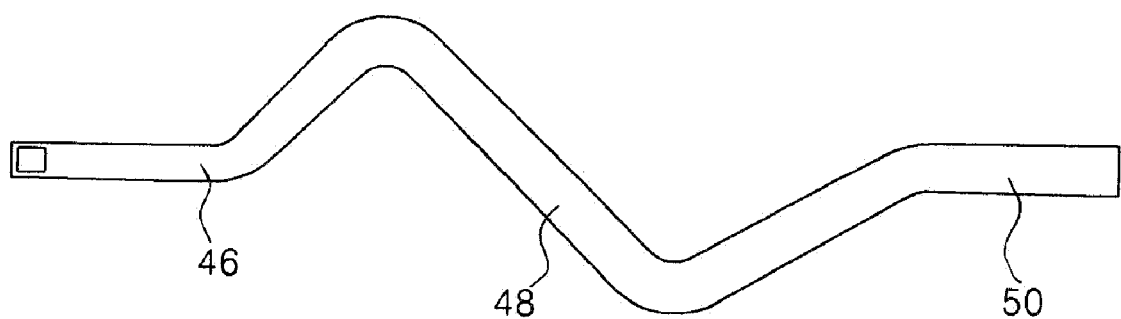
FIG. 11b is a plan view illustrating another beam portion of the electrical contact element used to test an electronic device, according to the present invention.

Also, each of the beam portions 36 and 38 may have, as shown in FIG. 11b, a zigzagged configuration which comprises a first bar-shaped part 46 connected with each of the tip portions formed in the trenches 26 and 28, a second zigzagged part 48 connected with the first part 46 and zigzagged one or more times, and a third bar-shaped part 50.

At this time, the first parts 40 and 46 may be connected with the respective tip portions formed in the trenches 26 and 28. Also, the second zigzagged part of 48 the zigzagged beam portion 38 has a bent angle of 30°~170°, preferably of about 90°. It is to be noted that the second part 48 may be zigzagged one or more times. In each of the beam portions 36 and 38, a width is decreased from a position of a bump toward that of the tip portion, so as to easily conform to the recent trend toward a fine pitch as in the multi-stepped configuration.

Figure 9A:
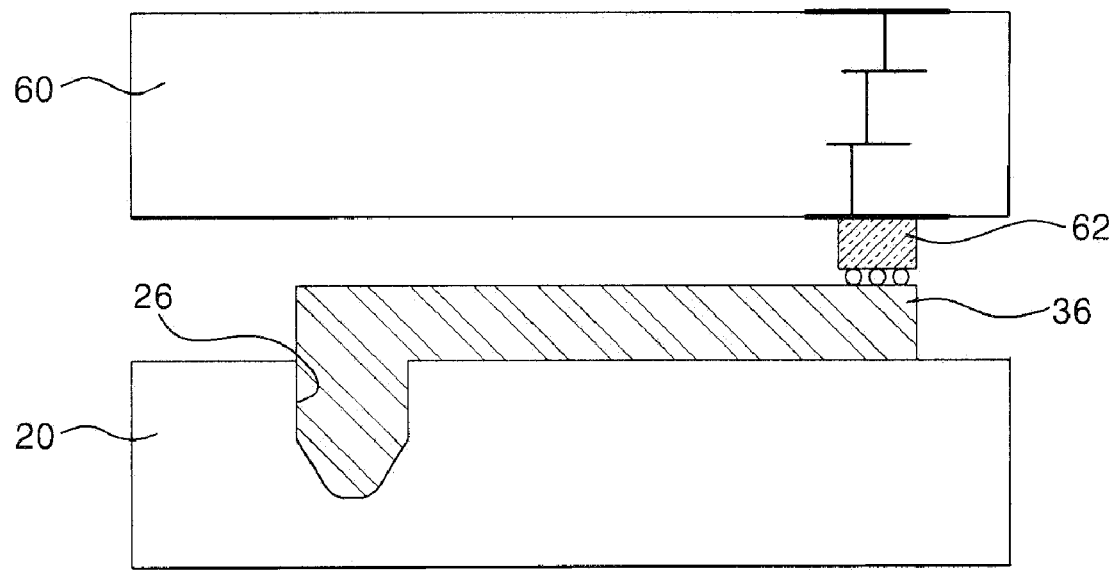
Figure 9B:
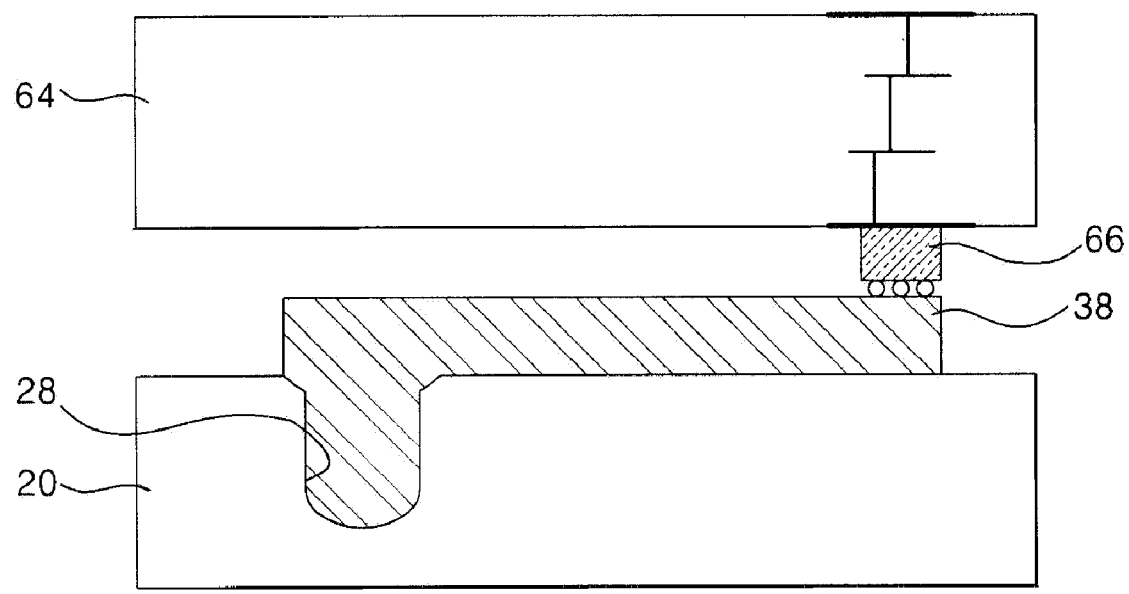

In succession, as shown in FIG. 9a, the beam portion 36 formed on the sacrificial substrate 20 which is defined with the trench 26 of the truncated polygonal pyramid-shaped or the truncated cone-shaped configuration with the bottom surface rounded is connected with an electronic component 60 having realized thereon a circuit pattern, by the medium of a bump 62. Alternatively, as shown in FIG. 9b, the beam portion 38 formed on the sacrificial substrate 20 which is defined with the trench 28 of the column-shaped configuration with the bottom surface rounded is connected with an electronic component 64 having realized thereon a circuit pattern, by the medium of a bump 66.

At this time, the beam portions 36 and 38 realized on the sacrificial substrate 20 and the electronic components 60 and 64 are connected with each other, respectively, in a manner such that, after the bumps 62 and 66 are placed between the beam portions 36 and 38 and the electronic components 60 and 64, the bumps 62 and 66 and the beam portions 36 and 38 are coupled with each other by soldering, brazing, plating, a conductive adhesive, etc.

Figure 10A:
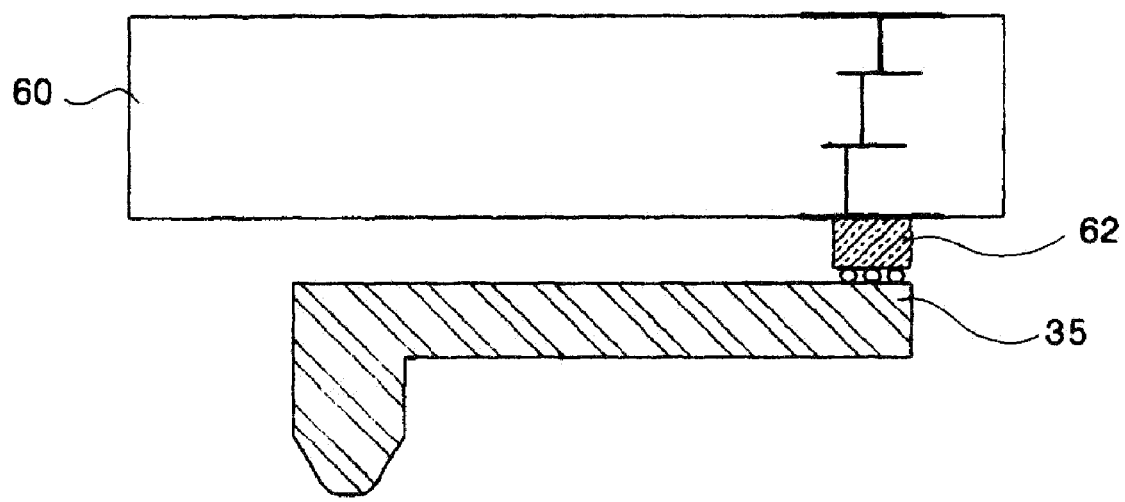
Figure 10B:
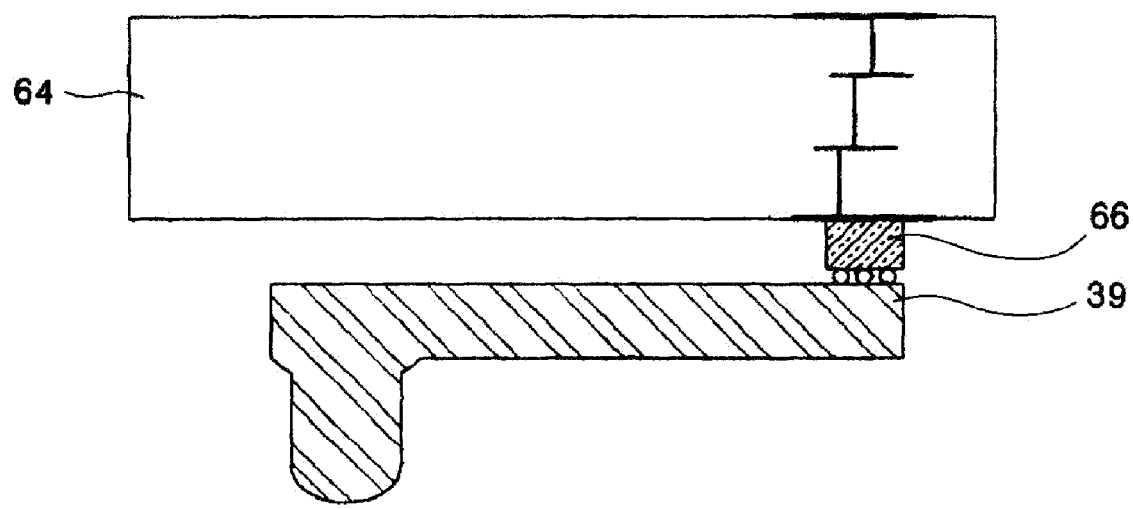

Finally, as shown in FIG. 10a, as the sacrificial substrate 20 which is defined with the trench 26 of the truncated polygonal pyramid-shaped or the truncated cone-shaped configuration with the bottom surface rounded is removed by wet etching, etc., the beam portion 36 can be freed to complete an electrical contact element 35 used to test the electronic device. Alternatively, as shown in FIG. 10b, as the sacrificial substrate 20 which is defined with the trench 28 of the column-shaped configuration with the bottom surface rounded is removed by wet etching, etc., the beam portion 38 can be freed to complete an electrical contact element 39 used to test the electronic device.

Hereafter, the electrical contact element manufactured by the method for manufacturing an electrical contact element used to test an electronic device in accordance with the first embodiment of the present invention, and the beam and tip portions of the electrical contact element will be described in detail.

Figure 26:
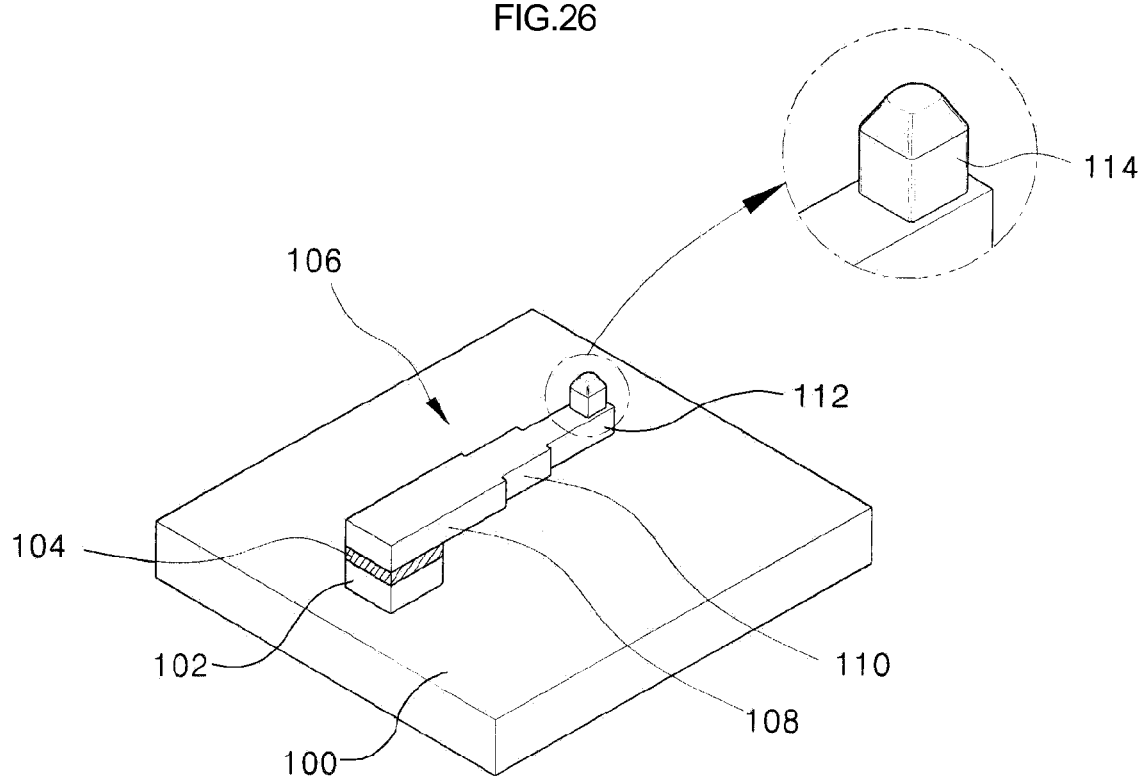
FIG. 26 is a perspective view illustrating a first electrical contact element manufactured by the method for manufacturing an electrical contact element used to test an electronic device, in accordance with the first embodiment of the present invention.

FIG. 26 is a perspective view illustrating a first electrical contact element manufactured by the method for manufacturing an electrical contact element used to test an electronic device, in accordance with the first embodiment of the present invention.

In the first electrical contact element used to test an electronic device, according to the present invention, as shown in FIG. 26, a terminal (not numbered) of an electronic component 100 such as a printed circuit board (PCB) having realized thereon a predetermined circuit pattern, and a third part 108 of the beam portion of the electrical contact element 106 are connected with each other by the medium of a bump 102 and by virtue of a bonding portion 104.

At this time, the electrical contact element 106 has the beam portion of a multi-stepped configuration which comprises a first bar-shaped part 112, a second bar-shaped part 110 connected with the first part 112 and having a width greater than the first part 112, and a third bar-shaped part 108 connected with the second part 110 and having a width greater than the second part 110.

A free end of the first part 112 of the beam portion is integrally connected with a tip portion 114 which is to be brought into contact with a pad of a semiconductor chip by constant physical force.

Here, the tip portion 114 has a truncated quadrangular pyramid-shaped configuration with a distal end surface rounded. A length of the tip portion 114 is extended to 30 μm~500 μm in consideration of an OD characteristic. In this preferred embodiment, the tip portion 114 has a length of 100 μm.

Accordingly, due to the fact that the tip portion 114 of the electrical contact element 106 has the quadrangular pyramid-shaped configuration with the distal end surface rounded, while the tip portion 114 is repeatedly brought into contact with the pad of the semiconductor chip, it is possible to prevent the tip portion 114 from becoming worn and producing particles by itself.

Also, due to the fact that the distal end surface of the tip portion 114 is rounded, while the tip portion 114 of the electrical contact element 106 is repeatedly brought into contact with the pad of the semiconductor chip by constant physical force, it is possible to prevent the tip portion 114 from piercing an oxide film formed on the pad and damage the pad, whereby it is possible to prevent a defective proportion from being increased when implementing subsequent semiconductor manufacturing processes such as a wire bonding process, and the like.

Further, since the distal end surface of the tip portion 114 is rounded, as a contact area is increased between the tip portion 114 and the semiconductor chip pad, electric conductivity can be improved.

And, since the tip portion 114 has a length of 30 μm~500 μm and, in this preferred embodiment, 100 μm, it is possible to easily adjust an OD characteristic.

Moreover, by the fact that the beam portion of the electrical contact element 106 has the multi-stepped configuration which comprises the first bar-shaped part 112 connected with the tip portion 114, the second bar-shaped part 110 connected with the first part 112 and having a width greater than the first part 112, and the third bar-shaped part 108 connected with the second part 110 and having a width greater than the second part 110, it is possible to conform to the recent trend toward a fine pitch in an electronic device such as a highly integrated semiconductor device.

Figure 34:
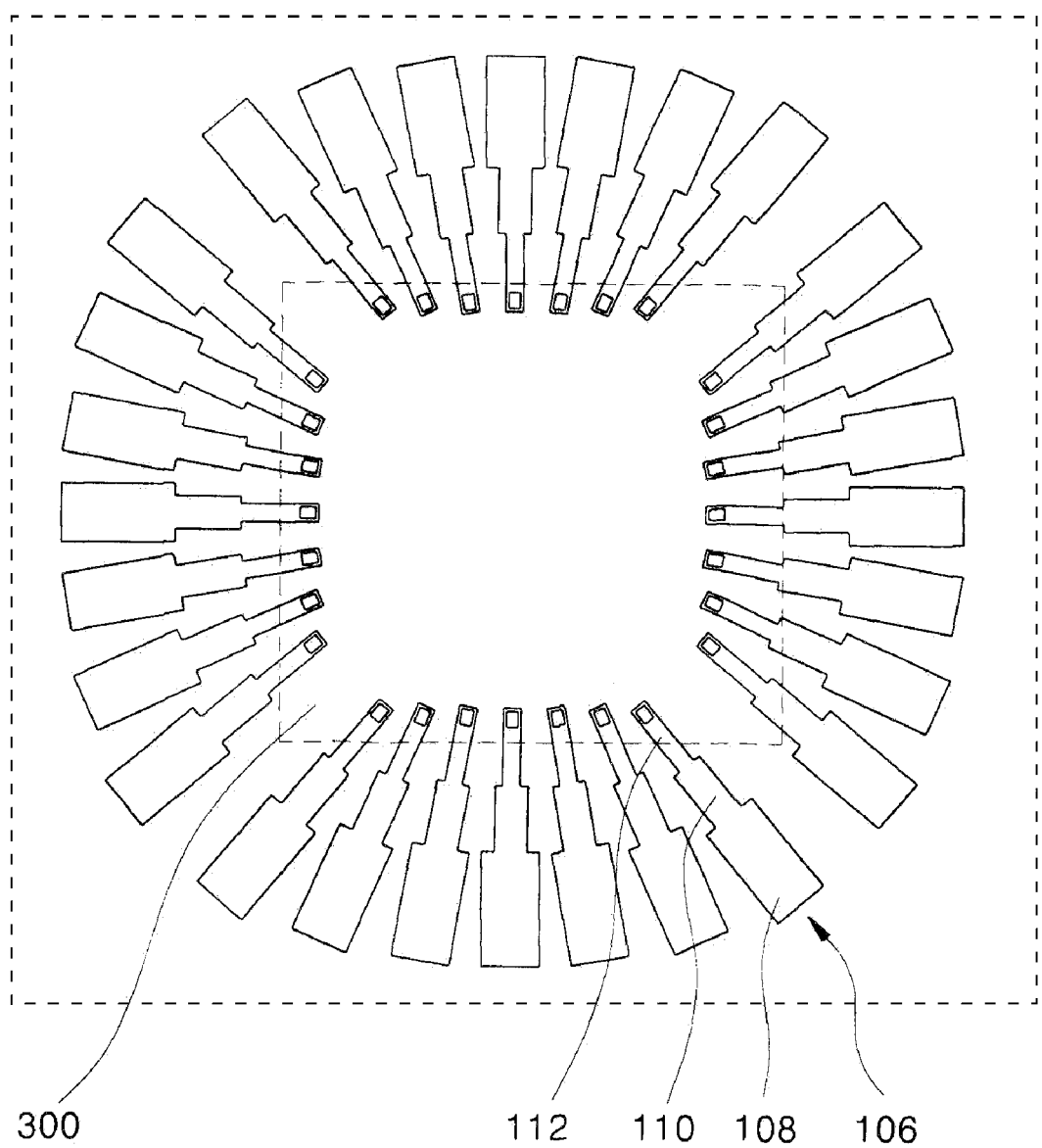
FIG. 34 is a plan view exemplifying a layout of electrical contact elements used to test an electronic device, according to the present invention.

That is to say, because the width of the beam portion is decreased from the third part 108 toward the first part 112, as shown in FIG. 34, a plurality of electrical contact elements 106 can be radially arrayed adjoining one with another to be brought into contact with a pad 300 of a semiconductor device. In this way, it is possible to conform to the recent trend toward a fine pitch in an electronic device such as a highly integrated semiconductor device.

Figure 27:
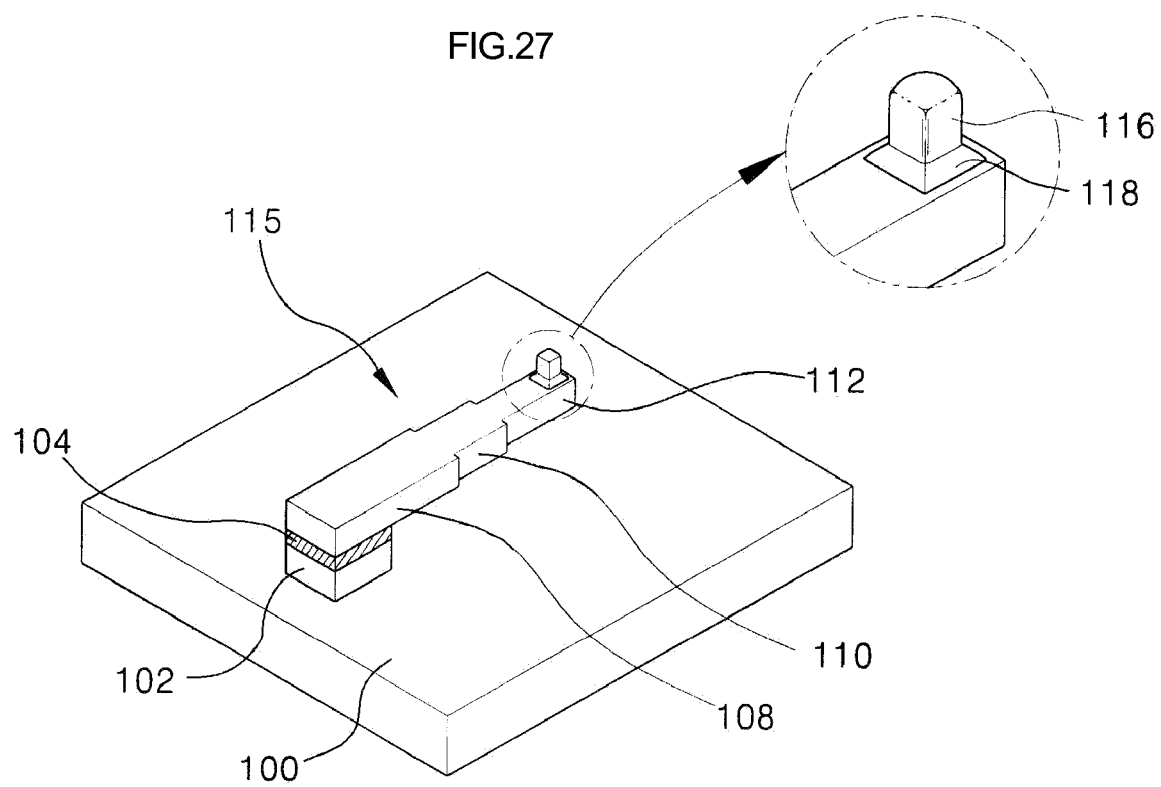
FIG. 27 is a perspective view illustrating a second electrical contact element manufactured by the method for manufacturing an electrical contact element used to test an electronic device, in accordance with the first embodiment of the present invention.

FIG. 27 is a perspective view illustrating a second electrical contact element manufactured by the method for manufacturing an electrical contact element used to test an electronic device, in accordance with the first embodiment of the present invention.

The second electrical contact element 115 according to the present invention is characterized in that, as shown in FIG. 27, the tip portion 114 of the first electrical contact element 106 is replaced with a tip portion 116 which is formed at a proximal end thereof with a projection 118 and a distal end of a column-shaped configuration with a distal end surface rounded.

Here, a length of the tip portion 116 is extended to 30 μm~500 μm in consideration of an OD characteristic. In this preferred embodiment, the tip portion 116 has a length of 100 μm.

Accordingly, due to the fact that the projection 118 is formed around the proximal end of the tip portion 116 of the second electrical contact element 115, in addition to the working effects obtained by the first electrical contact element 106, when the tip portion 116 is brought into contact with the pad of the semiconductor chip by constant physical force, it is possible to disperse stress applied to the proximal end of the tip portion 116 and prevent the tip portion 116 from being broken.

Figure 28:
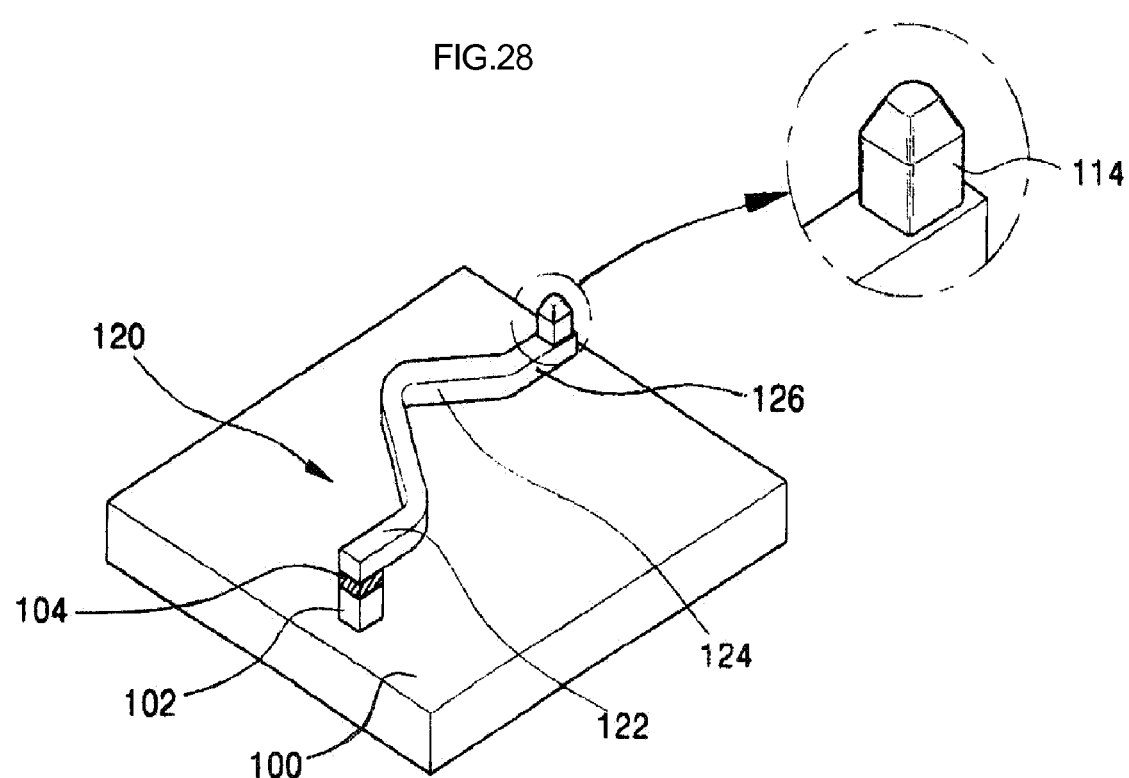
FIG. 28 is a perspective view illustrating a third electrical contact element manufactured by the method for manufacturing an electrical contact element used to test an electronic device, in accordance with the first embodiment of the present invention.

FIG. 28 is a perspective view illustrating a third electrical contact element manufactured by the method for manufacturing an electrical contact element used to test an electronic device, in accordance with the first embodiment of the present invention.

In the third electrical contact element 120 according to the present invention, the beam portion of the first electrical contact element 106 is replaced with a beam portion having a zigzagged configuration. In other words, the beam portion has, as shown in FIG. 28, a first bar-shaped part 122, a zigzagged second part 124 connected with the first part 122, and a third bar-shaped part 126 connected with the second part 124.

At this time, the second zigzagged part 124 of the beam portion has a bent angle of 30°~170°, preferably of about 90°. It is to be noted that the second part 124 may be zigzagged one or more times.

In the zigzagged beam portion, due to the fact that a width is decreased from a position of a bump 102 toward the tip portion 114, it is possible to manufacture the beam portion in such a way as to easily conform to the recent trend toward a fine pitch as in the beam portion of the multi-stepped configuration.

As a consequence, by the fact that the beam portion of the third electrical contact element 120 has the zigzagged configuration, in addition to the working effects accomplished by the first electrical contact element 106, when the tip portion 114 is brought into contact with the pad of the semiconductor chip by constant physical force, as a length of the beam portion is increased when measured from the bump 102 to the tip portion 114, stress applied to the beam portion can be dispersed and the beam portion is prevented from being broken due to concentrated stress application.

Figure 36:
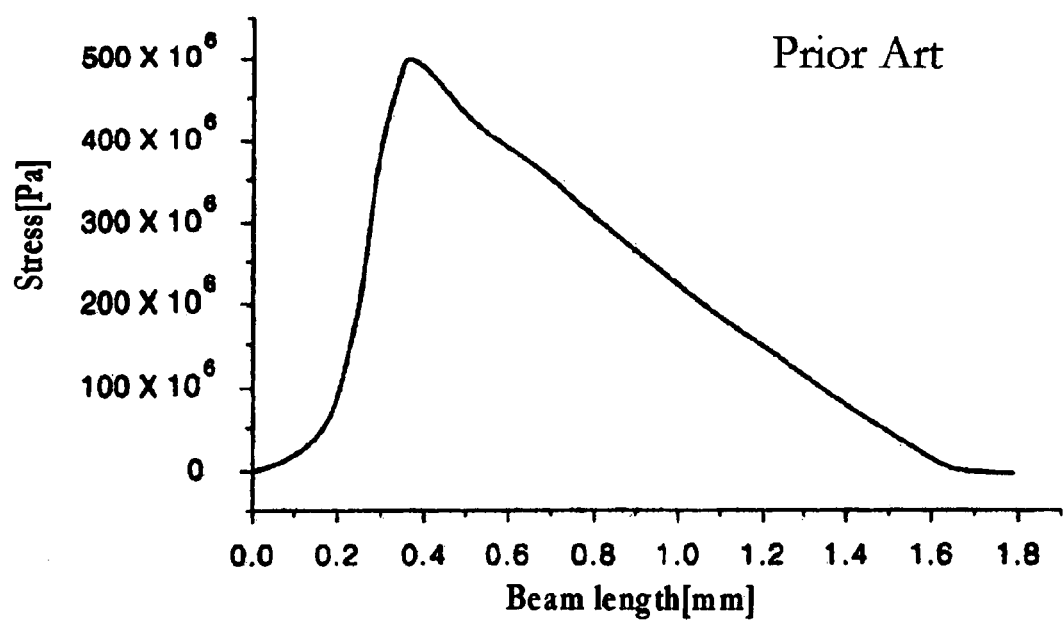
FIG. 36 is a graph depicting distribution of stress applied to a bar-shaped beam portion of the conventional electrical contact element used to test an electronic device.
Figure 37:
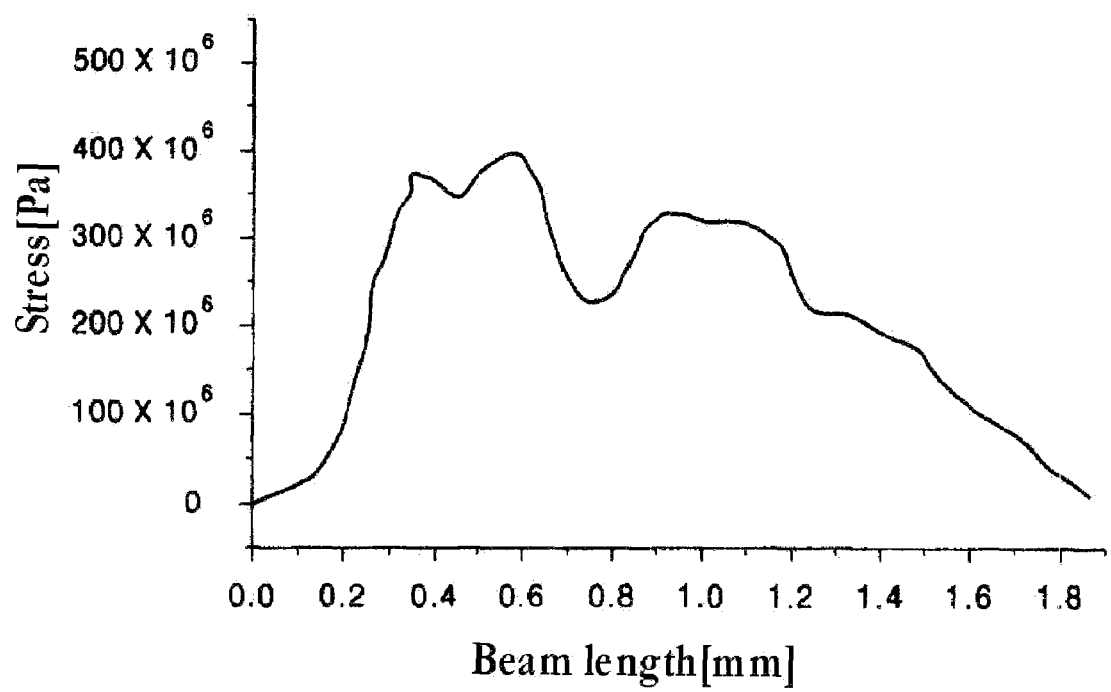
FIG. 37 is a graph depicting distribution of stress applied to a zigzagged beam portion of the electrical contact element used to test an electronic device, according to the present invention.

FIG. 36 is a graph depicting results of simulating distribution of stress applied to a bar-shaped beam portion of the conventional electrical contact element used to test an electronic device; and FIG. 37 is a graph depicting results of simulating distribution of stress applied to a zigzagged beam portion of the electrical contact element used to test an electronic device, according to the present invention.

Referring to FIGS. 36 and 37, while, in the case of the conventional bar-shaped beam portion, severe stress reaching $500 \times 10^6$ Pa is applied to the beam portion at a position of about 0.4 mm from the bump, in the case of the zigzagged beam portion according to the present invention, it can be confirmed that stress is uniformly distributed over the entire area of the beam portion.

Figure 35:
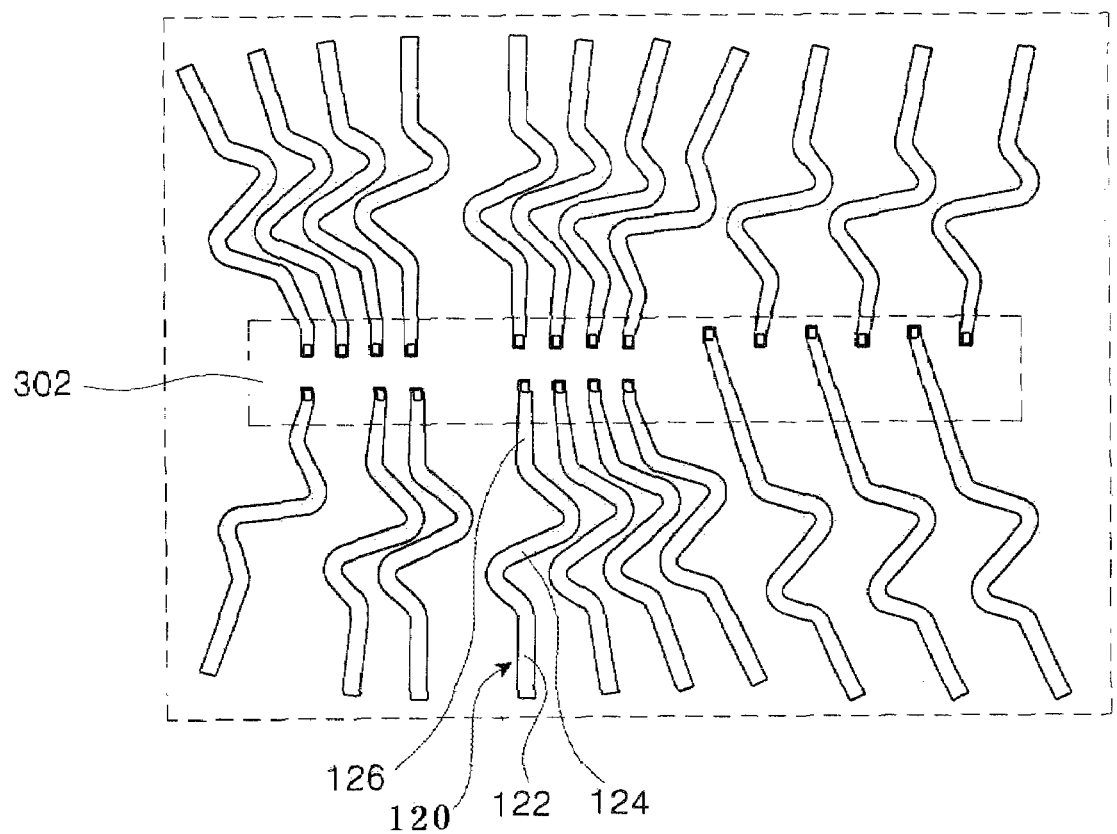
FIG. 35 is a plan view exemplifying another layout of electrical contact elements used to test an electronic device, according to the present invention.

Further, as can be readily seen from FIG. 35, since the third electrical contact element 120 having the beam portion of the zigzagged configuration is decreased in its width from the position of a bump 102 toward that of the tip portion 114, it is possible to easily conform to the recent trend toward a fine pitch in a highly integrated semiconductor device.

That is to say, because the width of the beam portion is decreased from the first part 122 toward the third part 126, as shown in FIG. 35, a plurality of electrical contact elements 120 can be radially arrayed adjoining one with another to be brought into contact with a pad 302 of a semiconductor device. In this way, it is possible to conform to the recent trend toward a fine pitch in a highly integrated electronic device.

Figure 29:
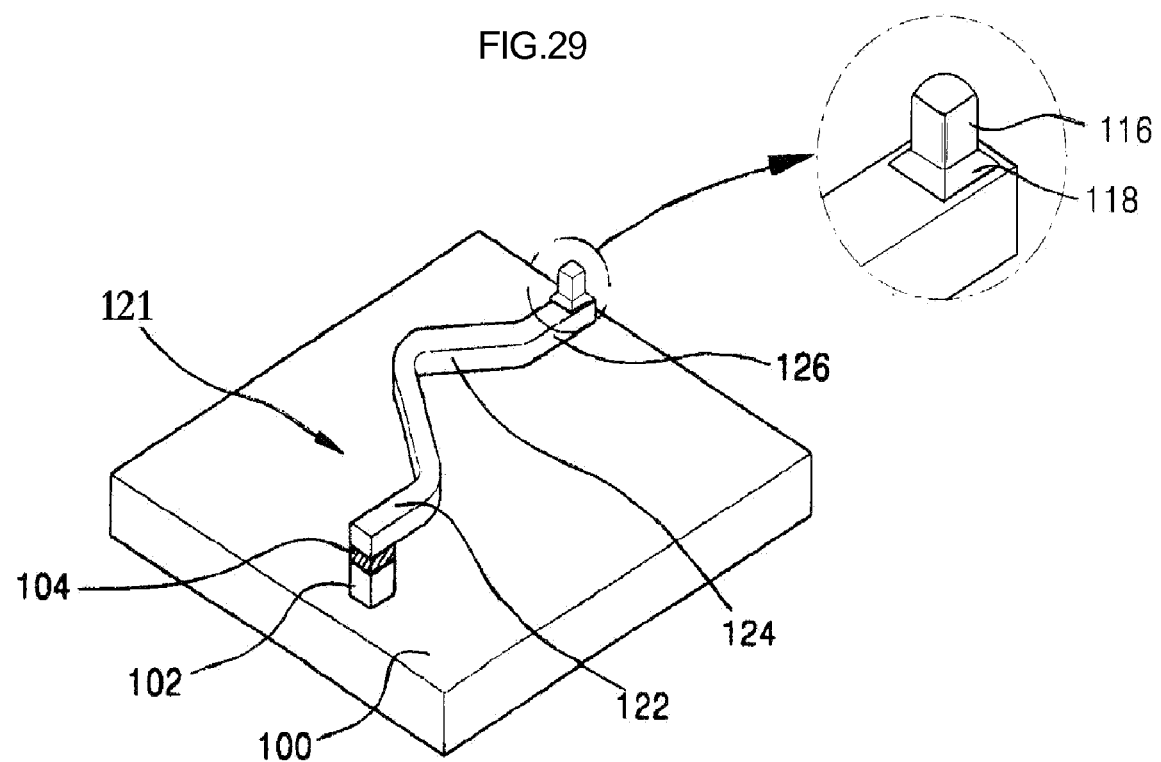
FIG. 29 is a perspective view illustrating a fourth electrical contact element manufactured by the method for manufacturing an electrical contact element used to test an electronic device, in accordance with the first embodiment of the present invention.

FIG. 29 is a perspective view illustrating a fourth electrical contact element manufactured by the method for manufacturing an electrical contact element used to test an electronic device, in accordance with the first embodiment of the present invention.

The fourth electrical contact element 121 according to the present invention is characterized in that the beam portion of the first electrical contact element 106 is replaced with a beam portion of a zigzagged configuration which has a first bar-shaped part 122, a second zigzagged part 124 connected with the first part 122, and a third bar-shaped part 126 connected with the second part 124. The fourth electrical contact element 121 is also characterized in that a tip portion 116 is provided on the third part 126 and has a proximal end around which a projection 118 is formed and a distal end of a column-shaped configuration with a distal end surface rounded.

Accordingly, the fourth electrical contact element 121 can simultaneously accomplish the working effects obtained by the tip portion 116 of the second electrical contact element 115 and working effects obtained by the beam portion of the third electrical contact element 120.

Hereinafter, a method for manufacturing the electrical contact element used to test an electronic device, in accordance with a second embodiment of the present invention will be described in detail.

FIGS. 12 through 18b are cross-sectional views explaining a method for manufacturing an electrical contact element used to test an electronic device, in accordance with a second embodiment of the present invention.

Figure 12:
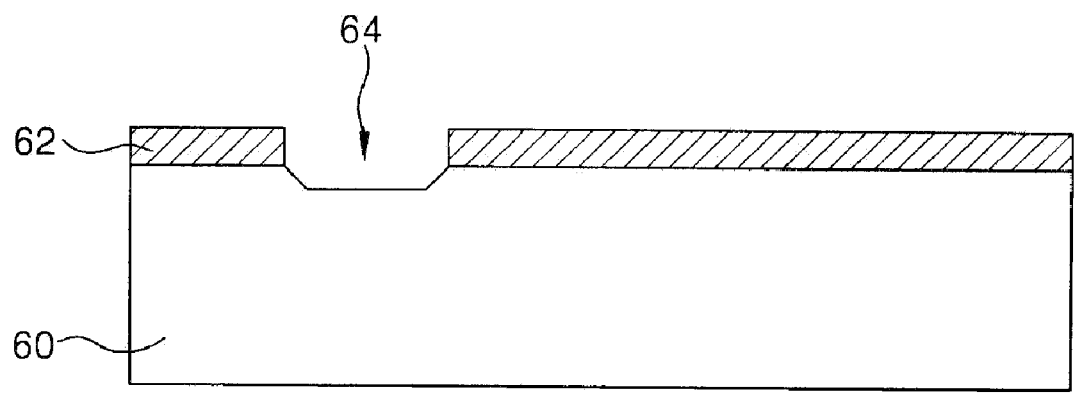
FIGS. 12 through 18b are cross-sectional views explaining a method for manufacturing an electrical contact element used to test an electronic device, in accordance with a second embodiment of the present invention.

In the method according to this embodiment of the present invention, first, as shown in FIG. 12, a first protective film of a predetermined thickness is formed on an entire surface of a sacrificial substrate 60 made of silicon having a fixed orientation such as (1 0 0). The first protective film comprises a thin film such as a photoresist and an oxide film. By implementing the same photolithographic process as in the aforementioned first embodiment, a first protective film pattern 62 having a second opened region (not numbered) larger than a first opened region of the first embodiment is defined.

Next, by implementing a first etching process using the first protective film pattern 62 as an etching mask, the sacrificial substrate 60 is anisotropically etched to define a trench 64 having a truncated configuration of a polygonal pyramid such as a quadrangular pyramid, or a truncated configuration of a cone. A side surface of the trench 64 is sloped by a predetermined angle.

At this time, a first etching process for isotropically etching the sacrificial substrate 60 comprises a wet etching process employing a chemical including potassium hydroxide (KOH), etc.

Figure 13:
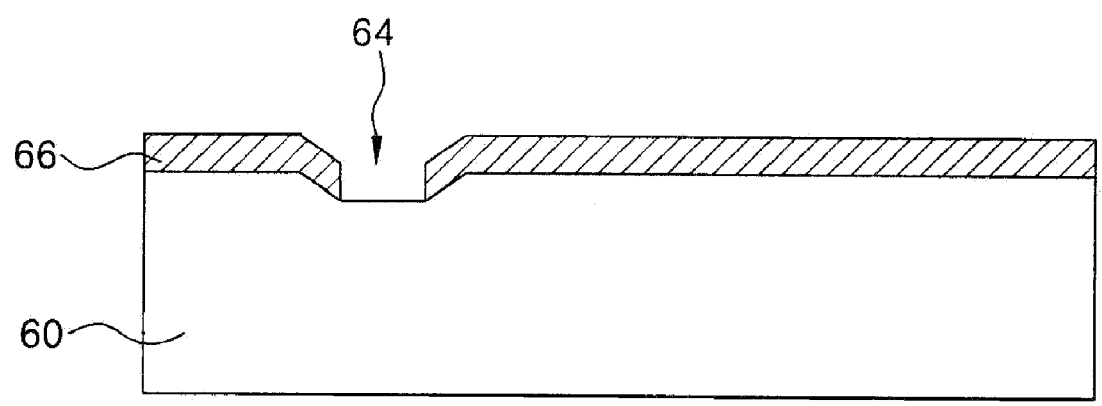

Then, as shown in FIG. 13, after the first protective film pattern 62 is removed, a second protective film of a predetermined thickness which comprises a thin film such as a photoresist, an oxide film, and the like, is formed on the entire surface of the sacrificial substrate 60. Thereupon, by implementing the same photolithographic process as in the case of forming the first protective film pattern 62, a second protective film pattern 66 is formed in a manner such that both side end parts of the trench 64 are closed and only a center part of the trench 64 is opened.

Figure 14A:
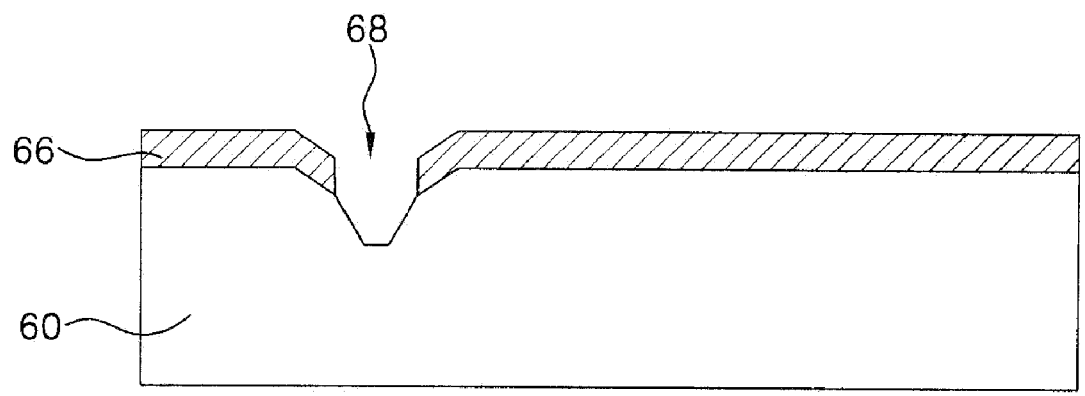

Thereafter, as shown in FIG. 14a, by implementing a second etching process using the second protective film pattern 66 as an etching mask, the trench 64 is further deepened.

At this time, the second etching process comprises a wet etching process employing a chemical in which potassium hydroxide (KOH) and deionized water are mixed at a predetermined ratio. When implementing the wet etching process employing the chemical, the trench 64 is anisotropically etched to define a trench 68 having a truncated polygonal pyramid-shaped or a truncated cone-shaped configuration so that the trench 68 is further deepened.

Figure 14B:
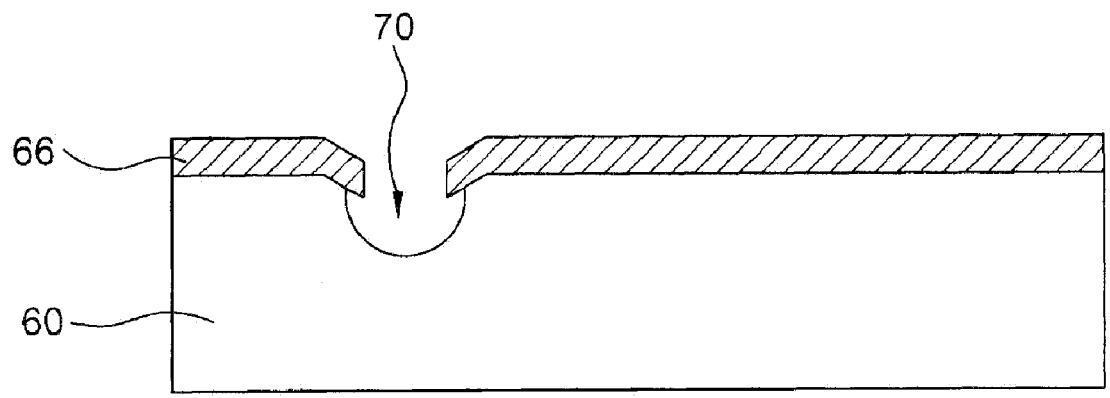

Further, as shown in FIG. 14b, the second etching process may comprise a wet etching process employing a chemical in which hydrogen fluoride (HF), nitric acid ($HNO_3$) and acetic acid ($CH_3COOH$) are mixed at a predetermined ratio. By the wet etching process employing the chemical, the trench 64 is isotropically etched to define a trench 70 having a configuration of a column with a bottom surface rounded.

At this time, the sacrificial substrate 60 is isotropically etched around an upper end of the second opened region and below the second protective film pattern 66.

Figure 15A:
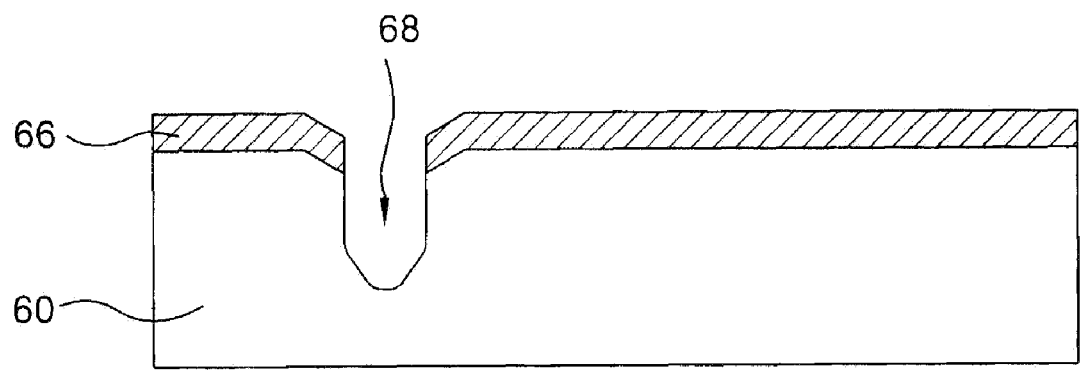

Next, as shown in FIG. 15a, the second protective film pattern 66 applied on the sacrificial substrate 60, which is defined with the trench 68 of the truncated pyramid-shaped configuration by the second etching process, is used as an etching mask. In this state, a third etching process is implemented again.

At this time, the third etching process comprises the same RIE process as in the first embodiment which is well known in the art. By implementing the third etching process, a depth of the trench 68 which is defined by the second etching process is further increased. It is to be noted that the third etching process may be implemented one or more times.

In particular, the bottom surface of the trench 68 having the truncated polygonal pyramid-shaped or the truncated cone-shaped configuration is rounded in the same manner as the first embodiment.

Figure 15B:
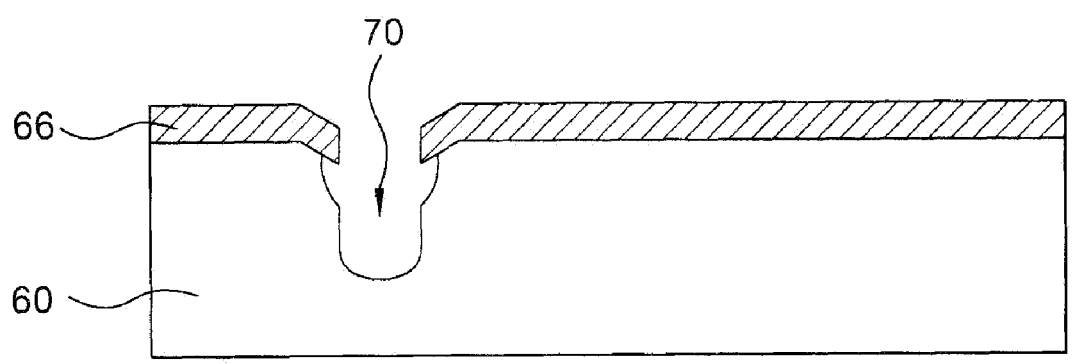

Also, as shown in FIG. 15b, the second protective film pattern 66 applied on the sacrificial substrate, which is defined with the trench 70 of the column-shaped configuration with the rounded bottom surface, by the second etching process, is used as an etching mask. In this state, a third etching process is implemented again.

At this time, the third etching process comprises the same RIE process as in the first embodiment, which is well known in the art. By implementing the third etching process, a depth of the trench 70 which is defined by the second etching process is further increased, whereby the column-shaped trench 70 having at a proximal end thereof a depression is defined.

Here, it is to be noted that the third etching process may be implemented one or more times.

Figure 16A:
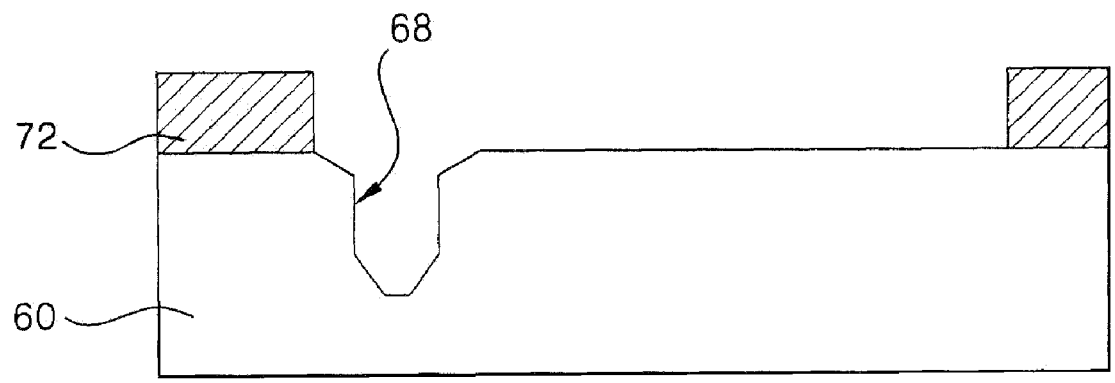
Figure 16B:
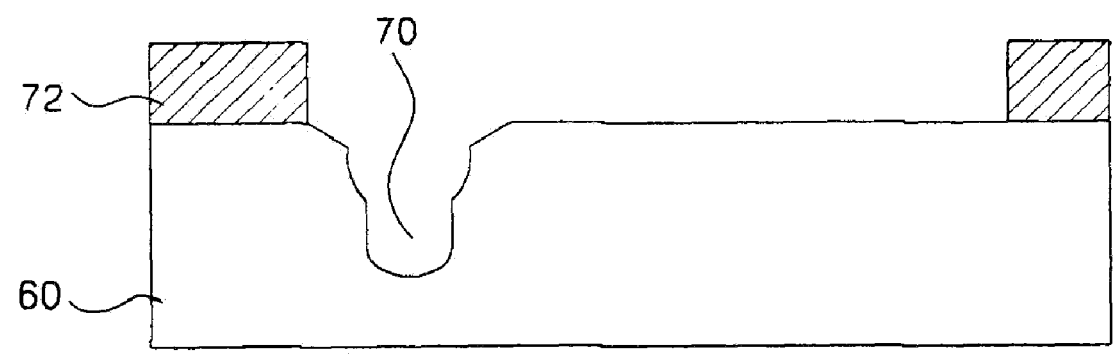

In succession, as shown in FIG. 16a, after the second protective film pattern 66 (see FIG. 15a) is removed, a third protective film pattern 72 which comprises a photoresist of a preset thickness and delimits a third opened region (not numbered) is formed on the entire surface of the sacrificial substrate 60 which is defined with the trench 68 of the truncated polygonal pyramid-shaped or the truncated cone-shaped configuration by the third etching process. Alternatively, as shown in FIG. 16b, after the second protective film pattern 66 (see FIG. 15b) is removed, a third protective film pattern 72 which comprises a photoresist of a preset thickness and delimits a third opened region (not numbered) is formed on the entire surface of the sacrificial substrate 60 which is defined with the trench 70 of the column-shaped configuration with the depression defined at the proximal end thereof, by the third etching process.

At this time, the third protective film pattern 72 can be formed by the same method used when forming the second protective film pattern 66. The third protective film patterns 72 are formed to delimit the third opened regions on the sacrificial substrate 60, in a manner such that the beam portions are formed in the third opened regions and the third opened regions are communicated with the trenches 68 and 70, respectively.

Figure 17A:
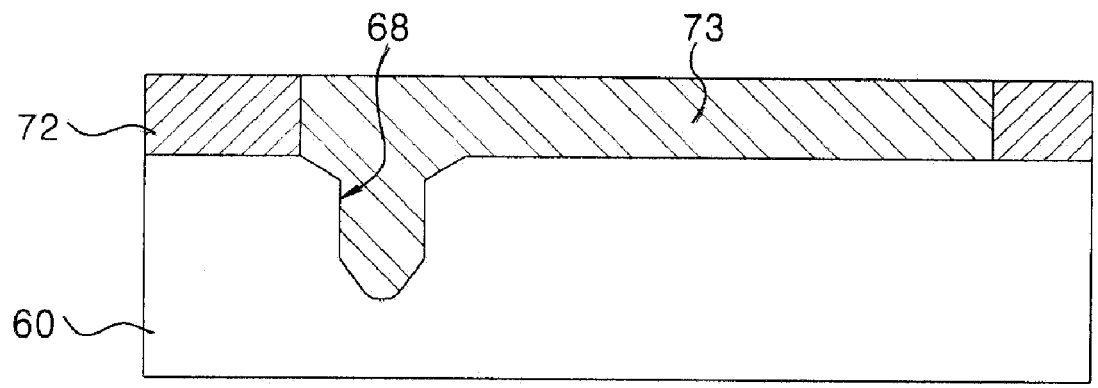
Figure 17B:
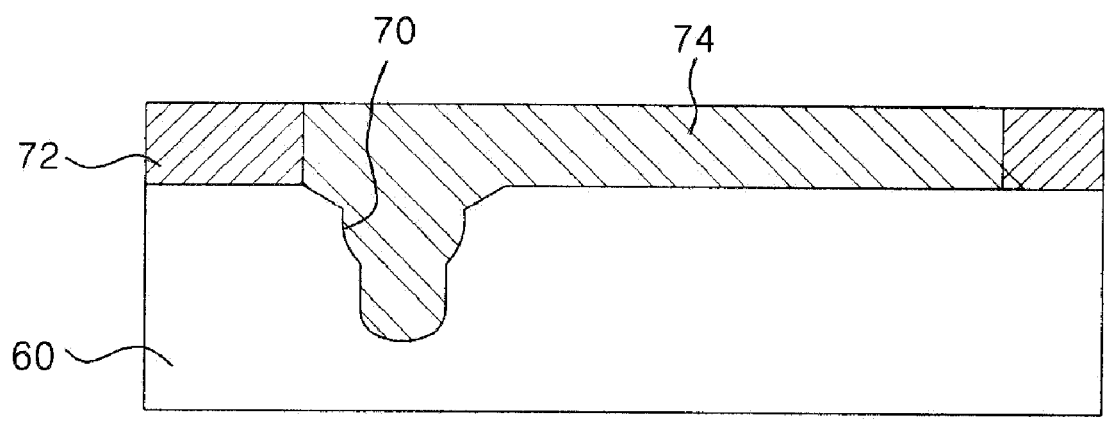

Thereafter, as shown in FIG. 17a, after a conductive material 73 is filled, in the amount of the preset thickness, into the third opened region delimited on the sacrificial substrate 60 by the third protective film pattern 72, through implementing a CVD, PVD or plating process, an upper surface of a resultant product is flattened. Alternatively, as shown in FIG. 17b, after a conductive material 74 is filled, in the amount of the preset thickness, into the third opened region delimited on the sacrificial substrate 60 by the third protective film pattern 72, through implementing a CVD, PVD or plating process, an upper surface of a resultant product is flattened.

At this time, the conductive material is made of nickel alloy, etc., and the upper surfaces of resultant products which are formed by the conductive materials 73 and 74 can be flattened by chemical mechanical polishing (CMP), etch-back, grinding, etc.

Figure 18A:
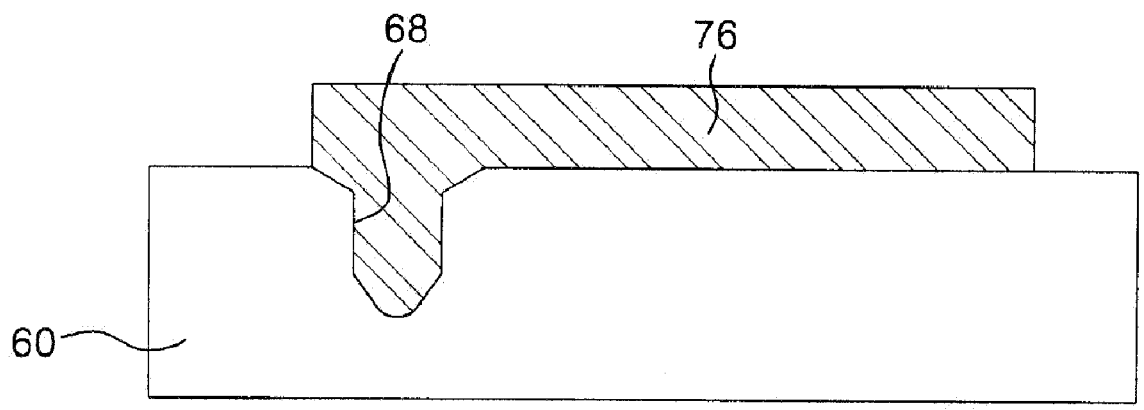
Figure 18B:
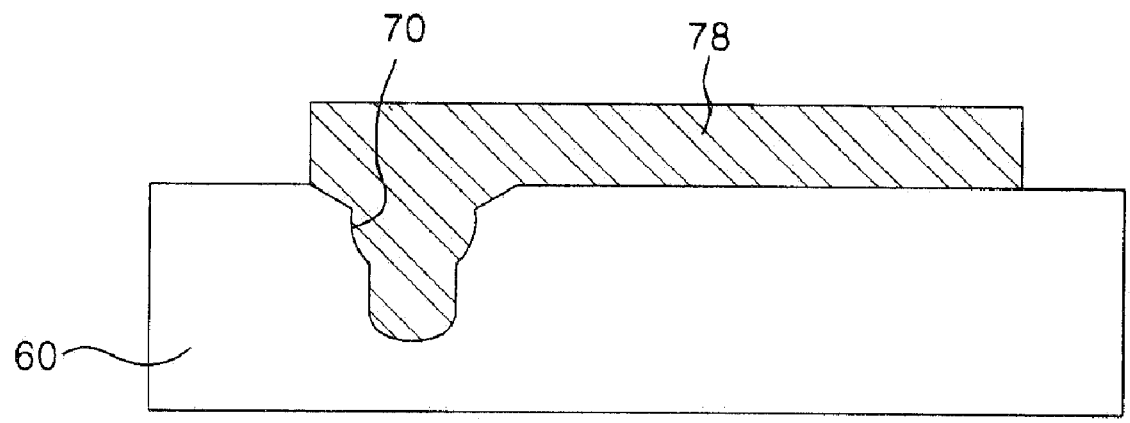

In succession, as shown in FIG. 18a, as the third protective film pattern 72 is removed from the upper surface of the sacrificial substrate 60 having undergone the flattening process, the beam portion 76 is formed in a manner such that it is connected with the tip portion. Alternatively, as shown in FIG. 18b, as the third protective film pattern 72 is removed from the upper surface of the sacrificial substrate 60 having undergone the flattening process, the beam portion 78 is formed in a manner such that it is connected with the tip portion.

At this time, the third protective film pattern 72 can be removed by implementing a wet etching process employing a chemical or a dry etching process such as ashing, and the like.

In the same manner as the first embodiment, each of the beam portions 76 and 78 has a multi-stepped configuration which comprises a first bar-shaped part connected with each of the tip portions formed in the trenches 68 and 70, a second bar-shaped part having a width greater than the first part, and a third bar-shaped part having a width greater than the second part. Selectively, each of the beam portions 76 and 78 may have a zigzagged configuration which comprises a first bar-shaped part connected with each of the tip portions formed in the trenches 68 and 70, a second zigzagged part, and a third bar-shaped part.

Also, as in the first embodiment, a process is implemented to connect the beam portions 76 and 78 formed on the sacrificial substrate 60, with an electronic component having realized thereon a desired circuit pattern, by the medium of a bump and through bonding. Then, by removing the sacrificial substrate 60 by wet etching, etc., the electrical contact element used to test an electronic device is completed.

Hereafter, the electrical contact element manufactured by the method for manufacturing an electrical contact element used to test an electronic device in accordance with the second embodiment of the present invention will be described in detail.

Figure 30:
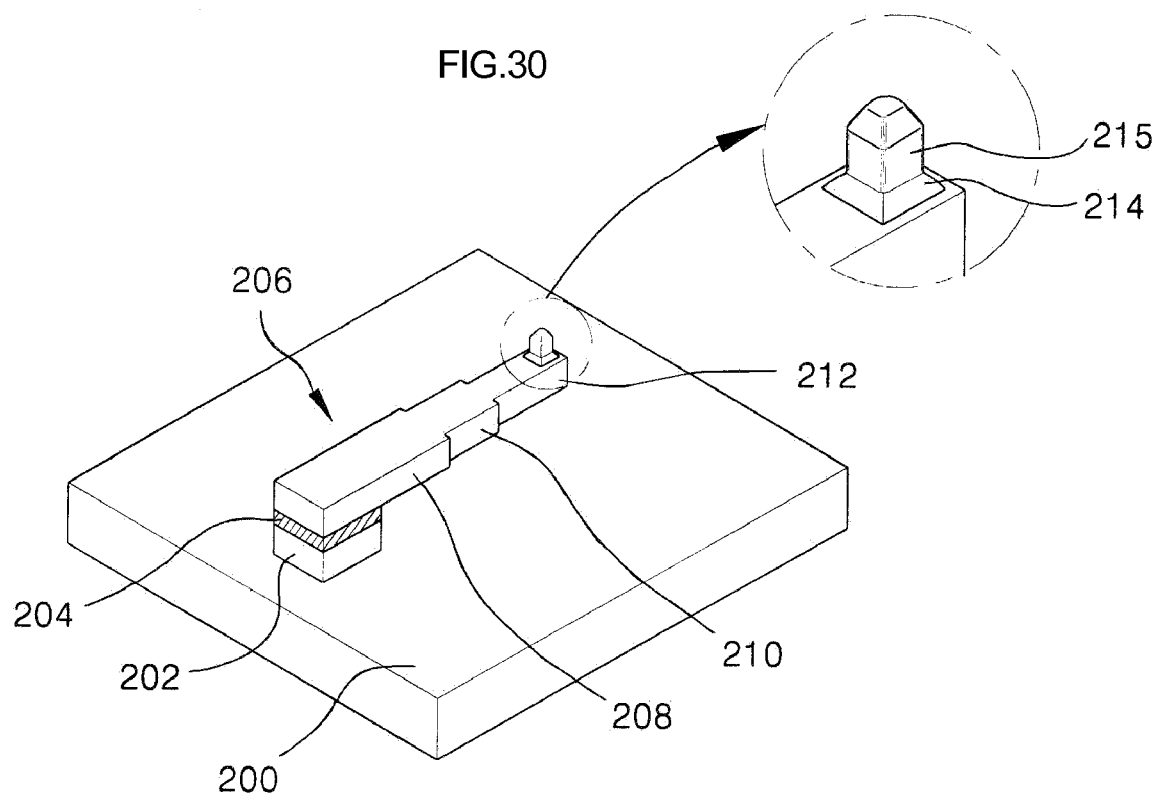
FIG. 30 is a perspective view illustrating a fifth electrical contact element manufactured by the method for manufacturing an electrical contact element used to test an electronic device, in accordance with the second embodiment of the present invention.

FIG. 30 is a perspective view illustrating a fifth electrical contact element manufactured by the method for manufacturing an electrical contact element used to test an electronic device, in accordance with the second embodiment of the present invention.

In the fifth electrical contact element 206 used to test an electronic device, according to the present invention, in the same manner as the first electrical contact element 106, as shown in FIG. 30, a terminal (not numbered) of an electronic component 200 such as a printed circuit board (PCB) having realized thereon a predetermined circuit pattern, and the electrical contact element 206 are connected with each other by the medium of a bump 202 and by virtue of a bonding portion 204.

At this time, the electrical contact element 206 has a beam portion of a multi-stepped configuration which comprises a first bar-shaped part 212, a second bar-shaped part 210 connected with the first part 212 and having a width greater than the first part 212, and a third bar-shaped part 208 connected with the second part 210 and having a width greater than the second part 210.

In particular, as can be readily seen from FIG. 30, the fifth electrical contact element 206 according to the present invention is characterized in that a tip portion 215 is integrally provided on a free end of the third part 121 of the beam portion to be brought into contact with a pad of a semiconductor chip by constant physical force, and the tip portion 215 has a proximal end around which a projection 214 is formed and a distal end of a quadrangular column-shaped configuration with a distal end surface rounded.

At this time, a length of the tip portion 212 is extended to 30 μm~500 μm in consideration of an OD characteristic. In this preferred embodiment, the tip portion 212 has a length of 100 μm.

Accordingly, in addition to the working effects obtained by the first electrical contact element, in the fifth electrical contact element 206, when the electrical contact element 206 is brought into contact with the pad of the semiconductor chip by constant physical force, due to the presence of the projection 214, it is possible to disperse stress applied to the proximal end of the tip portion 215 and the tip portion 215 is prevented from being broken.

Figure 31:
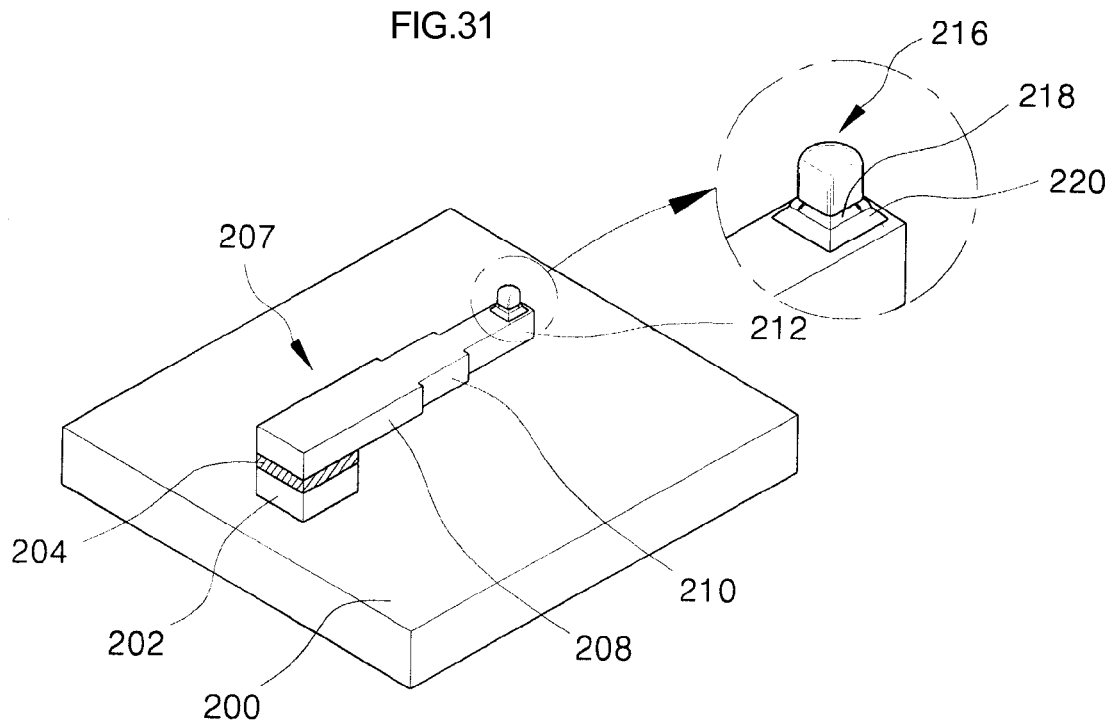
FIG. 31 is a perspective view illustrating a sixth electrical contact element manufactured by the method for manufacturing an electrical contact element used to test an electronic device, in accordance with the second embodiment of the present invention.

FIG. 31 is a perspective view illustrating a sixth electrical contact element manufactured by the method for manufacturing an electrical contact element used to test an electronic device, in accordance with the second embodiment of the present invention.

The sixth electrical contact element 207 according to the present invention is characterized in that the tip portion 215 of the aforementioned fifth electrical contact element 206 is replaced with a tip portion 216 in which a first projection is formed around a proximal end, a second projection connected with the first projection 220 and having a sectional area smaller than the first projection 220 is formed at a middle part of the tip portion 216, and a distal end connected with the second projection 218 and having a section smaller than the second projection 218 has a column-shaped configuration with a distal end surface rounded.

Accordingly, in the sixth electrical contact element 207, due to the presence of the first and second projections 220 and 218, when the electrical contact element 207 is brought into contact with a pad of a semiconductor chip by constant physical force, it is possible to more effectively disperse stress applied to the proximal end of the tip portion 216 and thereby the tip portion 216 is prevented from being broken.

Figure 32:
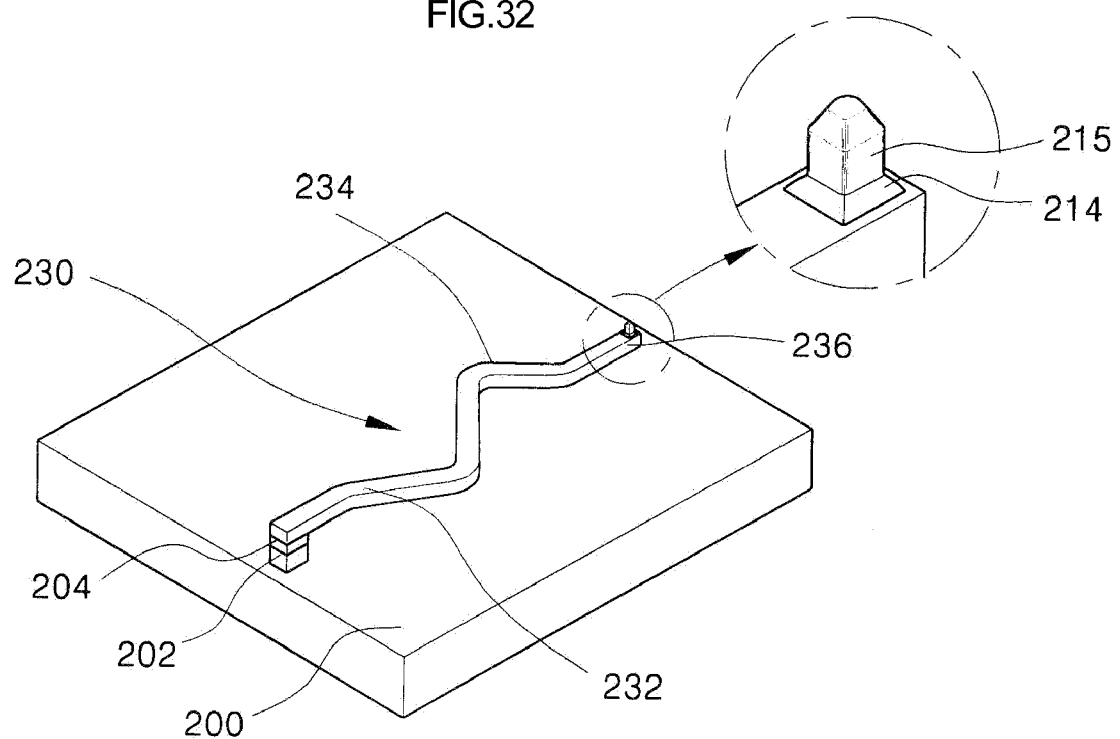
FIG. 32 is a perspective view illustrating a seventh electrical contact element manufactured by the method for manufacturing an electrical contact element used to test an electronic device, in accordance with the second embodiment of the present invention.

FIG. 32 is a perspective view illustrating a seventh electrical contact element manufactured by the method for manufacturing an electrical contact element used to test an electronic device, in accordance with the second embodiment of the present invention.

The seventh electrical contact element 230 according to the present invention is characterized in that the beam portion of the aforementioned fifth electrical contact element 206 is replaced with a beam portion of a zigzagged configuration which has a first bar-shaped part 232, a second zigzagged part 234 connected with the first part 232, and a third bar-shaped part 236 connected with the second part 234.

Accordingly, due to the fact that the seventh electrical contact element 230 is formed to have the zigzagged configuration, in addition to the working effects obtained by the fifth electrical contact element 206, when the tip portion is brought into contact with the pad of the semiconductor chip by constant physical force, it is possible to disperse stress applied to the beam portion and the tip portion is prevented from being broken.

Figure 33:
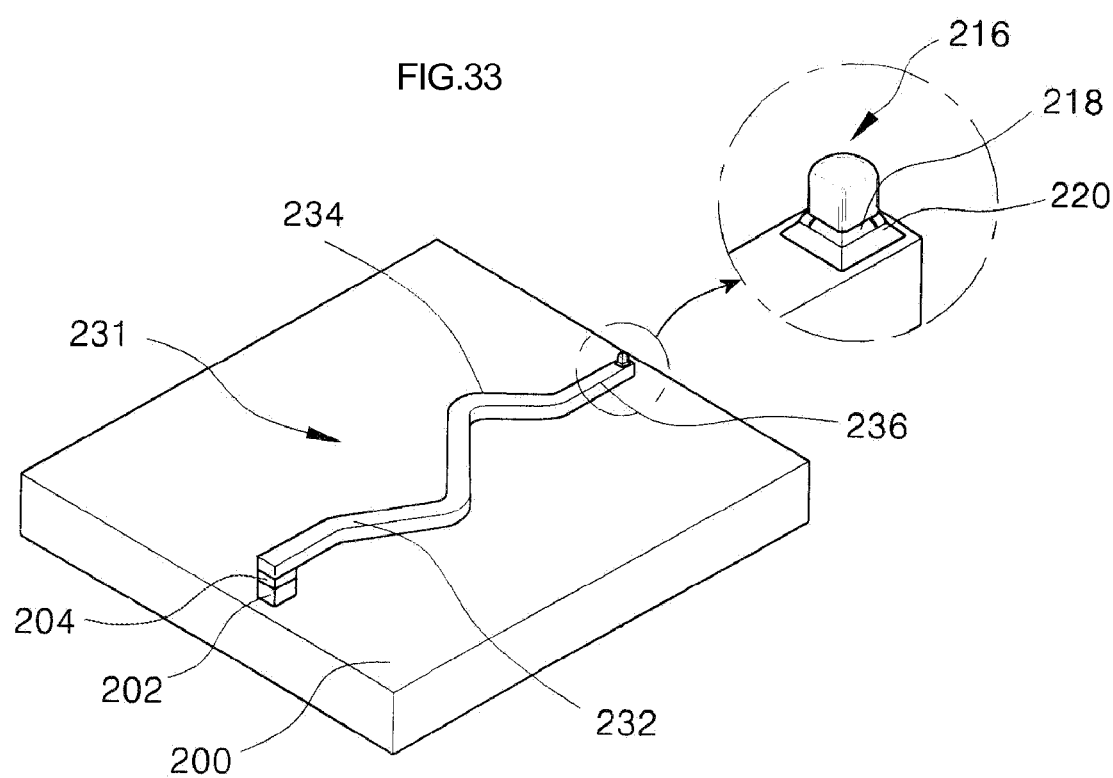
FIG. 33 is a perspective view illustrating an eighth electrical contact element manufactured by the method for manufacturing an electrical contact element used to test an electronic device, in accordance with the second embodiment of the present invention.

FIG. 33 is a perspective view illustrating an eighth electrical contact element manufactured by the method for manufacturing an electrical contact element used to test an electronic device, in accordance with the second embodiment of the present invention.

The seventh electrical contact element 230 according to the present invention is characterized in that the beam portion of the aforementioned fifth electrical contact element 206 is replaced with a beam portion of a zigzagged configuration which has a first bar-shaped part 232, a second zigzagged part 234 connected with the first part 232, and a third bar-shaped part 236 connected with the second part 234, and the tip portion 215 of the aforementioned fifth electrical contact element 206 is replaced with a tip portion 216 in which a first projection is formed around a proximal end, a second projection connected with the first projection 220 and having a sectional area smaller than the first projection 220 is formed at a middle part of the tip portion 216, and a distal end connected with the second projection 218 and having a section smaller than the second projection 218 has a column-shaped configuration with a distal end surface rounded.

Accordingly, by the eighth electrical contact element 231, it is possible to simultaneously accomplish the working effects obtained by the tip portion 216 of the sixth electrical contact element 207 and the working effects obtained by the beam portion of the seventh electrical contact element 234.

FIGS. 19 through 25b are cross-sectional views explaining a method for manufacturing an electrical contact element used to test an electronic device, in accordance with a third embodiment of the present invention.

Figure 19:
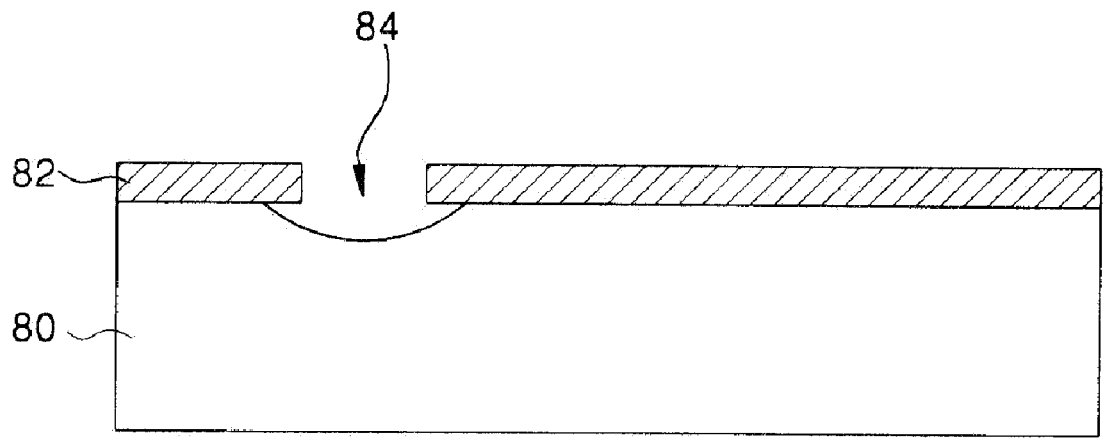
FIGS. 19 through 25b are cross-sectional views explaining a method for manufacturing an electrical contact element used to test an electronic device, in accordance with a third embodiment of the present invention.

In the method according to this embodiment of the present invention, first, as shown in FIG. 19, a first protective film of a predetermined thickness is formed on an entire surface of a sacrificial substrate 80 made of silicon having a fixed orientation such as (1 0 0). The first protective film comprises a thin film such as a photoresist and an oxide film. By implementing the same photolithographic process as in the aforementioned first embodiment, a first protective film pattern 82 having a second opened region (not numbered) larger than the first opened region of the first embodiment is defined.

Next, by implementing a first etching process using the first protective film pattern 82 as an etching mask, the sacrificial substrate 80 is isotropically etched to define a trench 84 having a configuration of a quadrangular well in which a tip portion is to be formed.

At this time, a first etching process comprises a wet etching process employing a chemical in which hydrogen fluoride (HF) nitric acid ($HNO_3$) and acetic acid ($CH_3COOH$) are mixed at a predetermined ratio.

Figure 20:
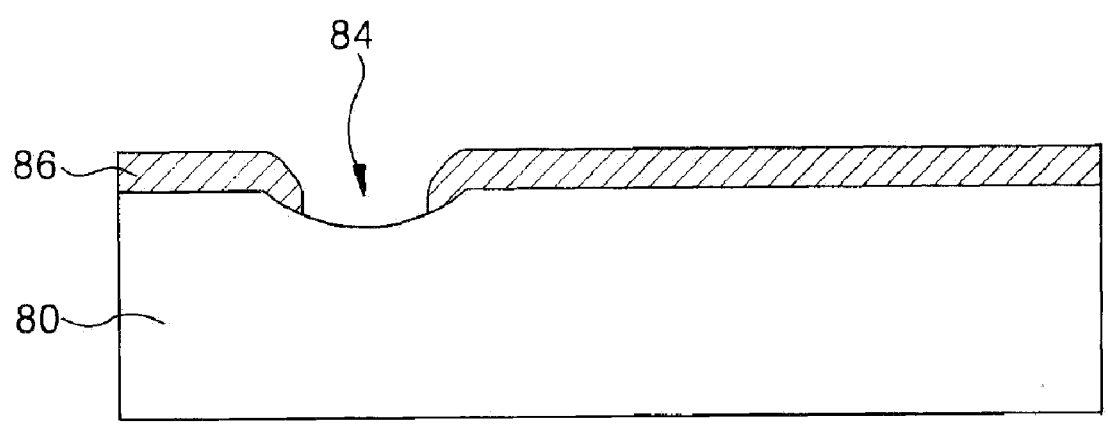

Then, as shown in FIG. 20, after the first protective film pattern 82 is removed, a second protective film of a predetermined thickness, which comprises a thin film such as a photoresist, an oxide film, and the like, is formed on the entire surface of the sacrificial substrate 80. Thereupon, by implementing the same photolithographic process as in the case of forming the first protective film pattern 82, a second protective film pattern 86 is formed in a manner such that both side end parts of the trench 84 are closed and only a center part of the trench 84 is opened.

Figure 21A:
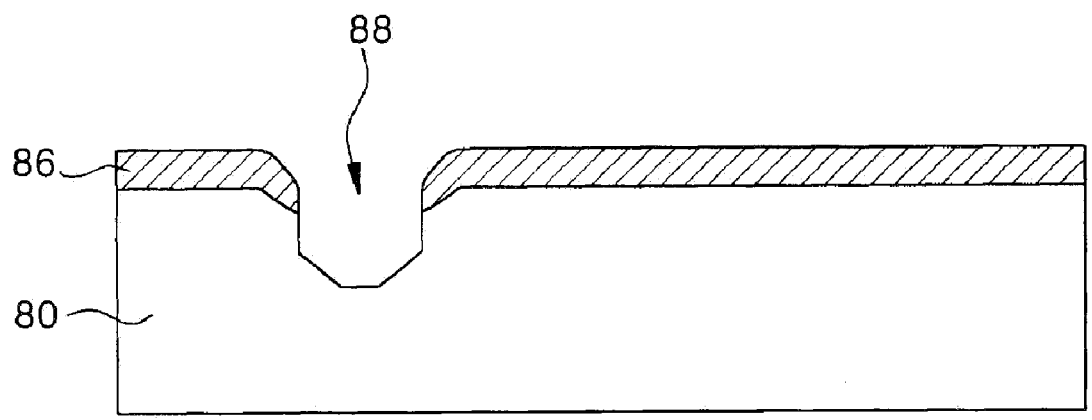

Thereafter, as shown in FIG. 21a, by implementing a second etching process using the second protective film pattern 86 as an etching mask, the trench 84 is made further deepened.

At this time, the second etching process comprises a wet etching process employing a chemical in which potassium hydroxide (KOH) and deionized water are mixed at a predetermined ratio. By implementing the wet etching process employing the chemical, the trench 84 is anisotropically etched to define a trench 88 having a truncated polygonal pyramid-shaped or a truncated cone-shaped configuration so that the trench 84 is made further deepened.

Figure 21B:
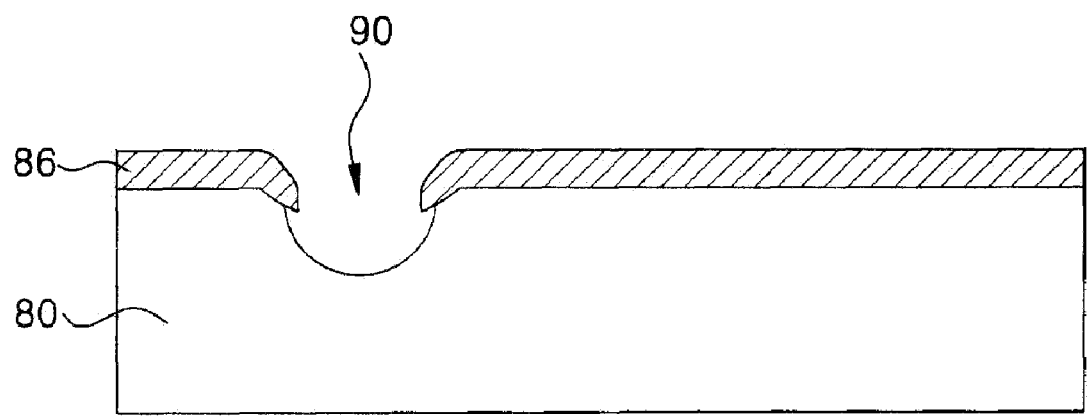

Further, as shown in FIG. 21b, the second etching process may comprise a wet etching process employing a chemical in which hydrogen fluoride (HF), nitric acid ($HNO_3$) and acetic acid ($CH_3COOH$) are mixed at a predetermined ratio. By implementing the wet etching process employing the chemical, the trench 84 is isotropically etched to define a trench 90 of a column-shaped configuration with a proximal end depressed and a bottom surface rounded.

At this time, the sacrificial substrate 80 is isotropically etched around an upper end of the second opened region and below the second protective film pattern 86.

Figure 22A:
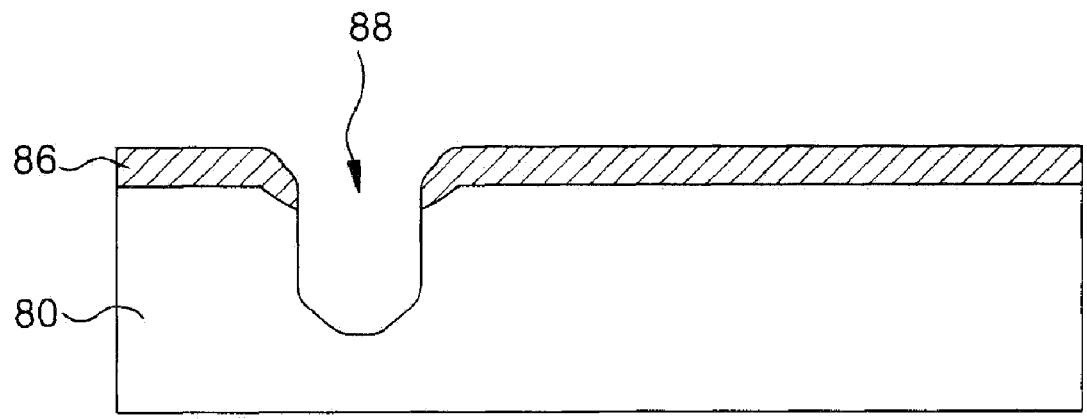

Next, as shown in FIG. 22a, the second protective film pattern 86 applied on the sacrificial substrate 80, which is defined with the trench 88 of the truncated pyramid-shaped configuration by the second etching process, is used as an etching mask. In this state, a third etching process is implemented again.

At this time, the third etching process comprises the same RIE process as in the first embodiment which is well known in the art. By implementing the third etching process, a depth of the trench 88 which is defined by the second etching process is further increased and a bottom surface of the trench 88 is rounded.

Here, it is to be noted that the third etching process may be implemented one or more times.

Figure 22B:
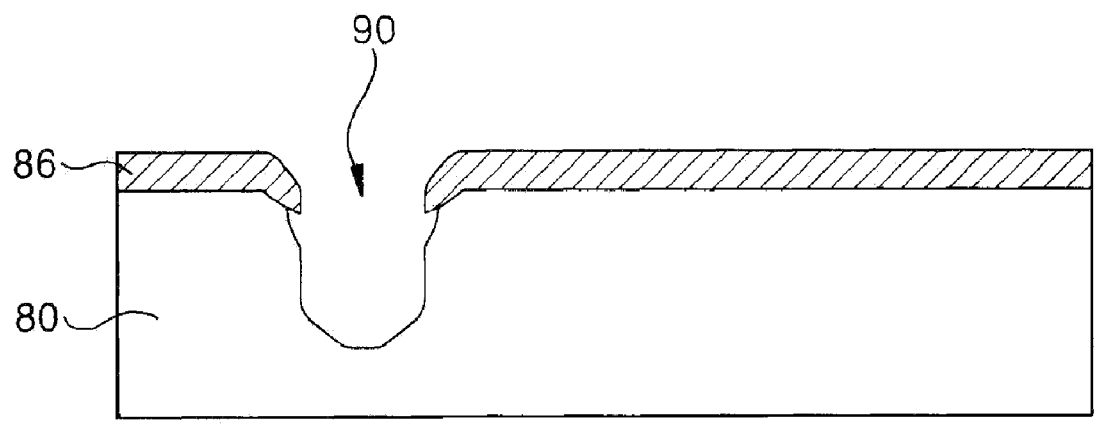

Also, as shown in FIG. 22b, the second protective film pattern 86 applied on the sacrificial substrate, which is defined with the trench 90 of the column-shaped configuration by implementing the second etching process, is used as an etching mask. In this state, a third etching process is again implemented.

At this time, the third etching process comprises the same RIE process as in the first embodiment which is well known in the art. By implementing the third etching process, a depth of the trench 90 which is defined by the second etching process is further increased, whereby the column-shaped trench 90 having the proximal end depressed is defined. It is to be noted that the third etching process may be implemented one or more times.

Figure 23A:
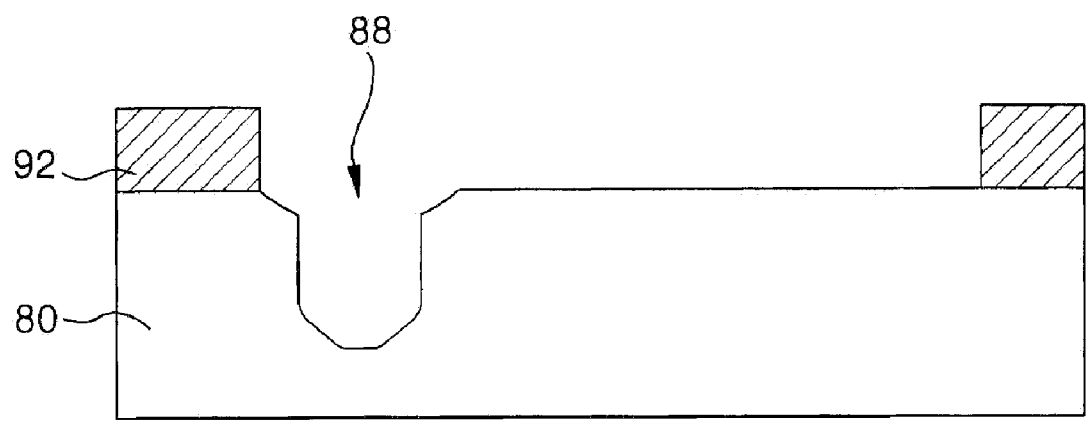
Figure 23B:
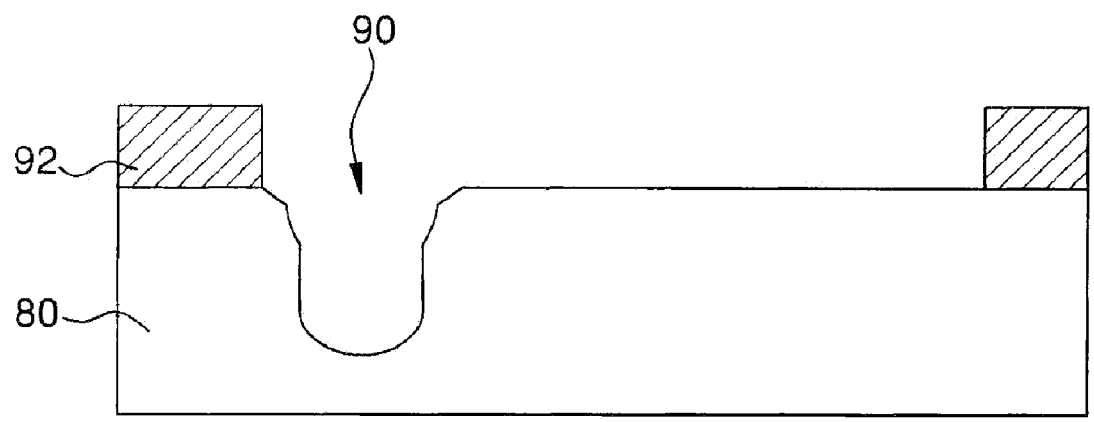

In succession, as shown in FIG. 23a, after the second protective pattern 86 is removed, a third protective film pattern 92, which comprises a photoresist of a predetermined thickness and delimits a third opened region (not numbered), is formed on the entire surface of the sacrificial substrate 80 which is defined with the trench 88 of the truncated polygonal pyramid-shaped or the truncated cone-shaped configuration. Alternatively, as shown in FIG. 23b, after the second protective film pattern 86 is removed, a third protective film pattern 92 which comprises a photoresist of a predetermined thickness and delimits a third opened region (not numbered) is formed on the entire surface of the sacrificial substrate 80 which is defined with the trench 90 of the column-shaped configuration with proximal end depressed.

At this time, the third protective film patterns 92 are formed to delimit the third opened regions on the sacrificial substrate 80, in a manner such that the beam portions are formed in the third opened regions and the third opened regions are communicated with the trenches 88 and 90, respectively.

Figure 24A:
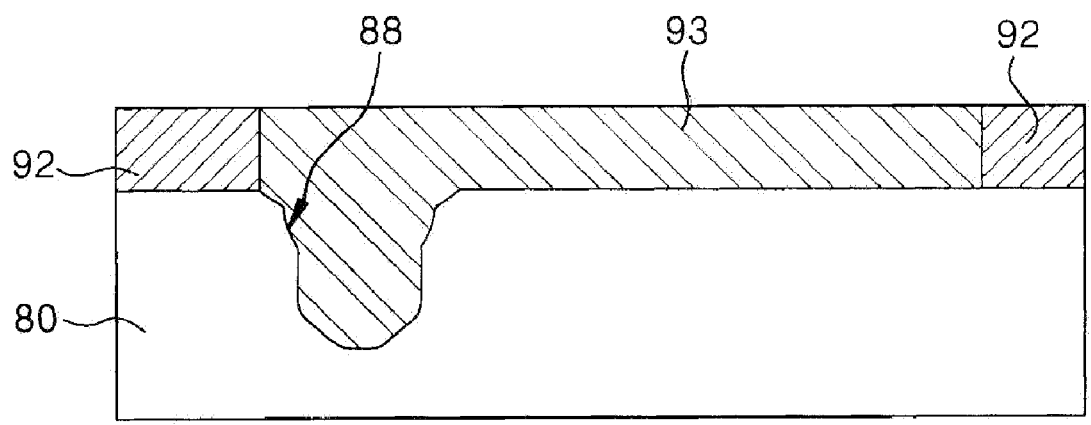
Figure 24B:
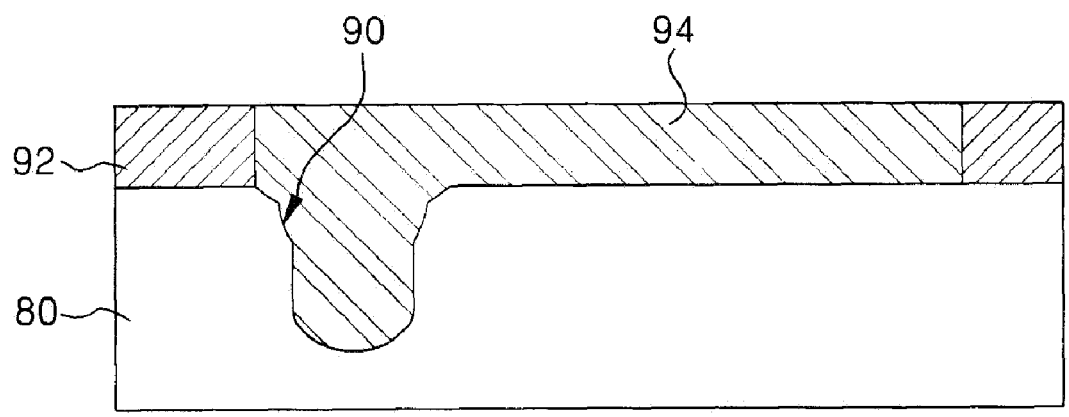

Thereafter, as shown in FIG. 24a, after a conductive material 93 is filled, in the amount of the predetermined thickness, into the third opened region delimited on the sacrificial substrate 80 by the third protective film pattern 92, through implementing a CVD, PVD or plating process, an upper surface of a resultant product is flattened. Alternatively, as shown in FIG. 24b, after a conductive material 94 is filled, in the amount of the predetermined thickness, into the third opened region delimited on the sacrificial substrate 80 by the third protective film pattern 92, through implementing a CVD, PVD or plating process, an upper surface of a resultant product is flattened.

At this time, the conductive materials 93 and 94 are made of nickel alloy, etc., and the upper surfaces of resultant products which are formed by the conductive materials 93 and 94 can be flattened by CMP, etchback, grinding, etc.

Figure 25A:
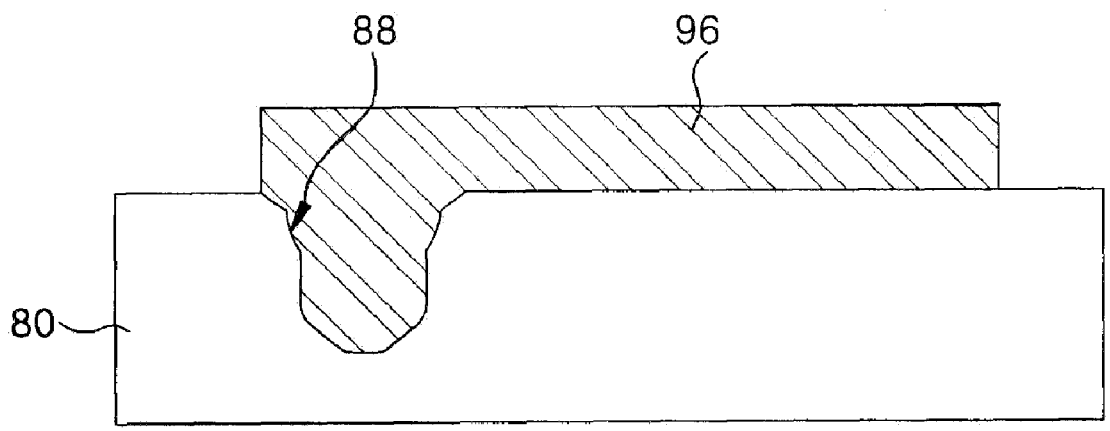
Figure 25B:
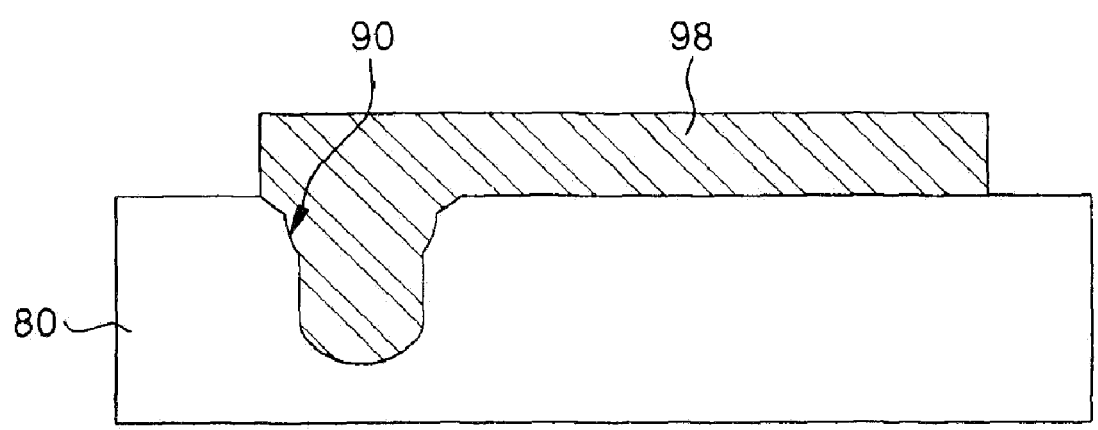

In succession, as shown in FIG. 25a, as the third protective film pattern 92 is removed from the upper surface of the sacrificial substrate 80 having undergone the flattening process, a beam portion 96 is formed in a manner such that it is connected with a tip portion having continuously formed around the proximal end thereof two projections. Alternatively, as shown in FIG. 25b, as the third protective film pattern 92 is removed from the upper surface of the sacrificial substrate 80 having undergone the flattening process, the beam portion 98 is formed in a manner such that it is connected with the tip portion having two projections.

At this time, the third protective film pattern 92 can be removed by implementing a wet etching process employing a chemical or a dry etching process such as ashing, and the like.

In the same manner as the first embodiment, each of the beam portions 96 and 98 has a multi-stepped configuration which comprises a first bar-shaped part connected with each of the tip portions formed in the trenches 88 and 90, a second bar-shaped part having a width greater than the first part, and a third bar-shaped part having a width greater than the second part. Selectively, each of the beam portions 96 and 98 may have a zigzagged configuration which comprises a first bar-shaped part connected with each of the tip portions formed in the trenches 88 and 90, a second zigzagged part, and a third bar-shaped part.

Also, as in the aforementioned first embodiment, a process is implemented to connect the beam portions 96 and 98 formed on the sacrificial substrate 80 with an electronic component having realized thereon a desired circuit pattern, by the medium of a bump and through bonding. Then, by removing the sacrificial substrate 80 by wet etching, etc., the electrical contact element used to test an electronic device is completed.

Figure 38A:
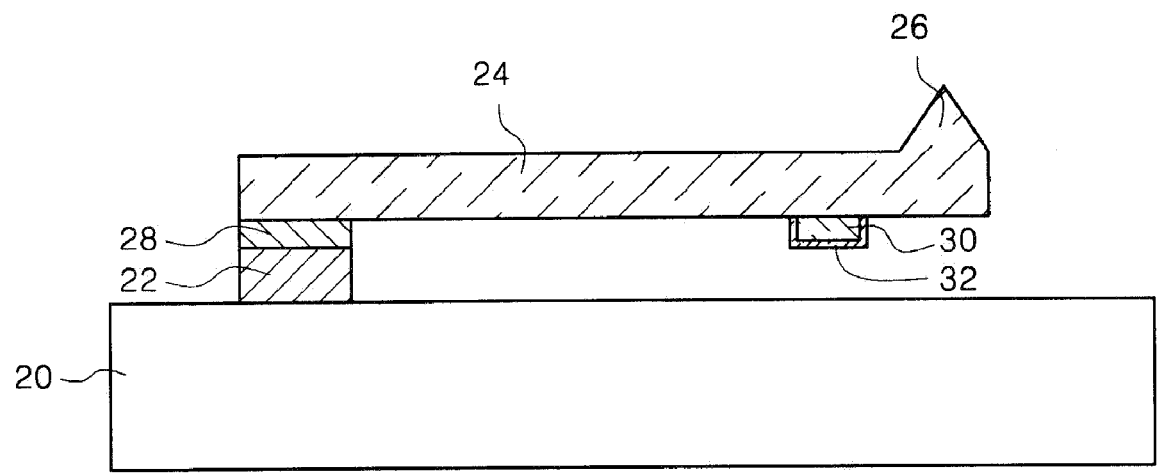
FIGS. 38a and 38b are a cross-sectional view and a perspective view illustrating an electrical contact element used to test an electronic device, in accordance with a fourth embodiment of the present invention.
Figure 38B:
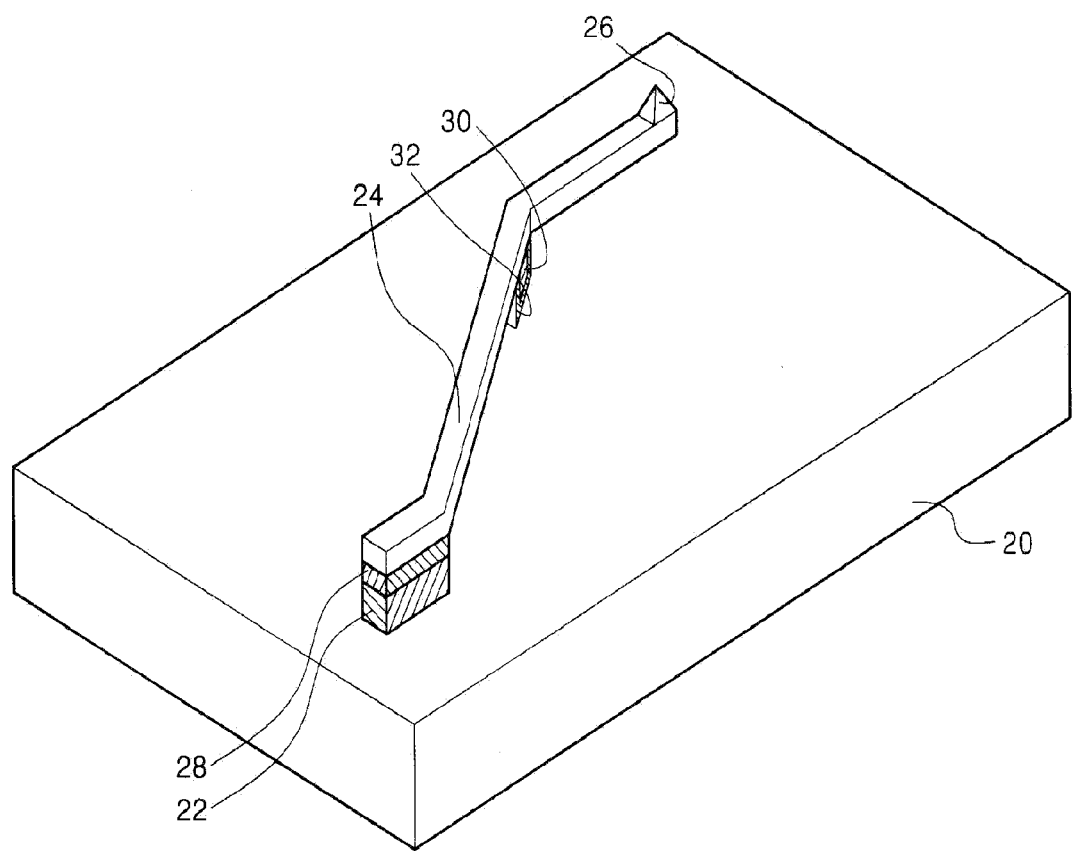

FIGS. 38a and 38b are a cross-sectional view and a perspective view illustrating an electrical contact element used to test an electronic device, in accordance with a fourth embodiment of the present invention.

In the electrical contact element according to this embodiment of the present invention, as shown in FIGS. 38a and 38b, a terminal of an electronic component 20 such as a PCB having realized thereon a predetermined circuit pattern, and a post portion 22 comprising a bump of a predetermined size, etc. are connected with each other. A beam portion 24 which is formed at an end thereof with a tip portion 26 is connected with the post portion 22 by soldering, brazing, plating, a conductive adhesive, etc.

At this time, the beam portion 24 has a zigzagged configuration having at least one zigzagged part. An armrest 30 according to the present invention is provided on a surface of the zigzagged part of the beam portion 24 which surface is farthest from the tip portion 26, in a manner such that the armrest 30 is positioned adjacent to the tip portion 26 in a horizontal direction.

Further, in order to prevent static electricity from being produced due to contact between the armrest 30 and the electronic component 20, an insulating coating layer 32 made of polyimide, parylene, and so forth, is further applied to an outer surface of the armrest 30.

Hereinbelow, beam portions of an electrical contact element used to test an electronic component, according to the present invention, will be described in detail with reference to FIGS. 41(a) through 41(f).

Figure 41:
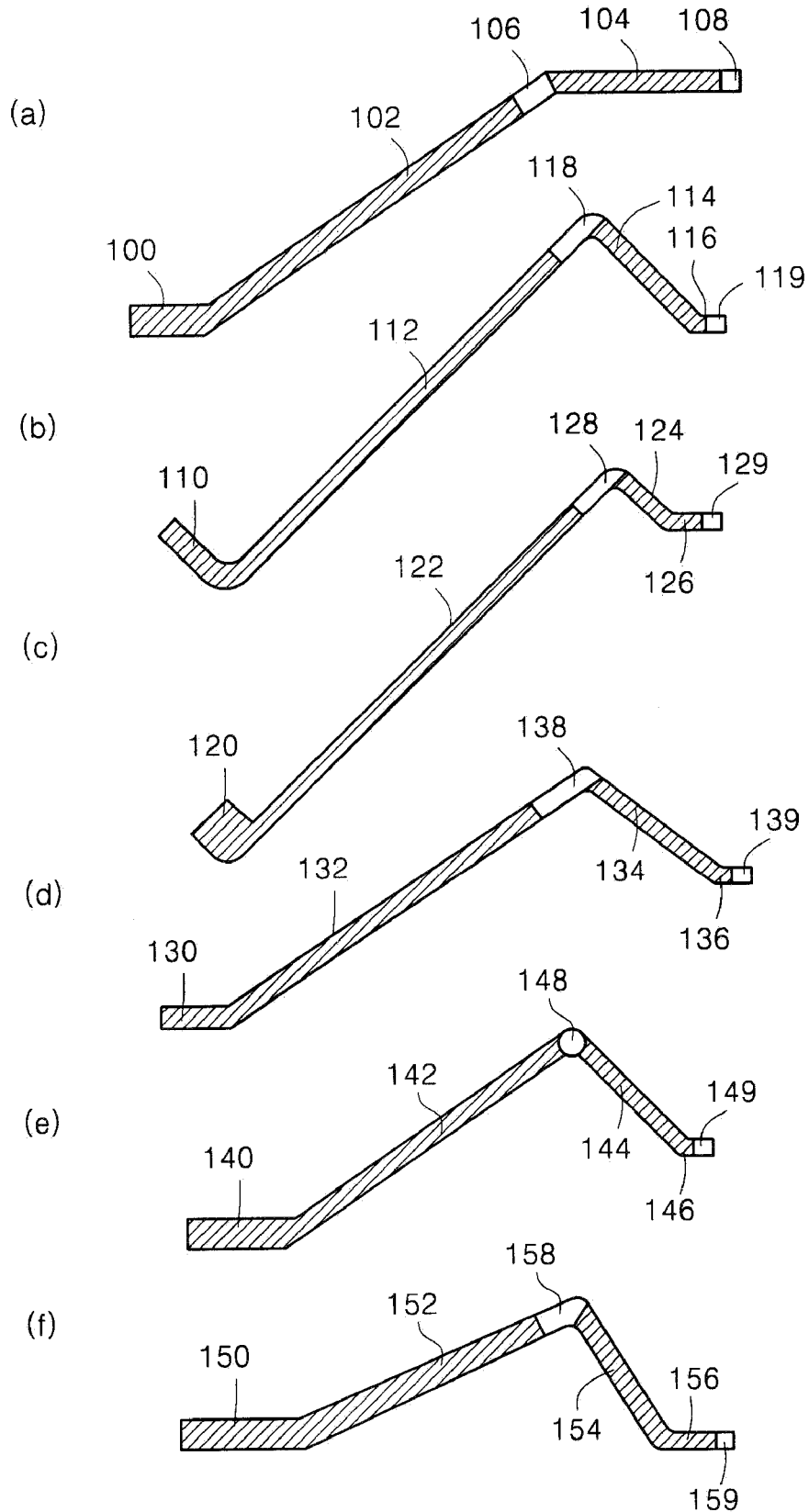
FIGS. 41(a) through 41(f) are transverse cross-sectional views illustrating beam portions of the electrical contact elements shown in FIGS. 38a through 40b.

As shown in FIG. 41(a), the beam portion 24 of the electrical contact element according to the present invention has a zigzagged configuration in that a first bar-shaped part 100 of a predetermined length, a second part 102 and a third part 104 are bent at a preset angle to form two bent segments.

At this time, an armrest 106 is provided on a surface of the beam portion between the second and third parts 102 and 104 adjacent to a bending point, and a tip portion 108 is formed at a free end of the third part 104.

Further, as shown in FIGS. 41(b) through 41(f), the beam parts 24 of the electrical contact elements according to the present invention may have zigzagged configurations in that bar-shaped first parts 110, 120, 130, 140 and 150, second parts 112, 122, 132, 142 and 152, third parts 114, 124, 134, 144 and 154, and fourth parts 116, 126, 136, 146 and 156 are bent at predetermined angles to form three bent segments.

At this time, armrests 118, 128, 138, 148 and 158 are provided on one surfaces of the beam portions between the second parts 112, 122, 132, 142 and 152 and the third parts 114, 124, 134, 144 and 154 adjacent to bending points. Tip portions 119, 129, 139, 149 and 159 are formed at free ends of the fourth parts 116, 126, 136, 146 and 156.

At this time, as can be readily seen from FIG. 41(f), due to the fact that the beam portions 24 are decreased in their width from the post portions toward the tip portions 159, it is possible to effectively conform to the recent trend toward a fine pitch in a highly integrated semiconductor device.

That is to say, because the width of the beam portions is decreased from the first parts toward the fourth parts, a plurality of beam portions 24 formed with the tip portions 159 can be radially arrayed adjoining one with another to be brought into contact with a pad of a semiconductor device. In this way, it is possible to conform to the recent trend toward a fine pitch in a highly integrated semiconductor device.

As a consequence, the tip portion 26 of the electrical contact element can be brought into contact with a semiconductor chip pad by constant physical force while having a desired OD characteristic, to apply a constant electric signal to the semiconductor chip and thereby confirm whether the semiconductor chip is in a normal state or not.

At this time, the beam portion 24 is bent by the physical force, whereby the tip portion 26 is brought into contact with the semiconductor chip pad and the armrest 30 formed on the surface of the beam portion 24 is brought into contact with the electronic component 20.

Further, when the tip portion 26 and the semiconductor chip pad are brought into contact with each other, since the beam portion 24 has the configuration zigzagged one or more times and the armrest 30 is provided on one surface of the beam portion, a torsion phenomenon occurs. Due to this torsion phenomenon, pressing force applied to the semiconductor chip by the tip portion 26 can be doubled to ensure that the tip portion 26 is reliably brought into contact with the semiconductor chip pad through an oxide film.

Figure 39A:
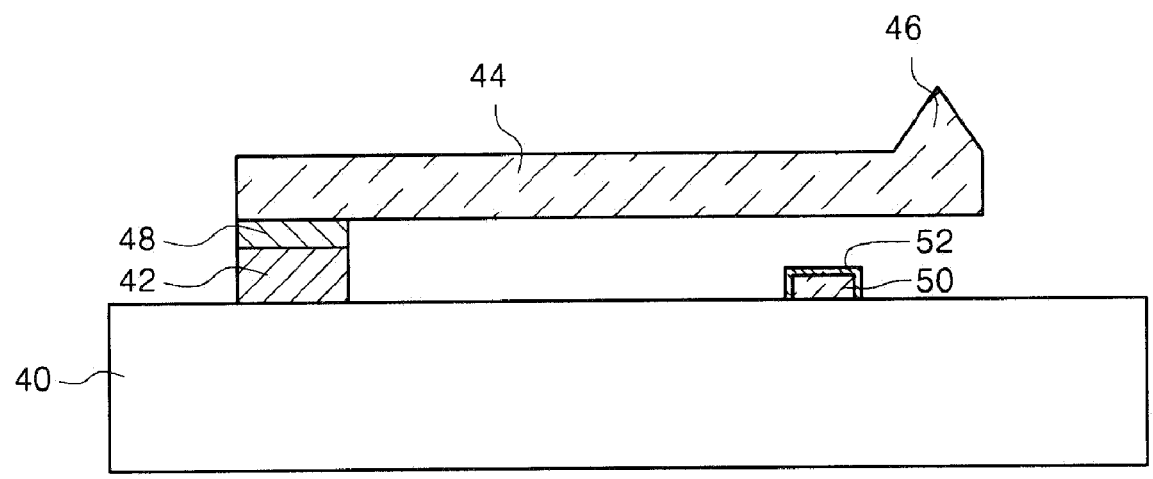
FIGS. 39a and 39b are a cross-sectional view and a perspective view illustrating an electrical contact element used to test an electronic device, in accordance with a fifth embodiment of the present invention.
Figure 39B:
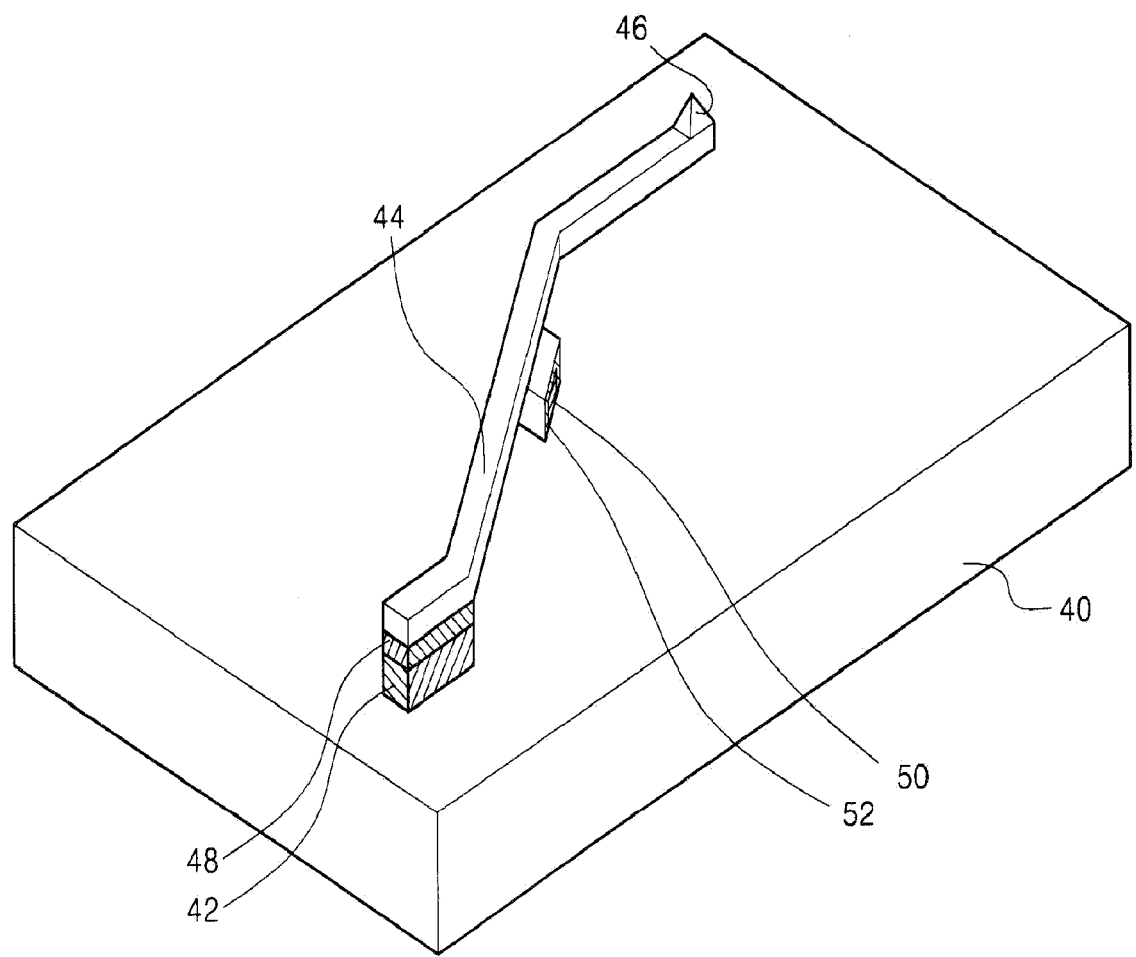

FIGS. 39a and 39b are a cross-sectional view and a perspective view illustrating an electrical contact element used to test an electronic device, in accordance with a fifth embodiment of the present invention.

As can be readily seen from FIGS. 39a and 39b, the electrical contact element according to this embodiment of the present invention is constructed in the same manner as the fourth embodiment, except that the armrest 50 is provided on the electronic component 40 at a position corresponding to a bent part of the beam portion 44 which is adjacent to the tip portion 46.

At this time, in order to prevent static electricity from being produced due to contact between the armrest 50 and the beam portion 44, an insulating coating layer 52 made of polyimide, parylene, and so forth, is further applied to an outer surface of the armrest 50.

As a consequence, the tip portion 46 of the electrical contact element can be brought into contact with a semiconductor chip pad by constant physical force while having a desired OD characteristic, to apply a constant electric signal to the semiconductor chip and thereby confirm whether the semiconductor chip is in a normal state or not.

At this time, the beam portion 44 is bent by the physical force, whereby the tip portion 46 is brought into contact with the semiconductor chip pad and the armrest 50 formed on the electronic component 40 is brought into contact with one surface of the beam portion 44.

Further, when the tip portion 46 and the semiconductor chip pad are brought into contact with each other, since the beam portion 44 has the configuration zigzagged one or more times and the armrest 50 is provided on the electronic component, a torsion phenomenon occurs. Due to this torsion phenomenon, pressing force applied to the semiconductor chip by the tip portion 46 can be doubled to ensure that the tip portion 46 is reliably brought into contact with the semiconductor chip pad through an oxide film.

Figure 40A:
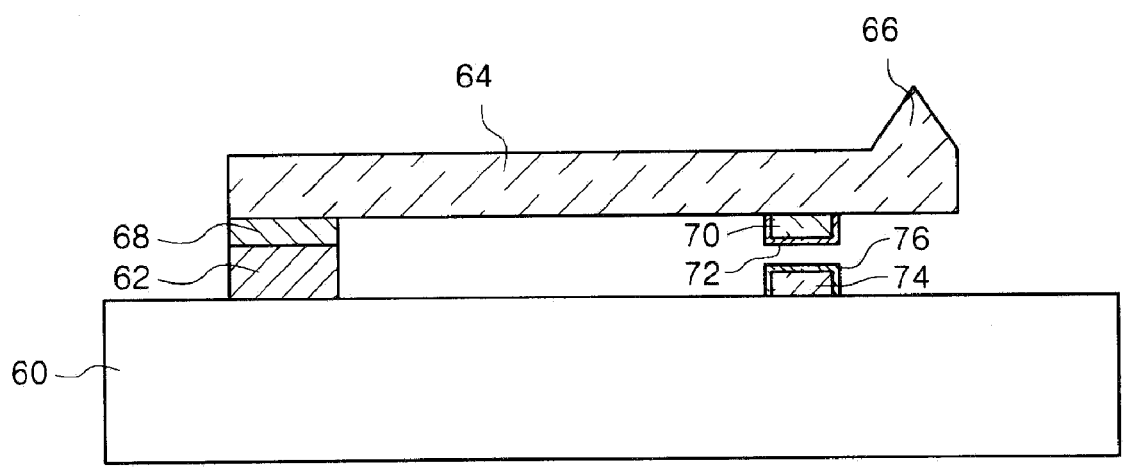
FIGS. 40a and 40b are a cross-sectional view and a perspective view illustrating an electrical contact element used to test an electronic device, in accordance with a sixth embodiment of the present invention.
Figure 40B:
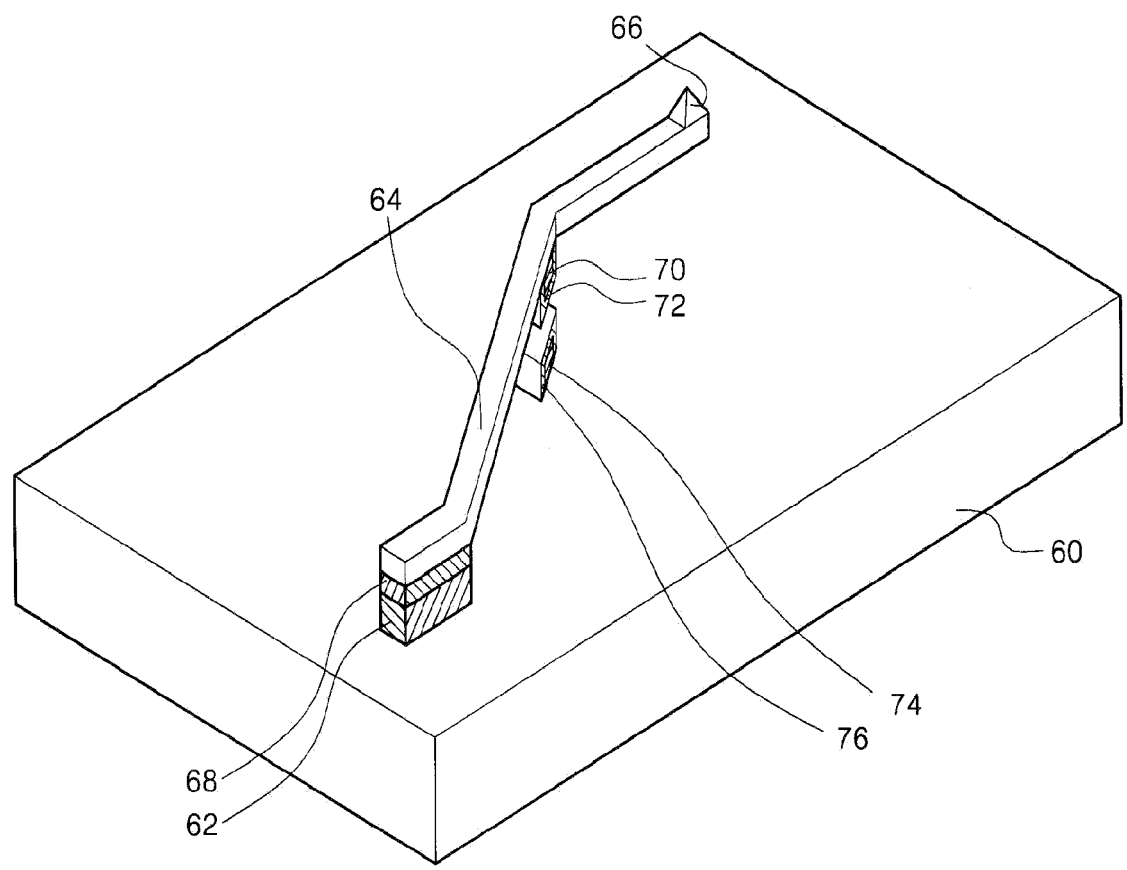

FIGS. 40a and 40b are a cross-sectional view and a perspective view illustrating an electrical contact element used to test an electronic device, in accordance with a sixth embodiment of the present invention.

As can be readily seen from FIGS. 40a and 40b, the electrical contact element used to test an electronic device, according to this embodiment of the present invention, is constructed in the same manner as the fourth embodiment, except that a pair of armrests 70 and 74 are respectively provided horizontally adjacent to the tip portion 66 and on a surface of the zigzagged part of the beam portion 64 which surface is vertically farthest from the tip portion 66 and on the electronic component 40 at a position corresponding to a bent part of the beam portion 64 which is horizontally adjacent to the tip portion 46.

At this time, the pair of armrests 70 and 74 respectively provided on the beam portion 64 and the electronic component 60 are spaced apart from each other in consideration of a degree to which the beam portion 64 is bent. In order to prevent static electricity from being produced due to contact between the armrests 70 and 74, insulating coating layers 72 and 76 made of polyimide, parylene, and so forth, are further applied to outer surfaces of the armrests 70 and 74.

As a consequence, the tip portion 66 of the electrical contact element can be brought into contact with a semiconductor chip pad by constant physical force while having a desired OD characteristic, to apply a constant electric signal to the semiconductor chip and thereby confirm whether the semiconductor chip is in a normal state or not.

At this time, the beam portion 64 is bent by the physical force, whereby the tip portion 66 is brought into contact with the semiconductor chip pad, and the pair of armrests 70 and 74 provided on the surface of the beam portion 64 and the electronic component 60 are brought into contact with each other.

Further, when the tip portion 66 and the semiconductor chip pad are brought into contact with each other, since the beam portion 64 has the configuration zigzagged one or more times and the pair of armrests 70 and 74 are respectively provided on the surface of the beam portion 64 and the electronic component 60, a torsion phenomenon occurs. Due to this torsion phenomenon, pressing force applied to the semiconductor chip by the tip portion 66 can be doubled to ensure that the tip portion 66 is reliably brought into contact with the semiconductor chip pad through an oxide film.

FIGS. 42a through 42i are cross-sectional views explaining a method for manufacturing the electrical contact element used to test an electronic device, shown in FIGS. 38a and 38b.

Figure 42A:
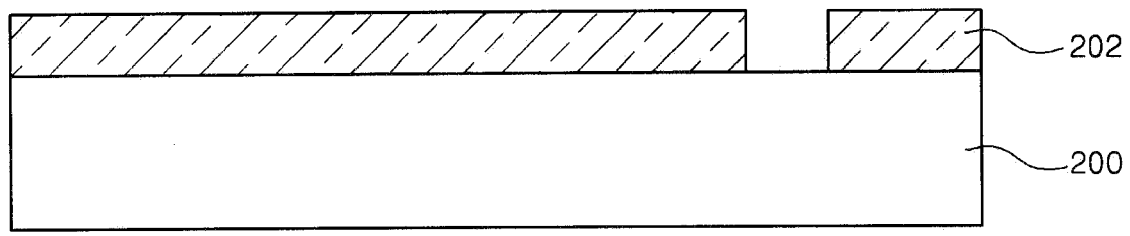
FIGS. 42a through 42i are cross-sectional views explaining a method for manufacturing the electrical contact element used to test an electronic device, shown in FIGS. 38a and 38b.

In the method according to this embodiment of the present invention, first, as shown in FIG. 42a, a first protective film of a predetermined thickness is formed on an entire surface of a sacrificial substrate 200 made of silicon. The first protective film may comprise a thin film such as a photoresist, and the like. Then, by patterning the first protective film, a first protective film pattern 202 is formed in a manner such that the first protective film pattern 202 delimits a first opened region in which a tip portion is to be formed.

At this time, the first protective film pattern 202 comprising the photoresist and the like is formed by coating, exposing and developing the photoresist and the like on the sacrificial substrate 200 while rotating the sacrificial substrate 200.

Figure 42B:
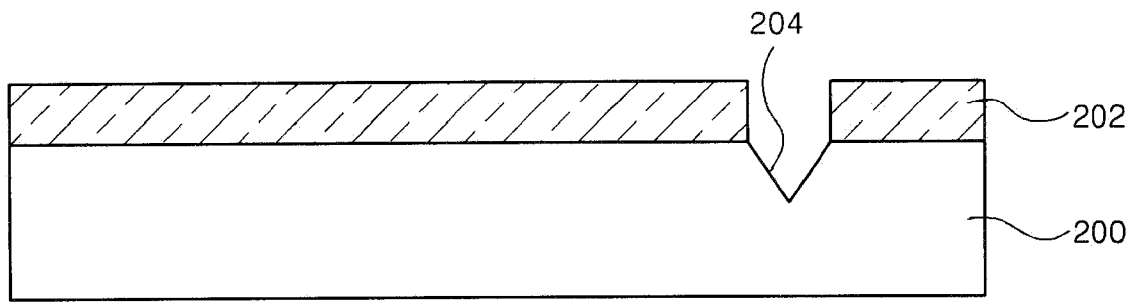

Next, as shown in FIG. 42b, by implementing an etching process using the first protective film pattern 202 as an etching mask, a trench 204 in which a tip portion is to be formed in subsequent processes is defined on the sacrificial substrate 200.

At this time, the etching process for defining the trench 204 may comprise a wet etching process employing a chemical or a dry etching process employing a reaction gas. After the trench 204 is defined, by implementing one or more times anisotropic etching in the trench, a depth of the trench 204 is increased, whereby the trench 204 has a truncated polygonal pyramid-shaped or a truncated cone-shaped configuration with a side surface sloped. Also, by rounding an inner surface of the trench 204 and implementing one or more times anisotropic etching in the trench, a rounded tip portion 218 is formed.

Figure 42C:
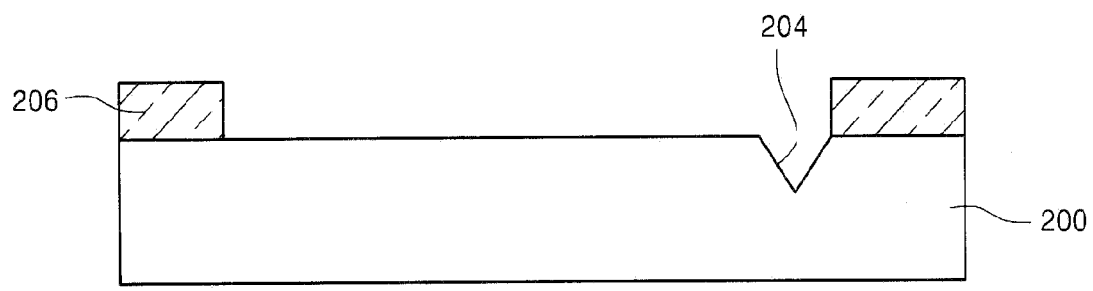

In succession, as shown in FIG. 42c, after removing the first protective film pattern 202 by ashing, etc., a second protective film pattern 206 is formed in such a way as to delimit a second opened region in which a beam portion zigzagged one or more times and having at least one bent part is to be formed and which is communicated with the trench 204.

At this time, in the same manner as the first protective film pattern 202, the second protective film pattern 206 may be formed by continuously implementing coating, exposing and developing a photoresist.

Figure 42D:
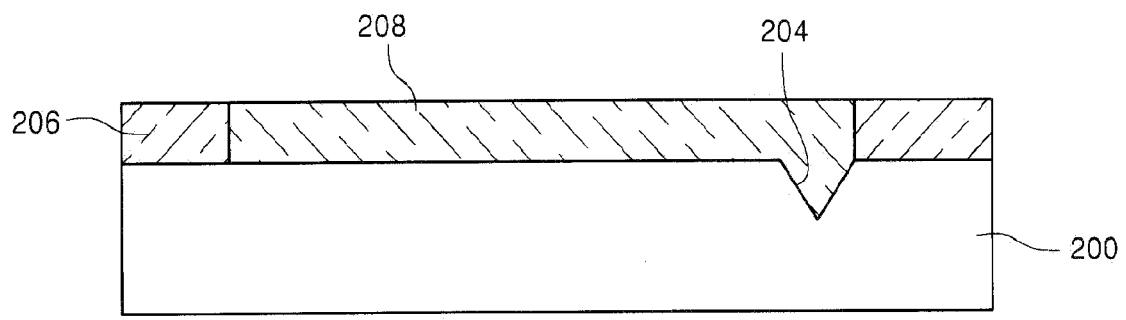

Next, as shown in FIG. 42d, after the second protective film pattern 206 is formed on the sacrificial substrate 200, a conductive material 208 of a predetermined thickness is formed in the second opened region of the second protective film pattern 206 by implementing a CVD, PVD or plating process, in a manner such that the beam portion and the tip portion are formed. Thereafter, an upper surface of a resultant product is flattened.

Figure 42E:
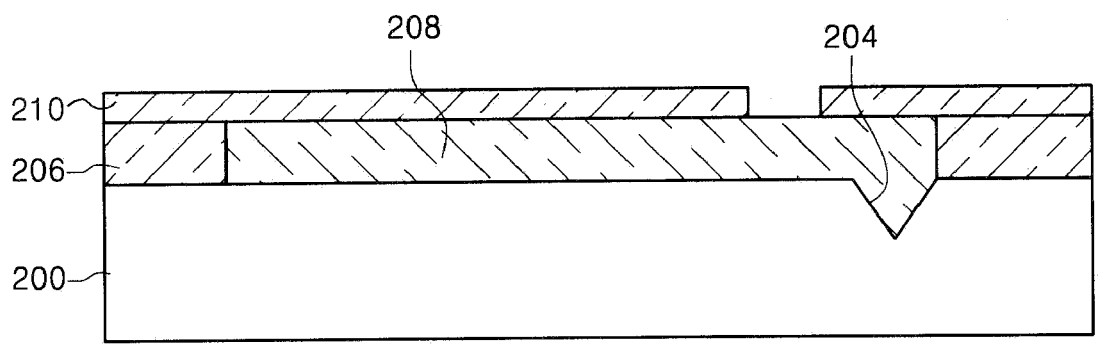

In succession, as shown in FIG. 42e, a third protective film pattern 210 is formed on an entire surface of the sacrificial substrate 200 having undergone the flattening process, in such a way as to delimit a third opened region in which an armrest is to be formed in subsequent processes, at a position horizontally adjacent to the trench 204 in which the tip portion is to be formed.

At this time, the third protective film pattern 210 is formed to ensure that the armrest is formed on a bent part of the beam portion to be formed in the subsequent processes and zigzagged one or more times, which bent portion is horizontally adjacent to the tip portion.

Figure 42F:
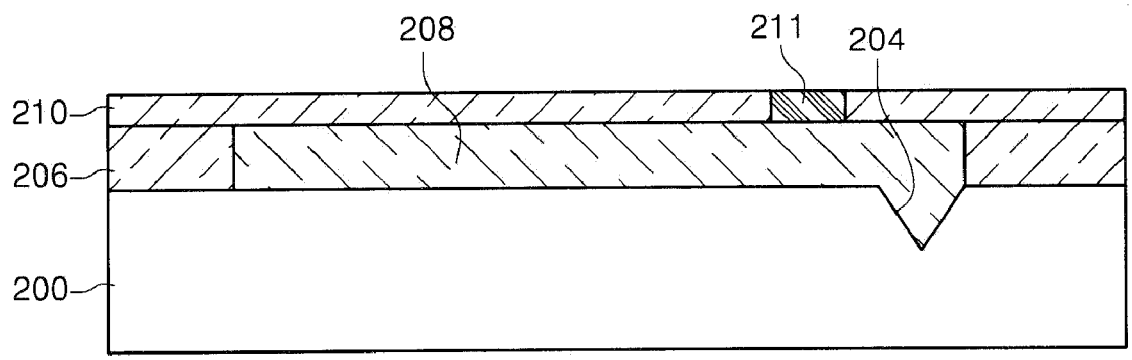

Then, as shown in FIG. 42f, after the third protective film pattern 210 is formed on the sacrificial substrate 200, a conductive material 211 of a predetermined thickness is formed in the third opened region of the third protective film pattern 210 by implementing a CVD, PVD or plating process. Thereafter, an upper surface of a resultant product is flattened.

At this time, an upper surface of the resultant product which is formed by the conductive material 211 can be flattened by CMP, etchback, grinding, etc.

Figure 42G:
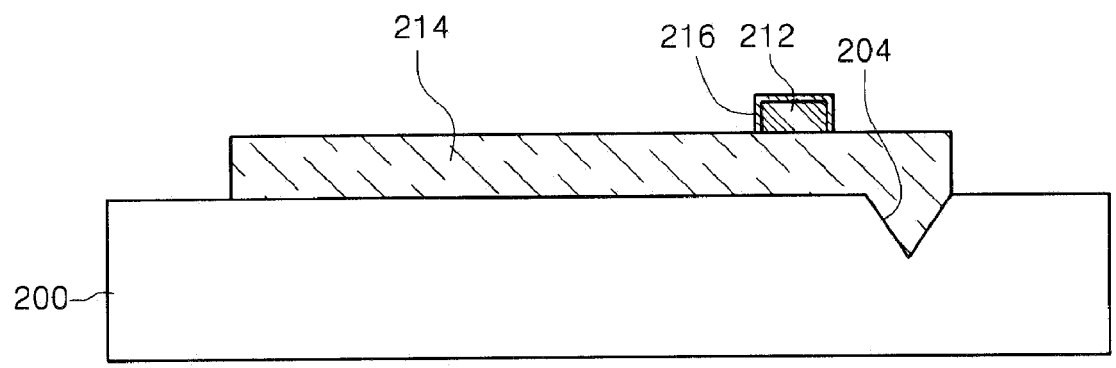

Thereupon, as shown in FIG. 42g, by removing the second and third protective film patterns 206 and 210, the beam portion 214 and armrest 212 are formed. A coating layer 216 made of an insulating material such as polyimide, parylene, and so forth, is applied to an outer surface of the armrest 212.

Figure 42H:
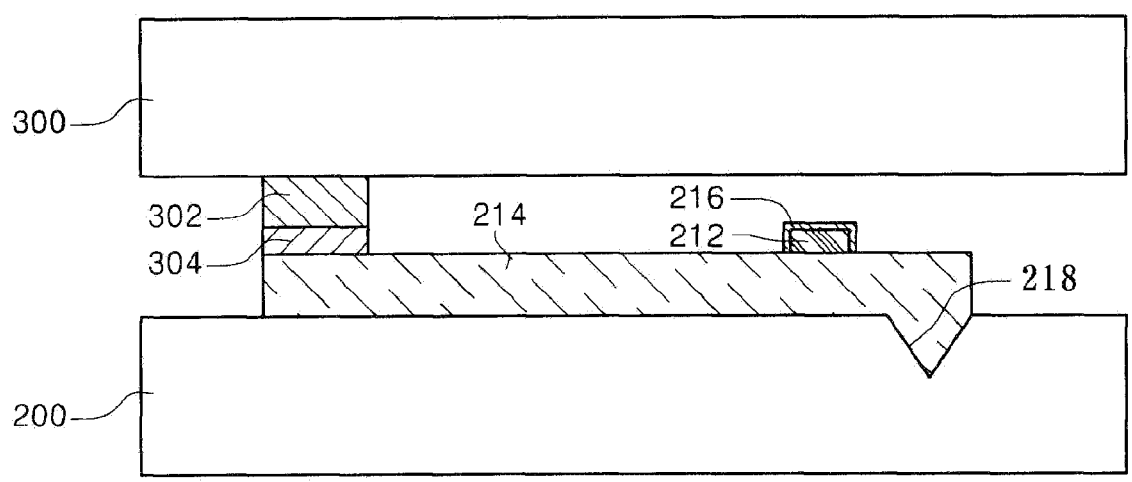

In succession, as shown in FIG. 42h, a post portion 302 comprising a bump of a predetermined size, etc. is formed on a terminal of an electronic component 300 such as a PCB having realized thereon a predetermined circuit pattern. An end of the beam portion 214 formed in the preceding processes on the sacrificial substrate 200, which end is farthest from the armrest 212, is connected with the post portion 302 by connection means 304 such as soldering, brazing, plating, a conductive adhesive, etc.

Figure 42I:
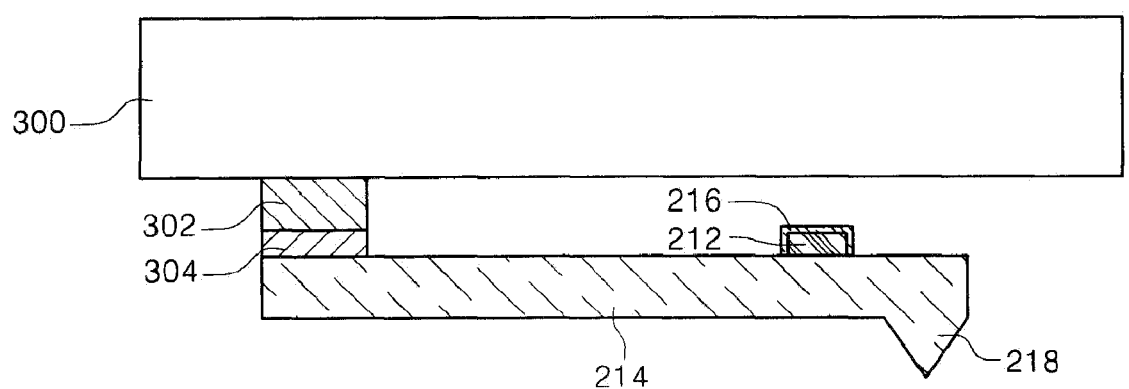

Finally, as shown in FIG. 42i, by removing the sacrificial substrate 200 through wet etching and thereby freeing the beam portion 214 and the tip portion 218 connected thereto, an electrical contact element having the armrest 212 provided on the beam portion 214 is completed.

FIGS. 43a through 43d are cross-sectional views explaining a method for manufacturing the electrical contact element used to test an electronic device, shown in FIGS. 39a and 39b.

Figure 43A:
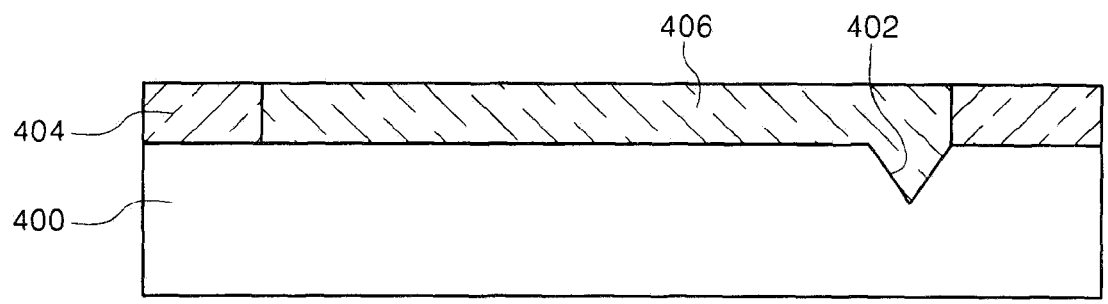
FIGS. 43a through 43d are cross-sectional views explaining a method for manufacturing the electrical contact element used to test an electronic device, shown in FIGS. 39a and 39b.

In the method according to the fifth embodiment of the present invention, as shown in FIG. 43a, as in the method for manufacturing the electrical contact element according to the fourth embodiment, a second protective film pattern 404 is formed in such a way as to delimit a second opened region in which a beam portion zigzagged one or more times and having at least one bent part is to be formed. The second protective film pattern 404 is communicated with a trench 402 which is defined on a sacrificial substrate 400 by implementing an etching process using a first protective film pattern (not shown) and in which a tip portion is to be formed.

After the trench 402 is defined, by implementing one or more times anisotropic etching in the trench 402, a depth of the trench 402 is increased, whereby the trench 402 has a truncated polygonal pyramid-shaped or a truncated cone-shaped configuration with a side surface sloped. Also, by rounding a bottom surface of the trench 402 and implementing one or more times anisotropic etching in the trench 402, the tip portion 218 having a rounded distal end can be formed.

Next, after the second protective film pattern 404 is formed on the sacrificial substrate 400, a conductive material 406 of a predetermined thickness is formed in the second opened region of the second protective film pattern 404 by implementing a CVD, PVD or plating process, in a manner such that the beam portion and the tip portion are formed. Thereafter, an upper surface of a resultant product is flattened.

Figure 43B:
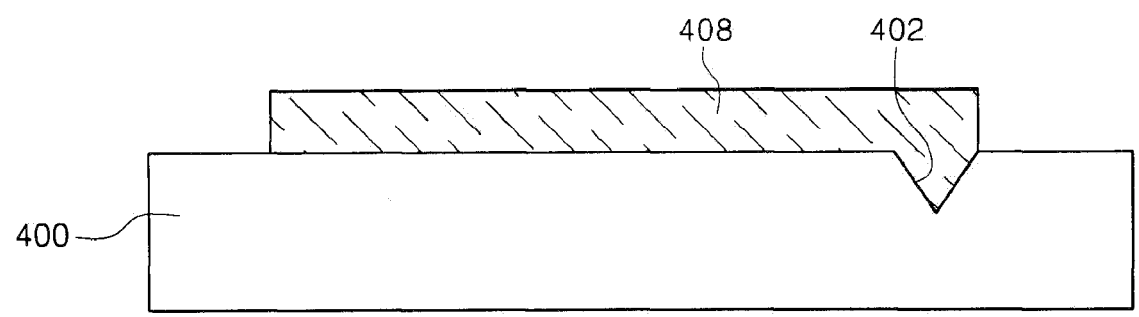

In succession, as shown in FIG. 43b, by removing the second protective film pattern 404, the beam portion 408 having a zigzagged configuration which is zigzagged one or more times is formed. At this time, the second protective film pattern 404 is removed by implementing wet etching, etc.

Figure 43C:
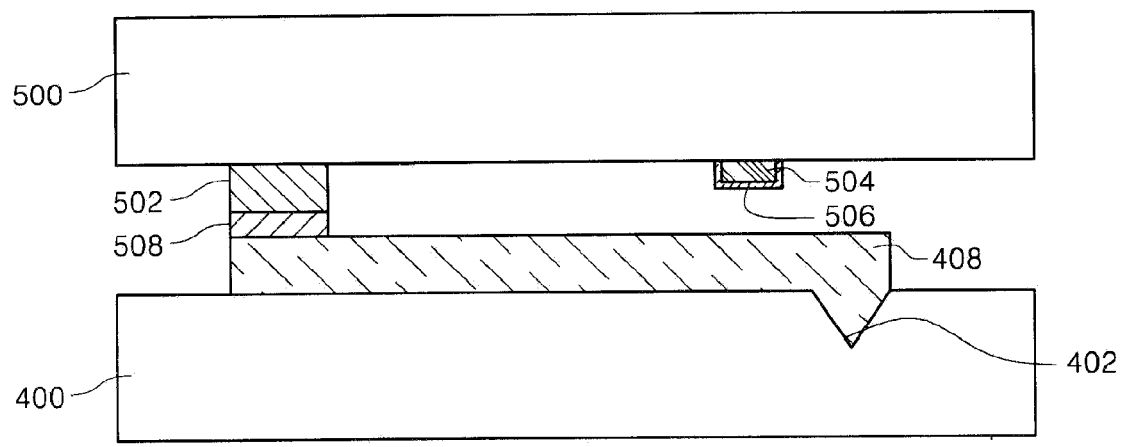

In succession, as shown in FIG. 43c, an armrest 504 of a predetermined size is formed on a terminal of an electronic component 500 such as a PCB having realized thereon a predetermined circuit pattern. A coating layer 506 made of an insulating material such as polyimide, parylene, and so forth, is applied to an outer surface of the armrest 504.

At this time, the armrest 504 is formed on the electronic component 500 at a position on a bent part of the beam portion 408 zigzagged one or more times which position horizontally adjoins the tip portion.

A post portion 502 comprising a bump of a predetermined size, etc. is formed on the terminal of the electronic component 500. An end of the beam portion 408 which is farthest from the trench 402 is connected with the post portion 502 by connection means 508 such as soldering, brazing, plating, a conductive adhesive, etc.

Figure 43D:
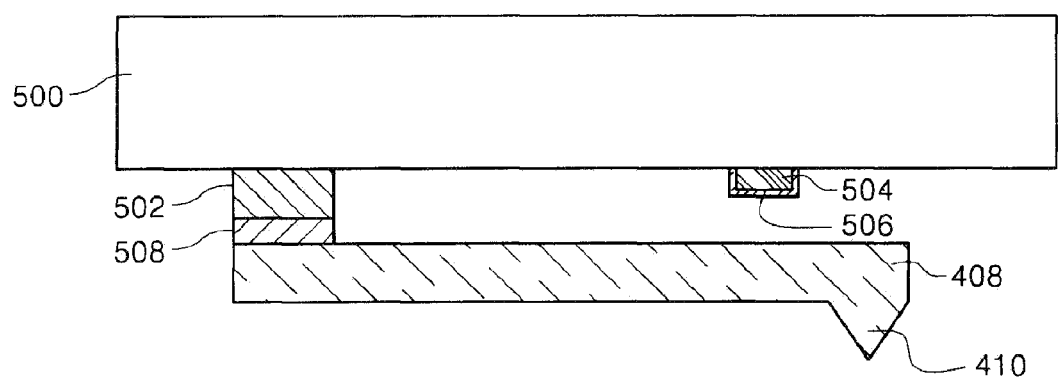

Finally, as shown in FIG. 43d, by removing the sacrificial substrate 400 through wet etching, etc. and thereby freeing the beam portion 408 and the tip portion 410 connected thereto, an electrical contact element having the armrest 504 provided on the electronic component 500 is completed.

FIGS. 44a through 44d are cross-sectional views explaining a method for manufacturing the electrical contact element used to test an electronic device, shown in FIGS. 40a and 40b.

Figure 44A:
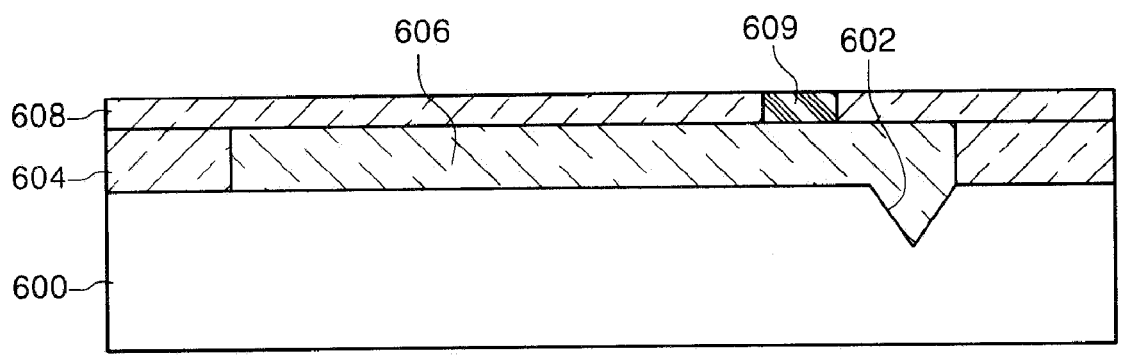
FIGS. 44a through 44d are cross-sectional views explaining a method for manufacturing the electrical contact element used to test an electronic device, shown in FIGS. 40a and 40b.

In the method according to the sixth embodiment of the present invention, as shown in FIG. 44a, as in the method for manufacturing the electrical contact element according to the fourth embodiment, a second protective film pattern 604 is formed in such a way as to delimit a second opened region in which a beam portion zigzagged one or more times and having at least one bent part is to be formed. The second protective film pattern 604 is communicated with a trench 602 which is defined on a sacrificial substrate 600 by implementing an etching process using a first protective film pattern (not shown) and in which a tip portion is to be formed.

After the trench 602 is defined, by implementing one or more times anisotropic etching in the trench 602, a depth of the trench 602 is increased, whereby the trench 602 has a truncated polygonal pyramid-shaped or a truncated cone-shaped configuration with a side surface sloped. Also, by rounding a bottom surface of the trench 602 and implementing one or more times anisotropic etching in the trench 602, the tip portion 616 having a rounded distal end can be formed.

Next, after the second protective film pattern 604 is formed on the sacrificial substrate 600, a conductive material 609 in the amount of a predetermined thickness is filled into the second opened region of the second protective film pattern 604 by implementing a CVD, PVD or plating process, in a manner such that the beam portion and the tip portion are formed. Thereafter, an upper surface of a resultant product is flattened.

Further, a third protective film pattern 608 is formed on a resultant product including the sacrificial substrate 600 having undergone the flattening process, in such a way as to delimit a third opened region in which an armrest is to be formed.

At this time, the third protective film pattern 608 is formed to ensure that the armrest is formed on a bent part of the beam portion to be formed in the subsequent processes and zig-zagged one or more times, which bent portion is horizontally adjacent to the tip portion.

Then, after the third protective film pattern 608 is formed on the sacrificial substrate 600, a conductive material 609 of a predetermined thickness is formed in the third opened region of the third protective film pattern 608 by implementing a CVD, PVD or plating process. Thereafter, an upper surface of a resultant product is flattened.

Figure 44B:
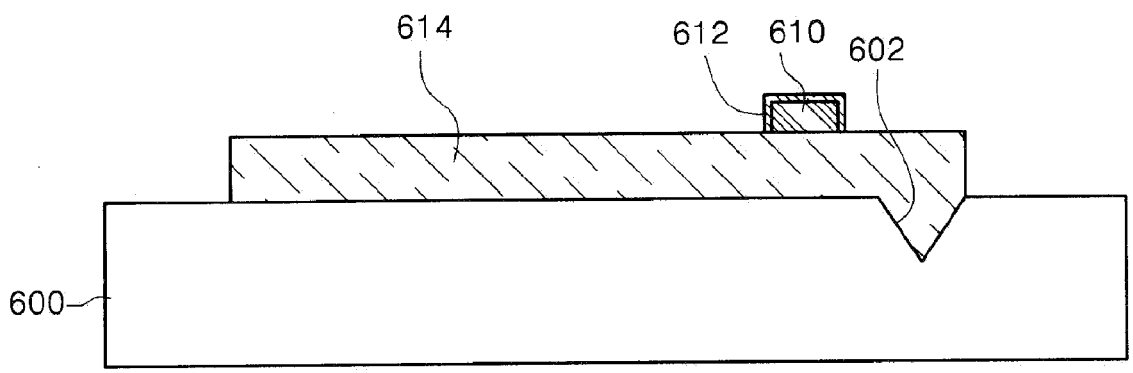

Next, as shown in FIG. 44b, by removing the second and third protective film patterns 604 and 608, the beam portion 614 and armrest 610 are formed. A coating layer 612 made of an insulating material such as polyimide, parylene, and so forth, is applied to an outer surface of the armrest 610.

Figure 44C:
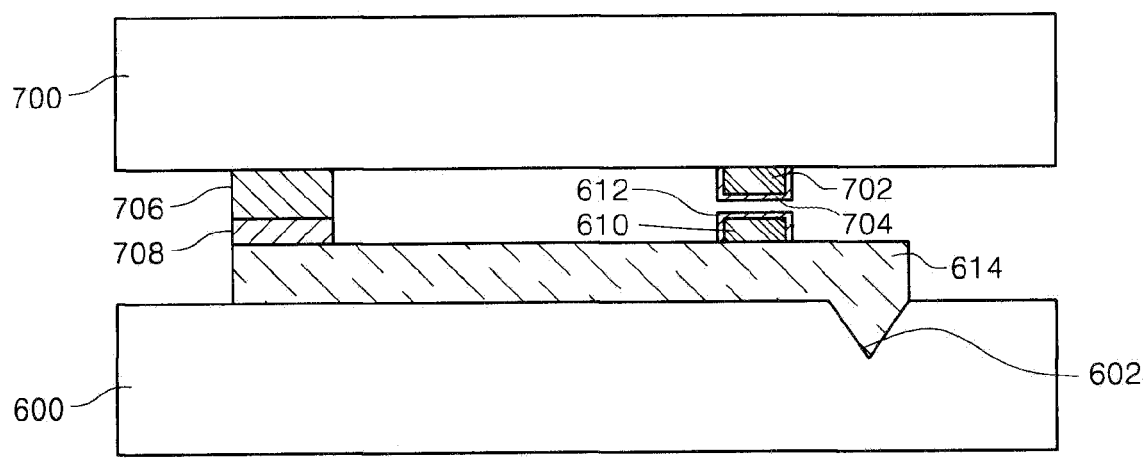

In succession, as shown in FIG. 44c, an armrest 702 of a predetermined size is formed on a terminal of an electronic component 700 such as a PCB having realized thereon a predetermined circuit pattern. A coating layer 704 made of an insulating material such as polyimide, parylene, and so forth, is applied to an outer surface of the armrest 702.

At this time, the armrest 702 is formed at a position corresponding to the armrest 610 formed on the beam portion 614.

A post portion 706 comprising a bump of a predetermined size, etc. is formed on the terminal of the electronic component 700. An end of the beam portion 614 which is farthest from the trench 602 is connected with the post portion 706 by connection means 708 such as soldering, brazing, plating, a conductive adhesive, etc.

At this time, the armrest 702 is connected in a manner such that it faces the armrest 610 formed on the beam portion 614 while being spaced apart therefrom.

Figure 44D:
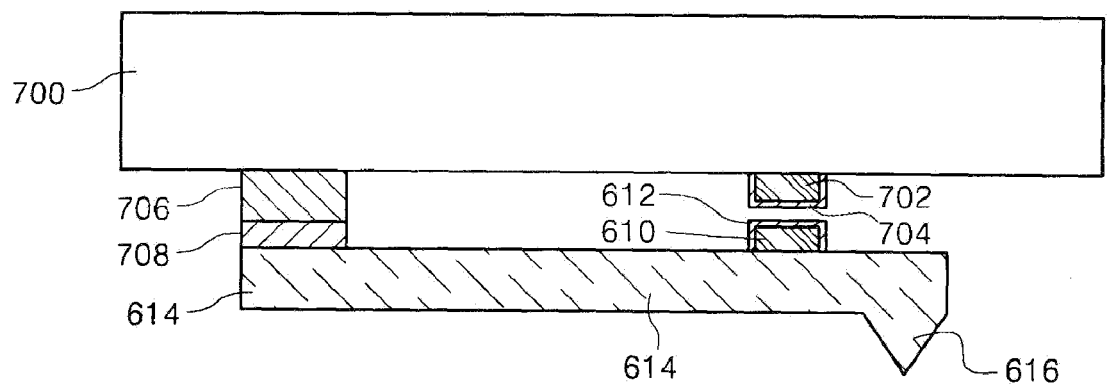

Finally, as shown in FIG. 44d, by removing the sacrificial substrate 600 through wet etching, etc. and thereby freeing the beam portion 614 and the tip portion 616 connected thereto, an electrical contact element having the armrests 610 and 702 respectively provided on the beam portion 614 and the electronic component 700 is completed.

Hereafter, simulations results for distribution of stress applied to a beam portion of the electrical contact element used to test an electronic device, according to the present invention and a beam portion of the conventional electrical contact element used to test an electronic device will be described with reference to FIGS. 45a and 45b.

Figure 45A:
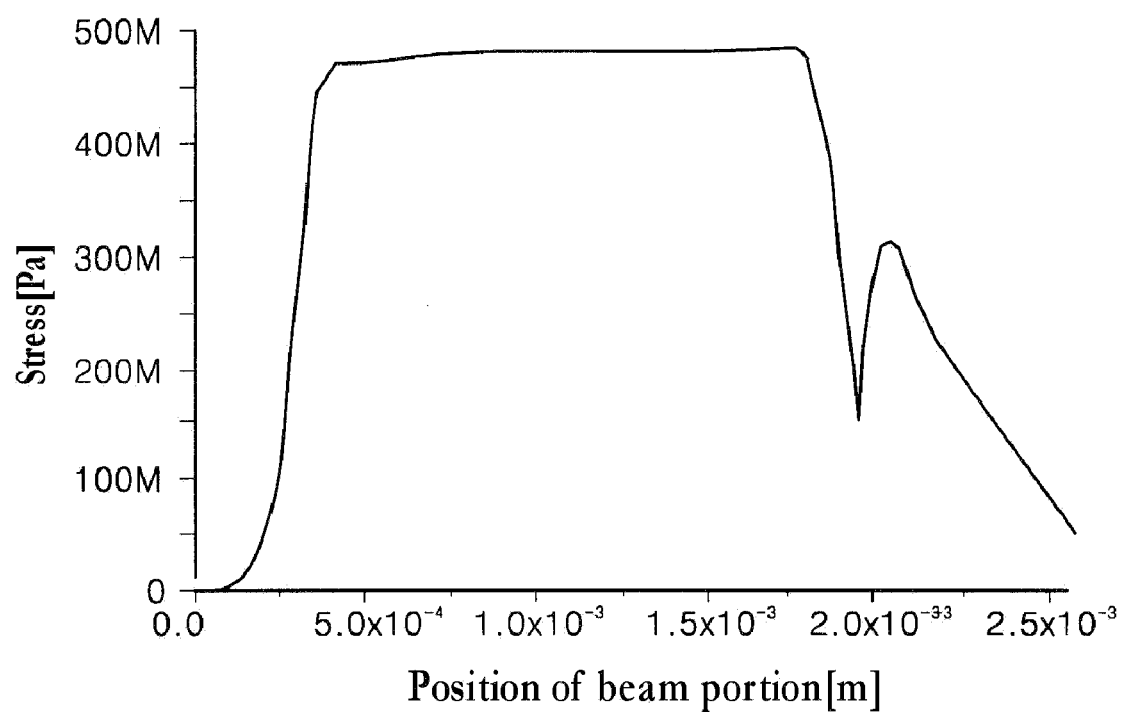
FIG. 45a is a graph depicting results obtained by simulating distribution of stress applied to a beam portion of the electrical contact element used to test an electronic device, according to the present invention.
Figure 45B:
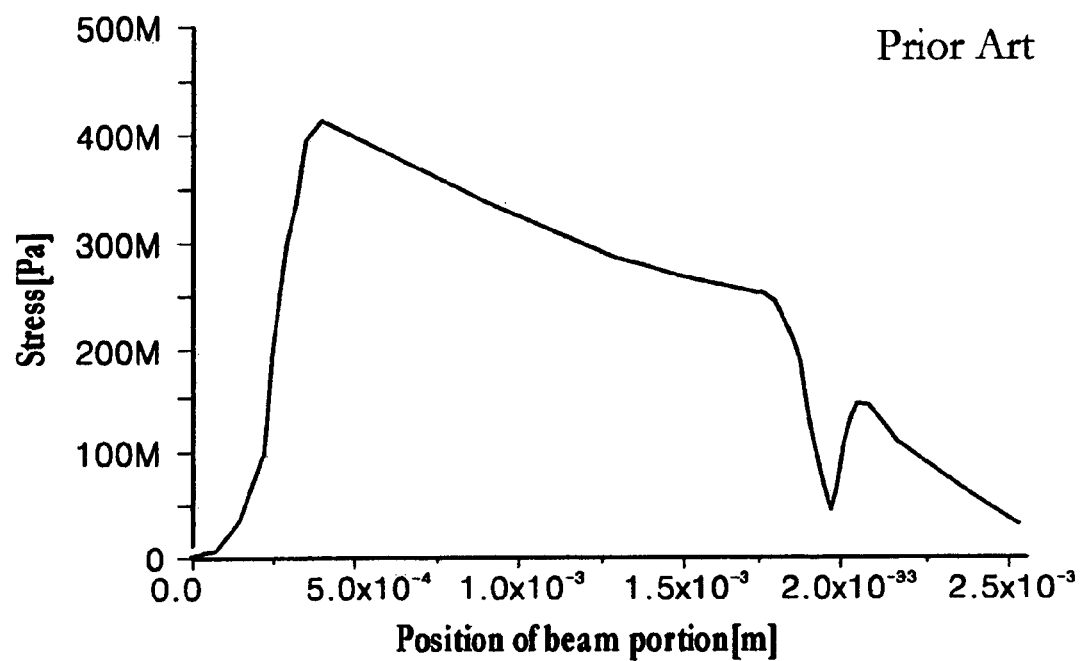
FIG. 45b is a graph depicting results obtained by simulating distribution of stress applied to a beam portion of the conventional electrical contact element used to test an electronic device.

In the case of the beam portion according to the present invention, as shown in FIG. 45a, constant stress of about 500 M (Pa) is applied to the beam portion through a section which is separated from the connection means such as the bump by $5.0 \times 10^{-4}$ to $2.0 \times 10^{-33}$ m. On the contrary, in the case of the conventional beam portion, as shown in FIG. 45b, varying stress of about 400 to 500 M (Pa) is applied to the beam portion through the same section.

INDUSTRIAL APPLICABILITY

As apparent from the above description, the method for manufacturing an electrical contact element used to test an electronic device, and the electrical contact element manufactured thereby, according to the present invention, provides advantages as described below.

In the present invention, since stress is dispersedly applied to a beam portion of the electrical contact element, it is possible to prevent the beam portion from being broken while the beam portion is repeatedly brought into contact with a semiconductor chip.

In the present invention, due to the fact that a distal end of a tip portion has a truncated polygonal pyramid-shaped or a truncated cone-shaped configuration with a rounded distal end surface or has a column-shaped configuration with a rounded distal end surface, when the tip portion of the electrical contact element is repeatedly brought into contact with a pad of the semiconductor chip by constant physical force, the tip portion does not pierce an oxide film formed on the pad and damage the pad, and a defective proportion is not increased when implementing subsequent semiconductor manufacturing processes such as a wire bonding process, and the like. Also, the likelihood of the distal end of the electrical contact element to become worn and produce particles by itself is avoided.

Further, due to the fact that the distal end surface of the tip portion of the electrical contact element which is to be brought into contact with the pad of the semiconductor chip, and the like, is rounded, a contact area of the tip portion is increased and electric conductivity is thereby improved.

Moreover, since a length of the tip portion of the electrical contact element is extended to 30 μm~500 μm, adjustment of an OD characteristic can be easily conducted. Since a projection is formed around a proximal end of the tip portion where the tip portion and beam portion of the electrical contact element are connected with each other, while the tip portion of the electrical contact element is repeatedly brought into contact with the pad of the semiconductor chip by constant physical force, stress is not applied to the proximal end of the tip portion, and it is possible to prevent the tip portion from being broken.

Furthermore, because the beam portion of the electrical contact element has a multitude of stepped portions, it is possible to properly conform to the recent trend toward a fine pitch required in an electronic device such as a highly integrated semiconductor chip. Also, because the beam portion of the electrical contact element has a zigzagged configuration, while the tip portion of the electrical contact element is repeatedly brought into contact with the pad of the semiconductor chip by constant physical force, it is possible to disperse stress applied to the beam portion and prevent the beam portion from being broken.

In addition, by the fact that the electrical contact element according to the present invention can be mass-produced using a micro electro mechanical system (MEMS) with remarkable reproducibility, it is possible to improve yield, productivity and operational reliability of an electronic device testing kit such as a probe card which may comprise an electrical contact element.

Also, due to a torsion effect rendered by an armrest, it is possible to test the semiconductor chip, with the constant physical force significantly increased to the extent that the tip portion may pierce the oxide film formed on the pad of the semiconductor chip.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An electrical contact element for testing an electronic device, comprising:
    a beam portion being spaced apart by a predetermined distance void gap from an electronic component and being positioned parallel to an upper surface of the electronic device; and
    a tip portion extending substantially perpendicularly from the beam portion, the tip portion comprising:
    a base part connected to the beam portion;
    a middle part extending from the base part; and
    a contact part extending from the middle part,
    wherein the middle part has a substantially constant cross-sectional area along its vertical length,
    wherein a cross-sectional area of the base part is greater than the cross-sectional area of the middle part,
    wherein a cross-sectional area of the contact part is smaller than the cross-sectional area of the middle part, and
    wherein a height from a bottom of the base part to a top of the contact part is greater than a width of the middle part.

2. The electrical contact element of claim 1, wherein the middle part comprises a column shape.

3. The electrical contact element of claim 1, wherein the base part comprises a surface generally inclined at an angle relative to a longitudinal axis of the tip portion.

4. The electrical contact element of claim 1, wherein the tip portion further comprises a second base part interposed between the base part and the middle part and having a cross-sectional area sized between the cross-sectional area of the base part and the cross-sectional area of the middle part.

5. The electrical contact element of claim 1, wherein the contact part comprises a contacting surface configured to contact a portion of the electronic device and having a substantially convex shape.

6. The electrical contact element of claim 5, wherein the contact part comprises a truncated polygonal shape with the truncated portion defining the contacting surface.

7. The electrical contact element of claim 5, wherein the contact part comprises a truncated cone shape with the truncated portion defining the contacting surface.

8. The electrical contact element of claim 1, wherein the beam portion has a generally tapering shape.

9. The electrical contact element of claim 1, wherein the beam portion comprises:
    a first part connected to the tip portion;
    a second part extending from the first part;
    a third part for connecting to an the electronic component, the third part extending from the second part, and
    wherein a width of the third part is greater than a width of the first part.

10. The electrical contact element of claim 1, further comprising an armrest portion attached to the beam portion.

11. The electrical contact element of claim 10, wherein the beam portion comprises a distal end and a proximal end opposite the distal end, the tip portion extending from the beam portion proximate the distal end, wherein the armrest portion is attached to the beam portion at a location closer to the distal end than the proximal end.

12. The electrical contact element of claim 10, further comprising an electrical insulating material formed on a surface of the armrest portion.

13. The electrical contact element of claim 10, further comprising a second armrest portion associated with an electronic component and facing the armrest portion attached to the beam portion.

14. The electrical contact element of claim 1, wherein the beam portion and the tip portion are integrally formed with the same material.

15. The electrical contact element of claim 1, wherein the middle part is substantially symmetrical with respect to a longitudinal center line.

16. The electrical contact element of claim 1, wherein the middle part is substantially symmetrical with respect to a center plane.

17. The electrical contact element of claim 1, wherein the base part, the middle part, and the contact part are incorporated into a single body.

18. The electrical contact element of claim 1, wherein each of the base part and the contact part has a varying cross-section.

19. A method of manufacturing an electrical contact element for testing an electronic device, the method comprising:
    depositing a first protective film on a sacrificial substrate;
    partially removing the protective film;
    performing wet-etching and dry-etching in turn to form an opening in the sacrificial substrate such that an inlet portion of the opening is disposed under the first protective film by over-etching and the opening has an inlet portion, a middle portion, and a round top portion that have different cross-sections;
    removing the first protective film;
    depositing a second protective film;
    patterning the second protective film to expose the opening and a portion of a top surface of the sacrificial substrate;
    depositing a conductive layer on the opening and the exposed portion of the top surface of the sacrificial substrate to form a tip portion of the electronic contact element in the opening and a beam portion of the electronic contact element, the beam portion coupled to the tip portion and extending on the top surface of the sacrificial substrate;
    removing the second protective film; and
    removing the sacrificial substrate.

20. The method of claim 19, further comprising:
    combining the beam portion to an electronic component before removing the sacrificial substrate.

21. The method of claim 19, wherein a depth of the opening is greater than a diameter of the middle portion of the opening.

22. The method of claim 21, wherein each of the inlet portion and the top portion of the opening has a varying cross-section.

* * * * *